(12) United States Patent
Komai et al.

(10) Patent No.: US 10,986,281 B2
(45) Date of Patent: Apr. 20, 2021

(54) PINHOLE CAMERA, ELECTRONIC APPARATUS AND MANUFACTURING METHOD

(71) Applicant: SONY CORPORATION, Tokyo (JP)

(72) Inventors: Naoki Komai, Kanagawa (JP); Takashi Sakairi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 148 days.

(21) Appl. No.: 15/745,028

(22) PCT Filed: Jul. 15, 2016

(86) PCT No.: PCT/JP2016/070933
§ 371 (c)(1),
(2) Date: Jan. 15, 2018

(87) PCT Pub. No.: WO2017/022450
PCT Pub. Date: Feb. 9, 2017

(65) Prior Publication Data
US 2018/0205866 A1 Jul. 19, 2018

(30) Foreign Application Priority Data

Jul. 31, 2015 (JP) .............................. JP2015-152905
Dec. 11, 2015 (JP) ................................. 2015-242370

(51) Int. Cl.
*H04N 5/235* (2006.01)
*G03B 19/16* (2021.01)
(Continued)

(52) U.S. Cl.
CPC ........... *H04N 5/2354* (2013.01); *G03B 19/16* (2013.01); *H01L 27/14* (2013.01);
(Continued)

(58) Field of Classification Search
CPC .... H04N 5/2354; H04N 5/238; H04N 5/2256; H04N 5/2254; H04N 5/369; H01L 27/14;
(Continued)

(56) References Cited

U.S. PATENT DOCUMENTS 6,795,120 B2 * 9/2004 Takagi ................... H01L 25/16
257/E25.029
7,084,000 B2 * 8/2006 Iwawaki ........... H01L 27/14687
257/E21.297
(Continued)

FOREIGN PATENT DOCUMENTS

EP 0807976 A2 11/1997
EP 2460345 A2 6/2012
(Continued)

OTHER PUBLICATIONS

International Search Report and Written Opinion of PCT Application No. PCT/JP2016/070933, dated Aug. 30, 2016, 11 pages of ISRWO.

*Primary Examiner* — Seung C Sohn
(74) *Attorney, Agent, or Firm* — Chip Law Group

(57) ABSTRACT

The present disclosure relates to a pinhole camera, an electronic apparatus and a manufacturing method, an electronic apparatus and a manufacturing method by which further reduction in profile can be achieved. The pinhole camera includes a semiconductor substrate on which a pixel array unit on which a plurality of pixels are arranged in an array is formed, a protective substrate stacked on an on-chip lens arranged corresponding to a pixel array unit of the semiconductor substrate through a seal resin, and a light shielding film formed on the protective substrate and configured to block light to be irradiated upon the semiconductor substrate. A pinhole is formed in the light shielding film.

(Continued)

The present technology can be applied, for example, to a CMOS image sensor of the stacked type.

32 Claims, 50 Drawing Sheets

(51) Int. Cl.

| | | |
|---|---|---|
| *H01L 27/14* | (2006.01) | |
| *H04N 5/369* | (2011.01) | |
| *H01L 27/146* | (2006.01) | |
| *H04N 5/225* | (2006.01) | |
| *H04N 5/238* | (2006.01) | |

(52) U.S. Cl.
CPC .... *H01L 27/1463* (2013.01); *H01L 27/14618* (2013.01); *H01L 27/14623* (2013.01); *H01L 27/14625* (2013.01); *H01L 27/14636* (2013.01); *H01L 27/14645* (2013.01); *H01L 27/14685* (2013.01); *H04N 5/2254* (2013.01); *H04N 5/2256* (2013.01); *H04N 5/238* (2013.01); *H04N 5/369* (2013.01); *H01L 27/14627* (2013.01); *H01L 27/14629* (2013.01)

(58) Field of Classification Search
CPC ......... H01L 27/14685; H01L 27/14645; H01L 27/14636; H01L 27/1463; H01L 27/14625; H01L 27/14623; H01L 27/14618; H01L 27/14629; H01L 27/14627; G03B 19/16
USPC ...................................................... 250/208.1
See application file for complete search history.

(56) References Cited

U.S. PATENT DOCUMENTS

| | | | |
|---|---|---|---|
| 7,419,841 B2 * | 9/2008 | Farnworth | H01L 23/481 257/E23.011 |
| 7,956,443 B2 * | 6/2011 | Akram | H01L 21/76898 257/621 |
| 10,288,489 B2 * | 5/2019 | Otaki | H01L 21/0274 |
| 2002/0044215 A1 | 4/2002 | Takagi et al. | |
| 2010/0201855 A1 | 8/2010 | Wada et al. | |
| 2010/0264503 A1 | 10/2010 | Inoue et al. | |
| 2011/0026141 A1 | 2/2011 | Barrows | |
| 2012/0008934 A1 * | 1/2012 | Kawasaki | H04N 5/2254 396/529 |
| 2017/0301713 A1 * | 10/2017 | Sekine | H04N 5/369 |

FOREIGN PATENT DOCUMENTS

| | | |
|---|---|---|
| JP | 10-065132 A | 3/1998 |
| JP | 10-65132 A | 3/1998 |
| JP | 2008-124538 | 5/2008 |
| JP | 2008-124538 A | 5/2008 |
| JP | 2010-183001 A | 8/2010 |
| JP | 2010-251558 A | 11/2010 |
| JP | 2011-026141 A | 2/2011 |
| JP | 2011-238781 A | 11/2011 |
| JP | 2012-256040 A | 12/2012 |
| JP | 2016-025164 A | 2/2016 |
| WO | 2011/014472 A2 | 2/2011 |
| WO | 2011/141974 A1 | 11/2011 |
| WO | 2016/009972 A1 | 1/2016 |

\* cited by examiner

FIG. 20
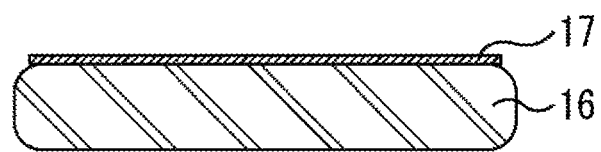
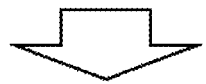
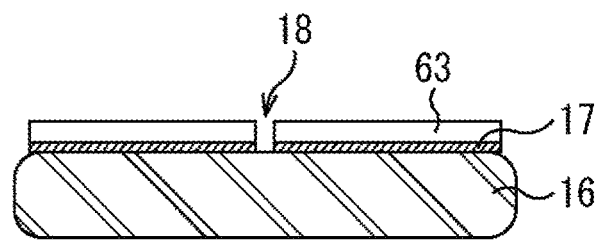
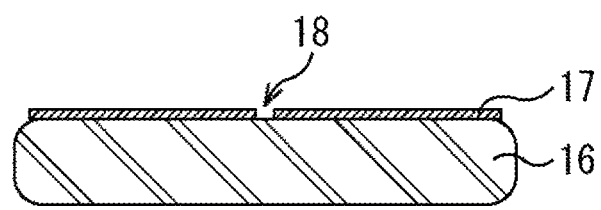

FIG. 21
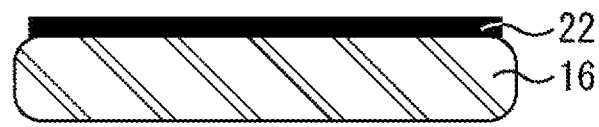
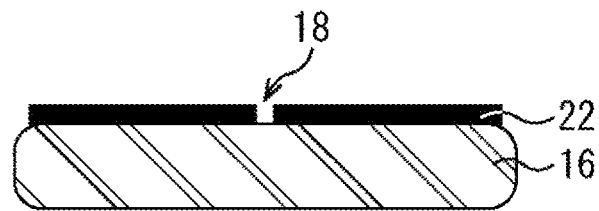

FIG. 22
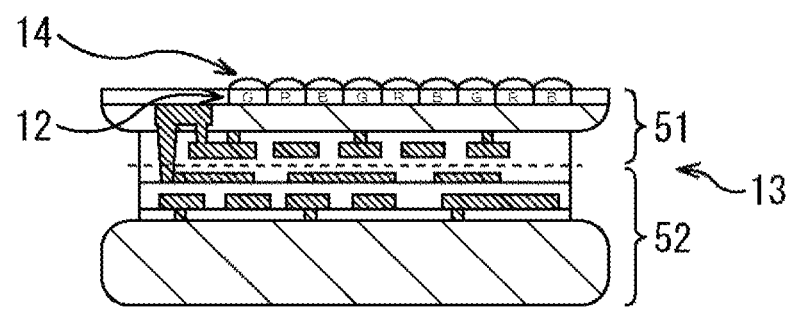
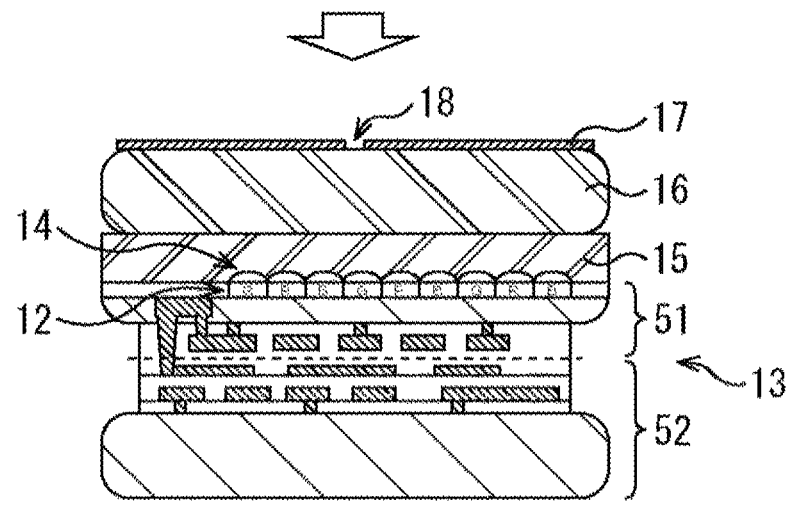
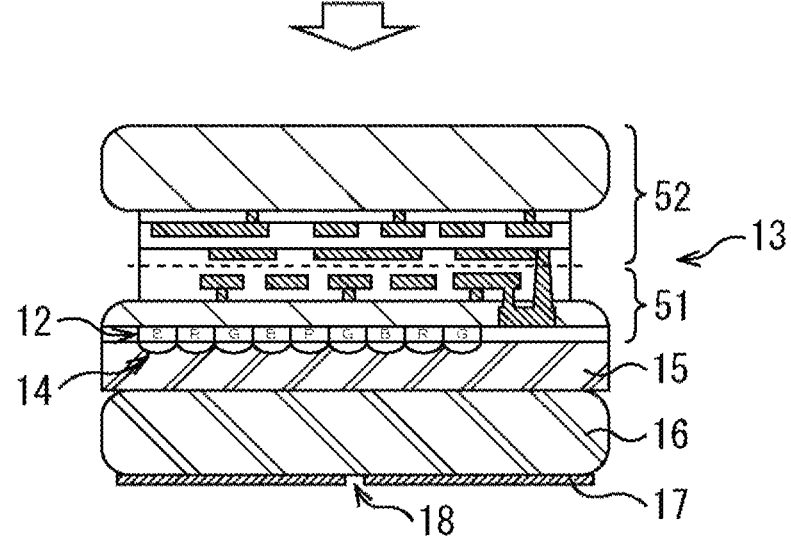

FIG. 25
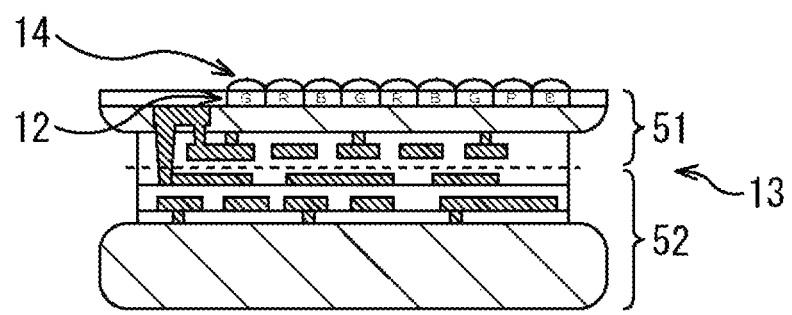
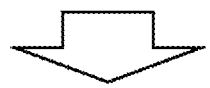
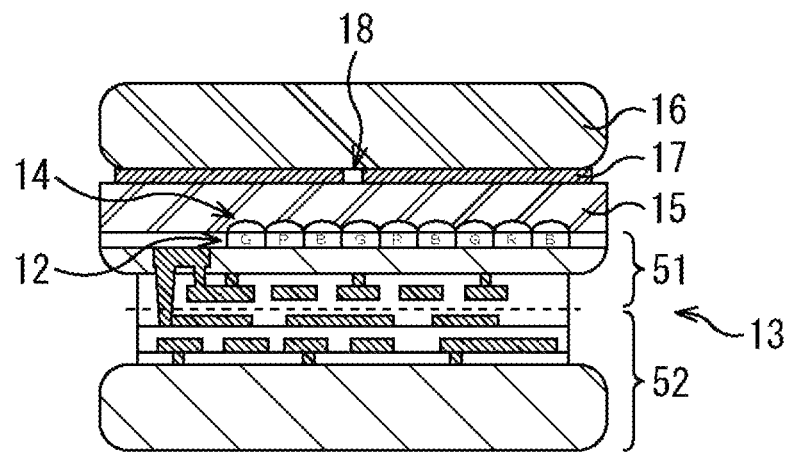

PINHOLE CAMERA, ELECTRONIC APPARATUS AND MANUFACTURING METHOD

CROSS REFERENCE TO RELATED APPLICATIONS

This application is a U.S. National Phase of International Patent Application No. PCT/JP2016/070933 filed on Jul. 15, 2016, which claims priority benefit of Japanese Patent Application No. JP 2015-152905 filed in the Japan Patent Office on Jul. 31, 2015 and also claims priority benefit of Japanese Patent Application No. JP 2015-242370 filed in the Japan Patent Office on Dec. 11, 2015. Each of the above-referenced applications is hereby incorporated herein by reference in its entirety.

TECHNICAL FIELD

The present disclosure relates to a pinhole camera, an electronic apparatus and a manufacturing method, and particularly to a pinhole camera, an electronic apparatus and a manufacturing method by which further reduction in profile can be achieved.

BACKGROUND ART

In the past, as a camera module for which a solid-state image pickup apparatus is used, a structure is available in which a lens module is placed on a semiconductor package of a solid-state image pickup element, for example, as disclosed in PTL 1. Further, as a pinhole camera, such a structure as disclosed in PTL 2 is available.

CITATION LIST

Patent Literature

[PTL 1]
 JP 2012-256040A
[PTL 2]
 JP 2008-124538A

SUMMARY

Technical Problem

Incidentally, in such a pinhole camera as described above, a housing for mounting an image sensor chip and a chip therein and a pedestal for receiving the housing placed thereon are required, and in the case of a camera module that has a lens, a module structure in which a lens is placed on a housing or a pedestal is applied. Therefore, it is difficult for an existing pinhole camera to achieve reduction in profile.

On the other hand, in a pinhole camera that does not have a lens, although reduction in profile of the camera is possible, in the case of a package having a housing, there is a limit also in reduction in profile and it is difficult to reduce the size to a chip size or the like. Further, since the depth of the pinhole is equal to the depth of the housing, from a relationship of an aspect ratio of the pinhole, the hole diameter cannot be reduced and the resolution and the angle of view are limited.

The present disclosure has been made in view of such a situation as described above, and it is an object of the present disclosure to implement further reduction in profile.

Solution to Problem

A pinhole camera of one aspect of the present disclosure includes a semiconductor substrate on which a pixel array unit on which a plurality of pixels are arranged in an array is formed, a protective substrate stacked on the semiconductor substrate through a seal resin, and a light shielding film formed on the protective substrate and configured to block light to be irradiated upon the semiconductor substrate, in which a pinhole is formed in the light shielding film.

An electronic apparatus of the one aspect of the present disclosure includes a pinhole camera that includes a semiconductor substrate on which a pixel array unit on which a plurality of pixels are arranged in an array is formed, a protective substrate stacked on the semiconductor substrate through a seal resin, and a light shielding film formed on the protective substrate and configured to block light to be irradiated upon the semiconductor substrate, in which a pinhole is formed in the light shielding film.

A manufacturing method of the one aspect of the present disclosure includes the steps of stacking a protective substrate on a semiconductor substrate, on which a pixel array unit on which a plurality of pixels are arranged in an array is formed, through a seal resin, forming a light shielding film, which blocks light to be irradiated upon the semiconductor substrate, on the protective substrate, and forming a pinhole in the light shielding film.

In the one aspect of the present disclosure, a semiconductor substrate on which a pixel array unit on which a plurality of pixels are arranged in an array is formed, a protective substrate stacked on the semiconductor substrate through a seal resin, and a light shielding film formed on the protective substrate and configured to block light to be irradiated upon the semiconductor substrate, are provided, and a pinhole is formed in the light shielding film.

Advantageous Effect of Invention

With an aspect of the present disclosure, further reduction in profile can be implemented.

BRIEF DESCRIPTION OF DRAWINGS

FIG. 20 is a view illustrating the first manufacturing method for the solid-state image pickup element.

FIG. 21 is a view illustrating the first manufacturing method for the solid-state image pickup element.

FIG. 22 is a view illustrating a second manufacturing method for the solid-state image pickup element.

FIG. 25 is a view illustrating a different manufacturing method for the solid-state image pickup element.

DESCRIPTION OF EMBODIMENTS

In the following, particular embodiments to which the present technology is applied are described in detail with reference to the drawings.

Figure 1:
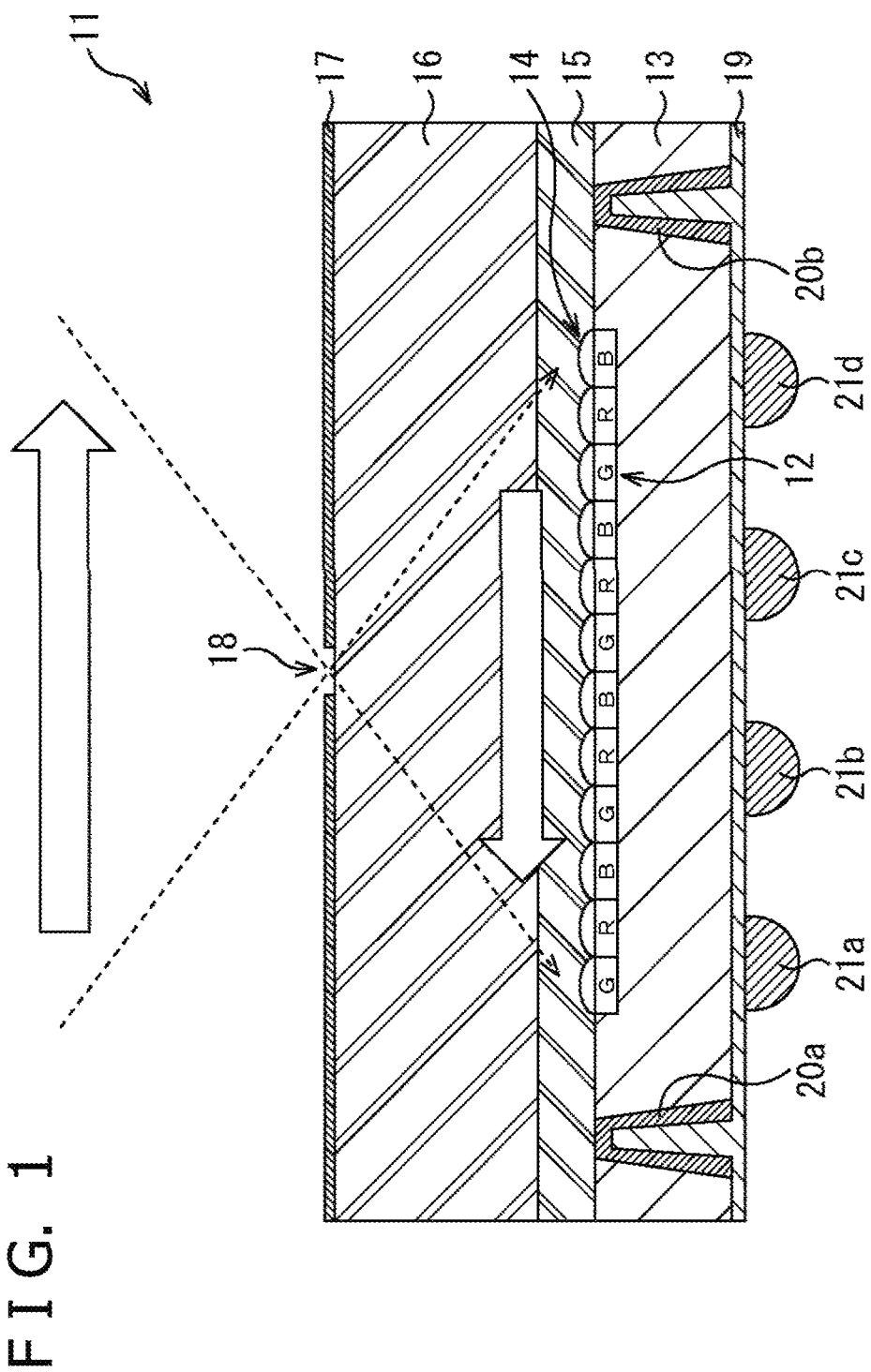
FIG. 1 is a view depicting an example of a configuration of a first embodiment of a solid-state image pickup element to which the present technology is applied.

FIG. 1 is a view depicting an example of a configuration of a first embodiment of a solid-state image pickup element to which the present technology is applied.

FIG. 1 depicts an example of a sectional configuration of a solid-state image pickup element 11. In the solid-state image pickup element 11, an on-chip lens 14 having a microlens formed for each pixel thereon is arranged on a first main face (face directed to the upper side in FIG. 1) of a semiconductor substrate 13 on which a plurality of pixels are arranged in an array to form a pixel array 12. The on-chip lens 14 condenses light for each pixel of the pixel array 12, and each pixel of the pixel array 12 photoelectrically converts the received light and outputs a pixel signal according to the light amount.

On the first main face side of the semiconductor substrate 13, a seal resin 15, a glass substrate 16 and a metal film 17 are stacked, and a pinhole 18 is formed in the metal film 17.

Further, an insulating film 19 is formed on a second main face (face directed to the lower side in FIG. 1) of the semiconductor substrate 13. Further, through electrodes 20a and 20b are formed such that they extend through the semiconductor substrate 13 and are connected to external terminals 21a to 21d formed on the second main face of the semiconductor substrate 13.

The seal resin 15 is transparent resin that pastes the semiconductor substrate 13 and the glass substrate 16 together.

The glass substrate 16 is a support substrate having a light transmitting property and is a protective substrate that protects the first main face side of the semiconductor substrate 13.

The metal film 17 is a light shielding film that blocks light to be irradiated upon the first main face of the solid-state image pickup element 11 and is configured, for example, from a metal that reflects light. In particular, the metal film 17 is formed by forming a film of titanium (Ti), titanium nitride (TiN), tantalum (Ta), tantalum nitride (TaN), tungsten (W), ruthenium (Ru), chromium (Cr), nickel (Ni), aluminum (Al) or the like. Also, the metal film 17 can be configured from a stacked film of the metals mentioned. For example, the metal film 17 is preferably formed as a film of a thickness of not less than 40 nm, and where aluminum or ruthenium is used, if the metal film 17 is formed with a thickness of approximately 60 nm, the metal film 17 can block light well.

The pinhole 18 is formed by providing a fine opening at part of the metal film 17 and has a function as a lens by allowing light, which is irradiated upon the first main face of the solid-state image pickup element 11, to pass therethrough to form an image on the pixel array 12 of the semiconductor substrate 13. It is to be noted that the pinhole 18 may be, in addition to a pinhole that functions as a lens using such a single opening as depicted in FIG. 1, any element that has a similar function like a lens of a very small diameter including such a shape as, for example, a diffraction lens.

The insulating film 19 is formed by forming a film of an insulator (for example, SiO2) over an overall area of the second main face of the semiconductor substrate 13 except regions in which the external terminals 21a to 21d are formed. Further, the insulating film 19 is formed also on the inner face of the through electrodes 20a and 20b. It is to be noted that a conductor film (Cu) not depicted is formed between the insulating film 19 and the second main face of the semiconductor substrate 13. The insulating film 19 is solder resist (solder mask for ball, land opening) that protects the conductor layer, and is formed from, for example, a phenol type resin, a polyimide type resin, an amine type resin or the like.

The through electrodes 20a and 20b are formed such that they extend from the second main face to the first main face of the semiconductor substrate 13 through the semiconductor substrate 13 and establish electric connection to the external terminals 21a to 21d for outputting to the outside of the semiconductor substrate 13. Further, the through electrodes 20a and 20b are used, for example, in pair for inputting to the semiconductor substrate 13 and for outputting from the semiconductor substrate 13.

The external terminals 21a to 21d are used to directly mount (COB: Chip On Board) the solid-state image pickup element 11 on a mounting substrate made or resin or ceramic and is formed, for example, from a solder ball of a very small diameter. For example, the external terminals 21a to 21d are formed on a conductor layer exposed to openings formed at part of the insulating film 19. For example, for the external terminals 21a to 21d, Sn—Pb (eutectic), 95Pb—Sn (high lead high melting point solder), or, as a Pb-free solder, Sn—Ag, Sn—Cu, Sn—Ag—Cu or the like is used.

As described above, the solid-state image pickup element 11 having the pinhole 18 is an image pickup element chip configured from a semiconductor package (WCSP: Wafer Level Chip Scale Package) that is a package on the wafer level.

Meanwhile, for example, according to a cavity structure, light incident at a shallow angle is likely to undergo diffraction or reflection by a refractive index difference at the interface of the cavity, and the light is diffracted or reflected by the air layer to make the angle shallower or result in failure to reach. In contrast, since the solid-state image pickup element 11 has a cavity-less structure, it can avoid such a situation that light incident at a shallow angle is diffracted or reflected by an air layer to make the angle shallower or result in failure to reach.

Further, the solid-state image pickup element 11 includes an image pickup pixel unit on which an image pickup element is formed, and a peripheral circuit unit that processes a signal outputted from the image pickup pixel unit. The image pickup pixel unit of a semiconductor package has such a configuration as described below.

In particular, the image pickup pixel unit of the solid-state image pickup element 11 forms an image sensor (pixel array and control circuit) in a region that is to make each chip of a semiconductor wafer. In a particular method, photodiodes, pixel transistors, floating diffusions and so forth are formed similarly as in an existing complementary metal-oxide semiconductor (CMOS) image sensor, and in addition, MOS transistors are formed at the control circuit side. Then, connection contacts are formed on the transistors, and a plurality of wiring layers (Cu wiring lines) are formed as upper layers of the connection contacts through an interlayer insulating film using a damascene method.

Here, in an image sensor of the front face type, color filters and on-chip lenses are formed in this state. On the other hand, in an image sensor of the rear face irradiation type, after a wiring layer is formed, the wiring layer side is pasted to a silicon support substrate, and in this state, the silicon substrate at the solid-state image pickup element side is reduced in thickness to 1 to 10 µm. Further, a µ-type semiconductor for dark current control is formed on the rear face of the photodiode. It is to be noted that such a manufacturing method as just described is disclosed in paragraphs 53 to 59 of JP 2010-245506A filed already by the assignee of the present application.

Further, in an image sensor of the stacked type, after formation of a wiring layer on a semiconductor wafer at the image pickup element side described above, pasting to a second semiconductor wafer is performed, and in this state, the silicon substrate at the solid-state image pickup element side is reduced in thickness to 1 to 10 µm and then the P-type semiconductor for dark current control is formed on the rear face of the photodiode. It is to be noted that such a manufacturing method as just described is disclosed in paragraphs 49 to 59 of JP 2010-245506A filed already by the assignee of the present application.

In this manner, for the silicon semiconductor substrate on which an image pickup element chip is formed, any of silicon semiconductor substrates of the front face type, rear face irradiation type and stacked type may be used. Further, in the peripheral circuit unit of the semiconductor packet, the through electrodes 20 and the external terminals 21 (electrode pads) are formed.

Figure 2:
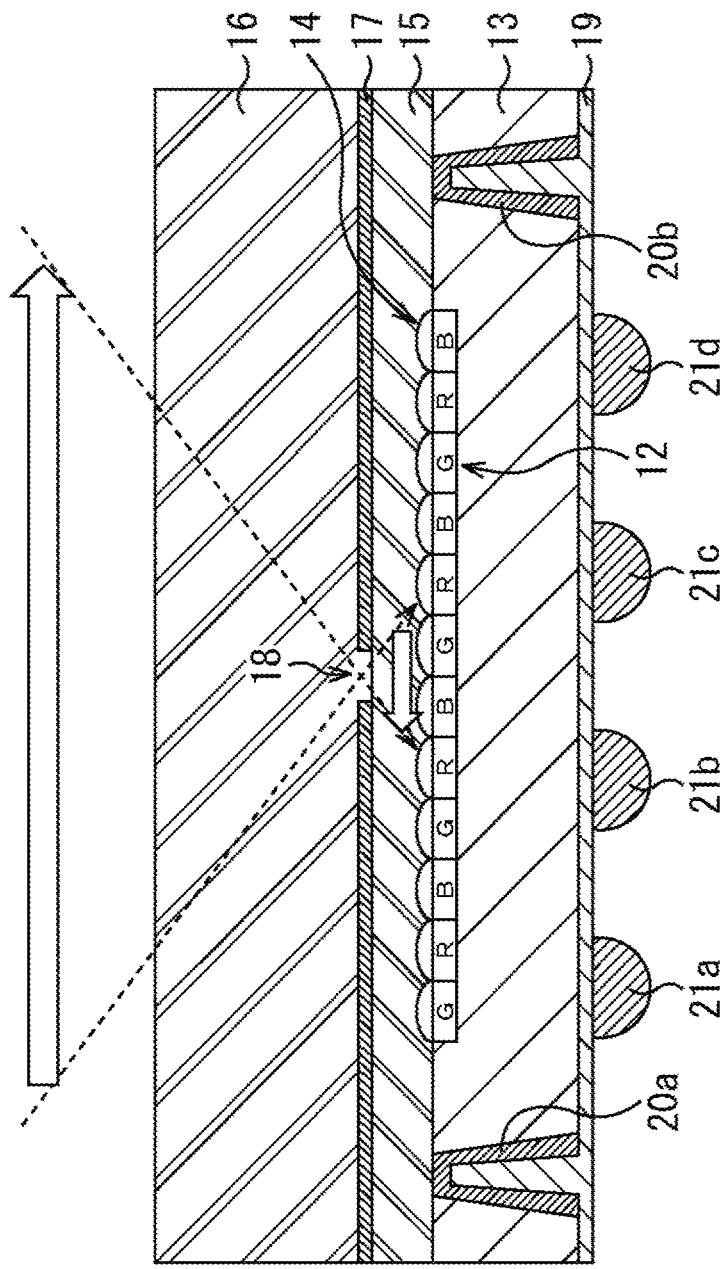
FIG. 2 is a view depicting an example of a configuration of a second embodiment of the solid-state image pickup element.

Next, FIG. 2 is a view depicting an example of a configuration of a second embodiment of the solid-state image pickup element. It is to be noted that, in a solid-state image pickup element 11A depicted in FIG. 2, components common to those of the solid-state image pickup element 11 of FIG. 1 are denoted by like reference symbols, and detailed description of them is omitted.

As depicted in FIG. 2, the solid-state image pickup element 11A is different in configuration from the solid-state image pickup element 11 of FIG. 1 in that a seal resin 15, a metal film 17 and a glass substrate 16 are stacked in order from the first main face side of the semiconductor substrate 13. In particular, in the solid-state image pickup element 11A, a glass substrate 16 for protecting an on-chip lens 14 of a semiconductor substrate 13 is arranged on the on-chip lens 14 with the seal resin 15 interposed therebetween, and the metal film 17 having a pinhole 18 formed therein is arranged between the seal resin 15 and the on-chip lens 14.

In the solid-state image pickup element 11A configured in this manner, the pinhole 18 can be arranged more closely to the semiconductor substrate 13, for example, in comparison with the solid-state image pickup element 11 of FIG. 1, and the range within which an image of an image pickup object on the pixel array 12 can be reduced.

Figure 3:
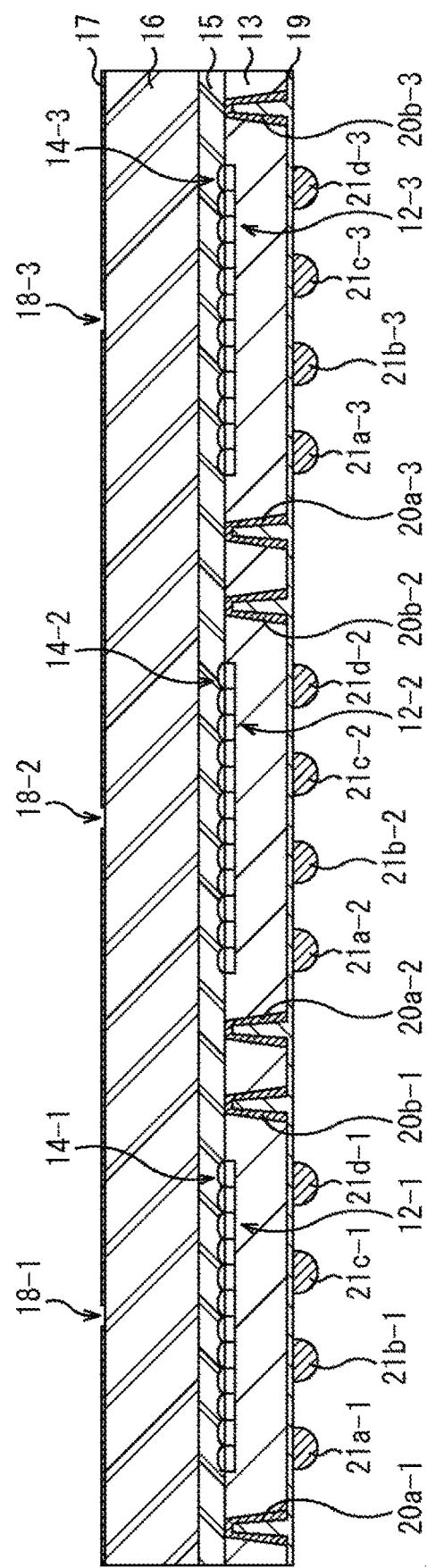
FIG. 3 is a view depicting an example of a configuration of a third embodiment of the solid-state image pickup element.

Next, FIG. 3 is a view depicting an example of a configuration of a third embodiment of a solid-state image pickup element. It is to be noted that, in a solid-state image pickup element 11B depicted in FIG. 3, components common to those of the solid-state image pickup element 11 of FIG. 1 are denoted by like reference symbols, and detailed description of them is omitted.

For example, while the solid-state image pickup element 11 of FIG. 1 is structured such that it has one pinhole 18, the solid-state image pickup element may be structured such that it has one or more pinholes 18. In the example of FIG. 3, the solid-state image pickup element 11B is configured having three pinholes 18-1 to 18-3.

As depicted in FIG. 3, the solid-state image pickup element 11B is configured such that it has a stacked structure similar to that of the solid-state image pickup element 11 of FIG. 1 and includes three solid-state image pickup elements 11 integrated with each other. In particular, in the solid-state image pickup element 11B, pixel arrays 12-1 to 12-3 are provided at three locations of the semiconductor substrate 13, and the pinholes 18-1 to 18-3 are formed at three locations of the metal film 17 so as to correspond to the pixel arrays 12-1 to 12-3, respectively.

Further, the solid-state image pickup element 11B is configured such that through electrodes 20a-1 and 20b-1 are provided corresponding to the pixel array 12-1, through electrodes 20a-2 and 20b-2 are provided corresponding to the pixel array 12-2, and through electrodes 20a-3 and 20b-3 are provided corresponding to the pixel array 12-3.

The solid-state image pickup element 11B having such a configuration as described above can be applied, for example, to a stereo camera that can pick up a plurality of images of different parallaxes at distances between the plurality of pinholes 18 to acquire a three-dimensional image. Consequently, a stereo camera of a smaller size can be implemented.

Figure 4:
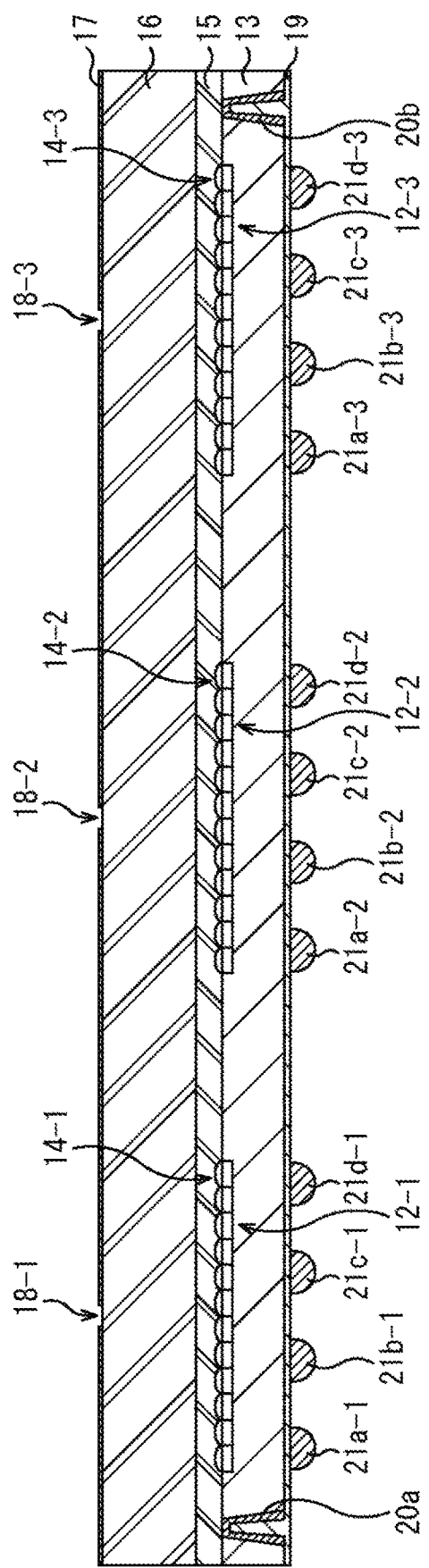
FIG. 4 is a view depicting an example of a configuration of a fourth embodiment of the solid-state image pickup element.

Next, FIG. 4 is a view depicting an example of a configuration of a fourth embodiment of a solid-state image pickup element. It is to be noted that, in a solid-state image pickup element 11C depicted in FIG. 4, components common to those of the solid-state image pickup element 11B of FIG. 3 are denoted by like reference symbols, and detailed description of them is omitted.

As depicted in FIG. 4, the solid-state image pickup element 11C is configured including through electrodes 20a and 20b, which are paired for inputting and outputting, independently of each other in the overall solid-state image pickup element 11C.

The solid-state image pickup element 11C having such a configuration as just described can implement a stereo camera of a smaller size similarly to the solid-state image pickup element 11B of FIG. 3.

It is to be noted that a stacked structure may be adopted which is configured similarly to the solid-state image pickup element 11B of FIG. 3 and the solid-state image pickup element 11C of FIG. 4 and includes pinholes 18-1 to 18-3 provided between the seal resin 15 and the glass substrate 16 as depicted in FIG. 2.

Furthermore, for example, an intermediate configuration between the solid-state image pickup element 11B and the solid-state image pickup element 11C, namely, a configuration that has a plurality of pinholes 18 and has a smaller number of pairs of through electrodes 20a and 20b than the number of pinholes 18 provided therein, may be adopted. Further, in addition to a configuration that a plurality of pinholes 18 are arranged on a line, for example, a multi lens array in which pinholes 18 are arranged in an array may be adopted.

Figure 5:
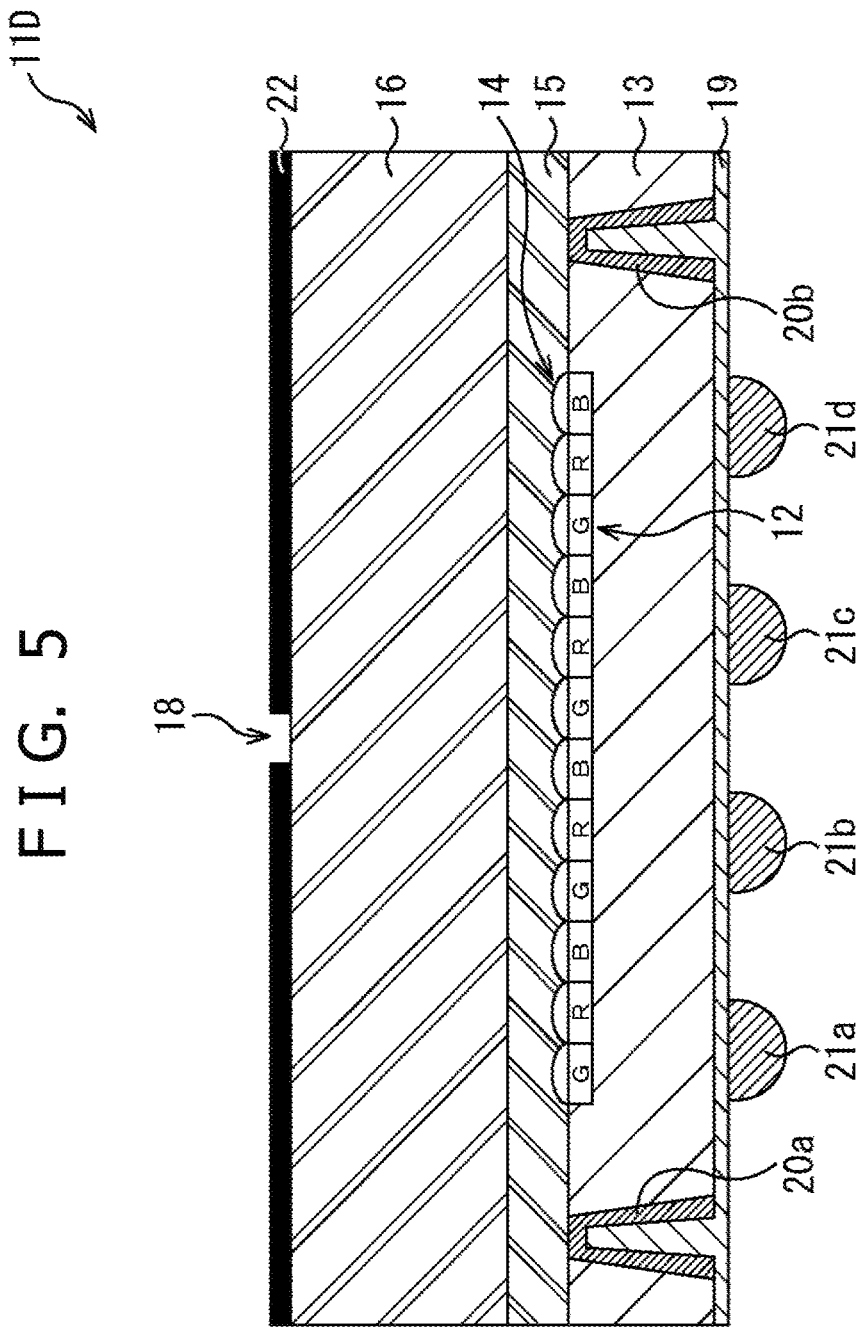
FIG. 5 is a view depicting an example of a configuration of a fifth embodiment of the solid-state image pickup element.

Next, FIG. 5 is a view depicting an example of a configuration of a fifth embodiment of a solid-state image pickup element. It is to be noted that, in a solid-state image pickup element 11D depicted in FIG. 5, components common to those of the solid-state image pickup element 11 of FIG. 1 are denoted by like reference symbols, and detailed description of them is omitted.

As depicted in FIG. 5, the solid-state image pickup element 11D has a configuration different from that of the solid-state image pickup element 11 of FIG. 1 in that black resist 22 is stacked on the glass substrate 16 and a pinhole 18 is formed in the black resist 22. In particular, while, in the solid-state image pickup element 11 of FIG. 1, the metal film 17 that is a light shielding plate of the reflection type that reflects light is used, in the solid-state image pickup element 11D, the black resist 22 that is a light shielding plate of the absorption type that absorbs light is used. For example, the black resist 22 is formed preferably such that it has a thickness of 1 μm to several μm.

In the solid-state image pickup element 11D having such a configuration as described above, reflected light when light incident to the solid-state image pickup element 11D through the pinhole 18 is reflected in the inside of the solid-state image pickup element 11D can be absorbed by the black resist 22. Consequently, such reflected light can be suppressed from having a bad influence on an image.

Figure 6:
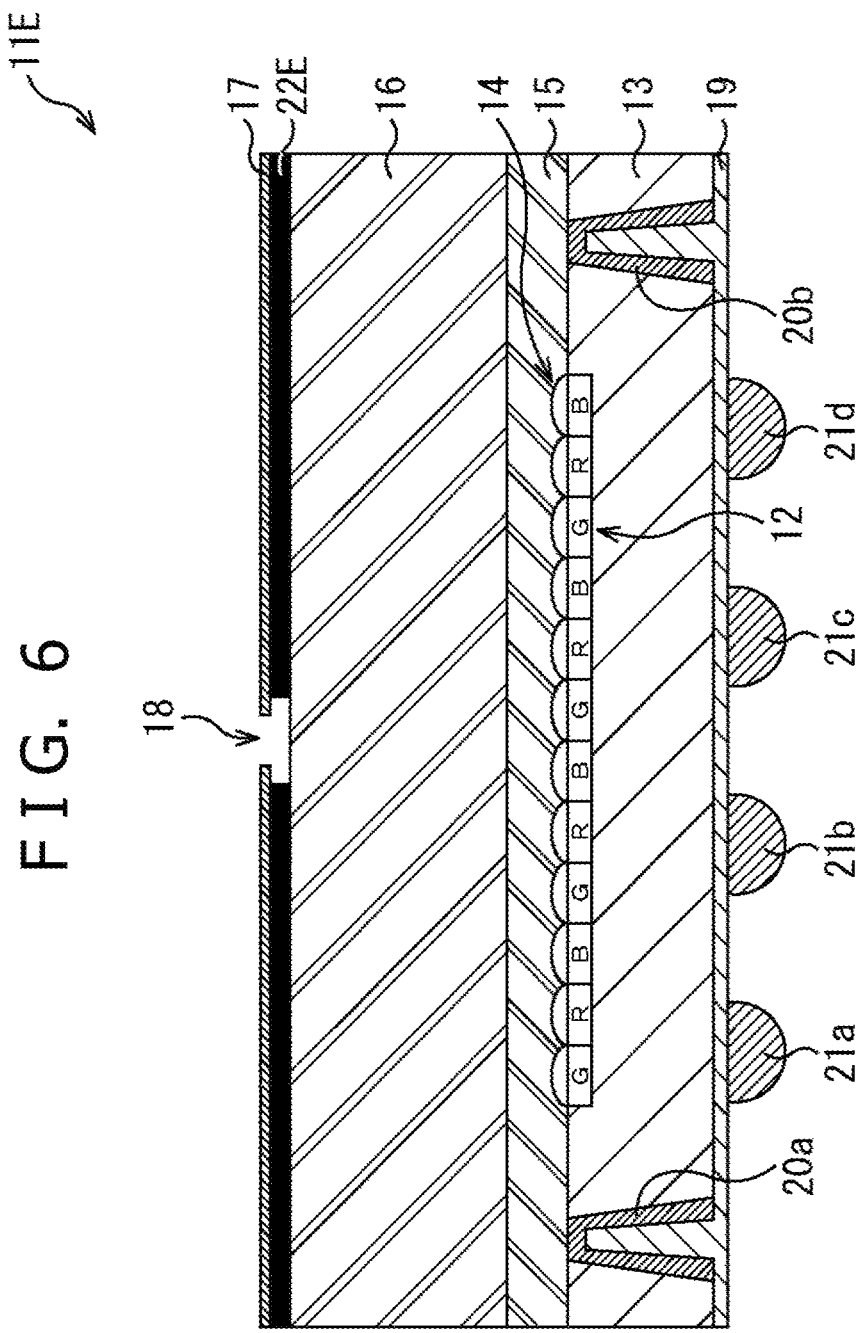
FIG. 6 is a view depicting an example of a configuration of a sixth embodiment of the solid-state image pickup element.

Next, FIG. 6 is a view depicting an example of a configuration of a sixth embodiment of a solid-state image pickup element. It is to be noted that, in a solid-state image pickup element 11E depicted in FIG. 6, components common to those of the solid-state image pickup element 11 of FIG. 1 are denoted by like reference symbols, and detailed description of them is omitted.

As depicted in FIG. 6, the solid-state image pickup element 11E has a configuration different from that of the solid-state image pickup element 11 of FIG. 1 in that black resist 22E is stacked between the glass substrate 16 and the metal film 17. In particular, in the solid-state image pickup element 11E, a pinhole 18 is formed in the stacked film formed from the metal film 17 and the black resist 22E.

Further, the solid-state image pickup element 11E is configured such that the opening diameter of the black resist 22E is greater than the opening diameter of the metal film 17 in which the pinhole 18 is formed (for example, the black resist 22E has an opening diameter greater than that of the black resist 22 of FIG. 5). In particular, the metal film 17 is better in control when an opening is to be provided than the black resist 22E, and a pinhole 18 of a more accurate diameter can be formed in the metal film 17. Consequently, the solid-state image pickup element 11E can pick up an image with a more appropriate aperture value.

In the solid-state image pickup element 11E having such a configuration as described above, by providing the black resist 22E at the semiconductor substrate 13 side of the metal film 17, reflected light in the inside of the solid-state image pickup element 11E can be suppressed from having a bad influence on an image similarly as in the solid-state image pickup element 11D of FIG. 5.

It is to be noted that a configuration similar to that of the solid-state image pickup element 11D of FIG. 5 and the solid-state image pickup element 11E of FIG. 6 may adopt a stacked structure in which a pinhole 18 is provided between the seal resin 15 and the glass substrate 16 as depicted in FIG. 2.

Figure 7:
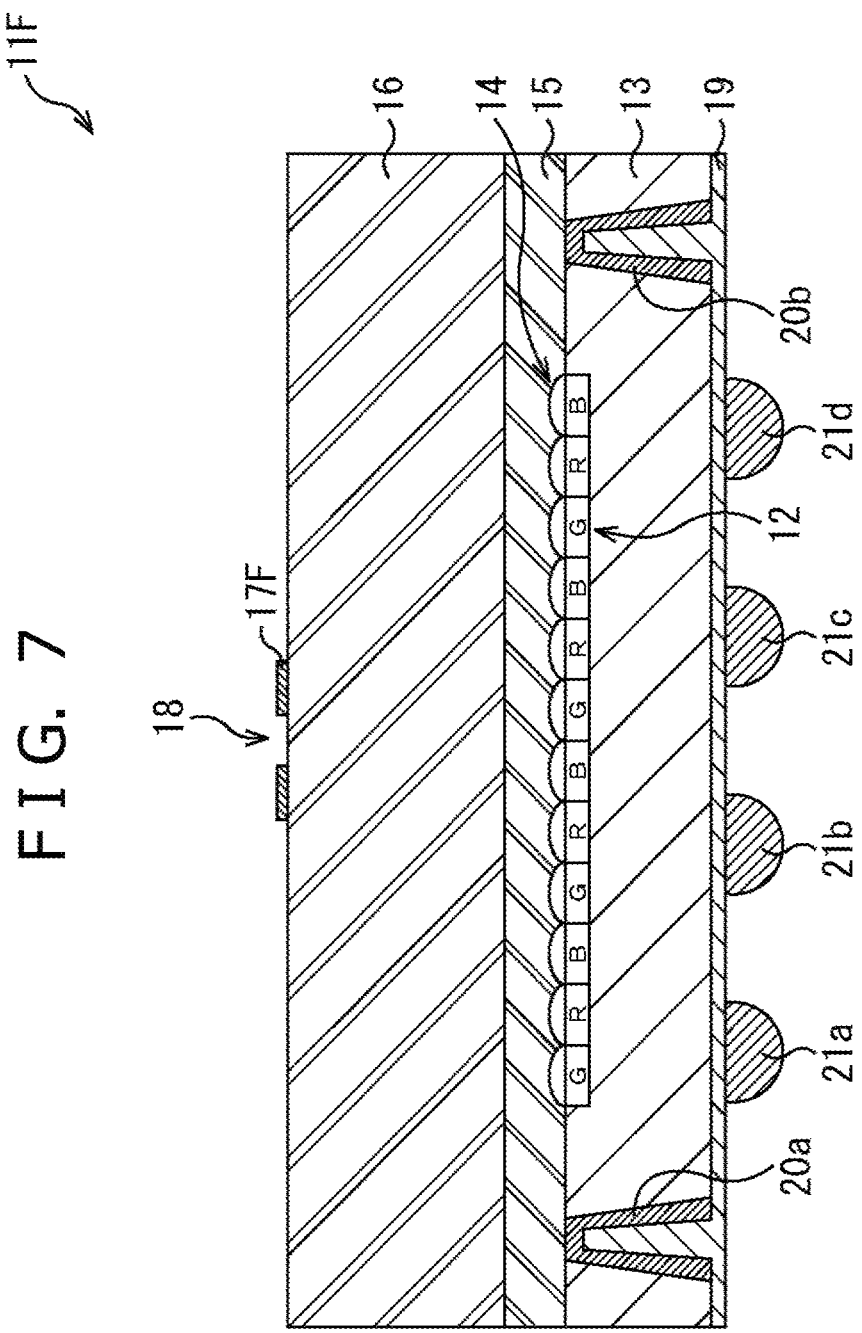
FIG. 7 is a view depicting an example of a configuration of a seventh embodiment of the solid-state image pickup element.

Next, FIG. 7 is a view depicting an example of a configuration of a seventh embodiment of a solid-state image pickup element. It is to be noted that, in a solid-state image pickup element 11F depicted in FIG. 7, components common to those of the solid-state image pickup element 11 of FIG. 1 are denoted by like reference symbols, and detailed description of them is omitted.

As depicted in FIG. 7, the solid-state image pickup element 11F has a configuration different from that of the solid-state image pickup element 11 of FIG. 1 in that a metal film 17F stacked on the glass substrate 16 is formed such that it has a smaller area than the glass substrate 16. In other words, the solid-state image pickup element 11F is configured such that the metal film 17F has a size that is smaller than the area of the metal film 17 of FIG. 1 but is necessary to form the pinhole 18.

Further, similar to the metal film 17, the metal film 17F is formed from such a metal as titanium (Ti), titanium nitride (TiN), tantalum (Ta), tantalum nitride (TaN), tungsten (W), ruthenium (Ru), chromium (Cr), nickel (Ni), aluminum (Al) or the like or a stacked film of the metals.

The solid-state image pickup element 11F having such a configuration as described above can be used, for example, utilizing a case (refer to FIG. 16) having a light shielding property.

Figure 8:
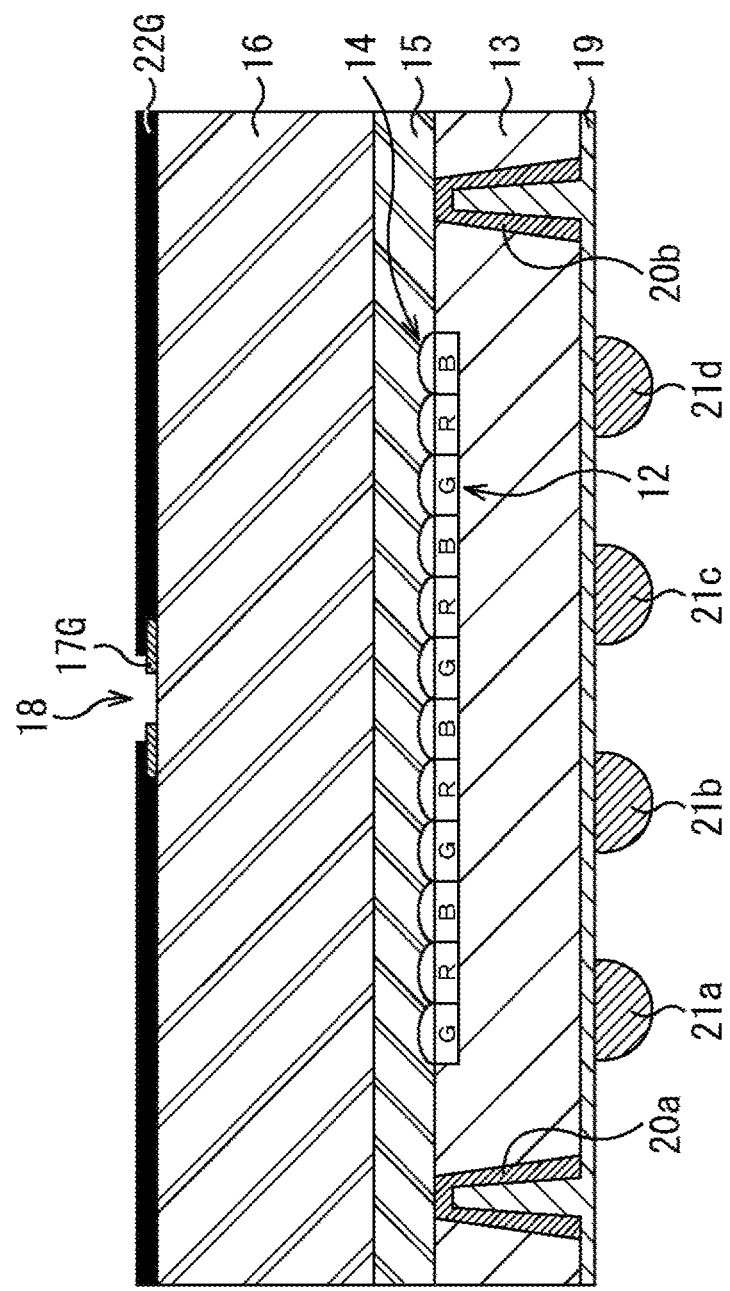
FIG. 8 is a view depicting an example of a configuration of an eighth embodiment of the solid-state image pickup element.

Next, FIG. 8 is a view depicting an example of a configuration of an eighth embodiment of a solid-state image pickup element. It is to be noted that, in a solid-state image pickup element 11G depicted in FIG. 8, components common to those of the solid-state image pickup element 11 of FIG. 1 are denoted by like reference symbols, and detailed description of them is omitted.

As depicted in FIG. 8, the solid-state image pickup element 11G has a configuration different from that of the solid-state image pickup element 11 of FIG. 1 in that a metal film 17G stacked on the glass substrate 16 is formed so as to have a smaller area than the glass substrate 16 and black resist 22G is stacked further. In particular, the solid-state image pickup element 11G is configured such that the metal film 17G is formed so as to have a smaller area than the metal film 17 but have a size necessary to form a pinhole 18 therein and a portion of the solid-state image pickup element 11G other than the metal film 17G is shielded against light by the black resist 22G.

Further, the solid-state image pickup element 11G is configured such that the opening diameter of the metal film 17G in which the pinhole 18 is formed is greater than the opening diameter of the black resist 22G similarly as in the solid-state image pickup element 11E of FIG. 6. Consequently, the solid-state image pickup element 11G can have the pinhole 18 of a more accurate diameter formed therein and can pick up an image with a more appropriate aperture value.

Figure 9:
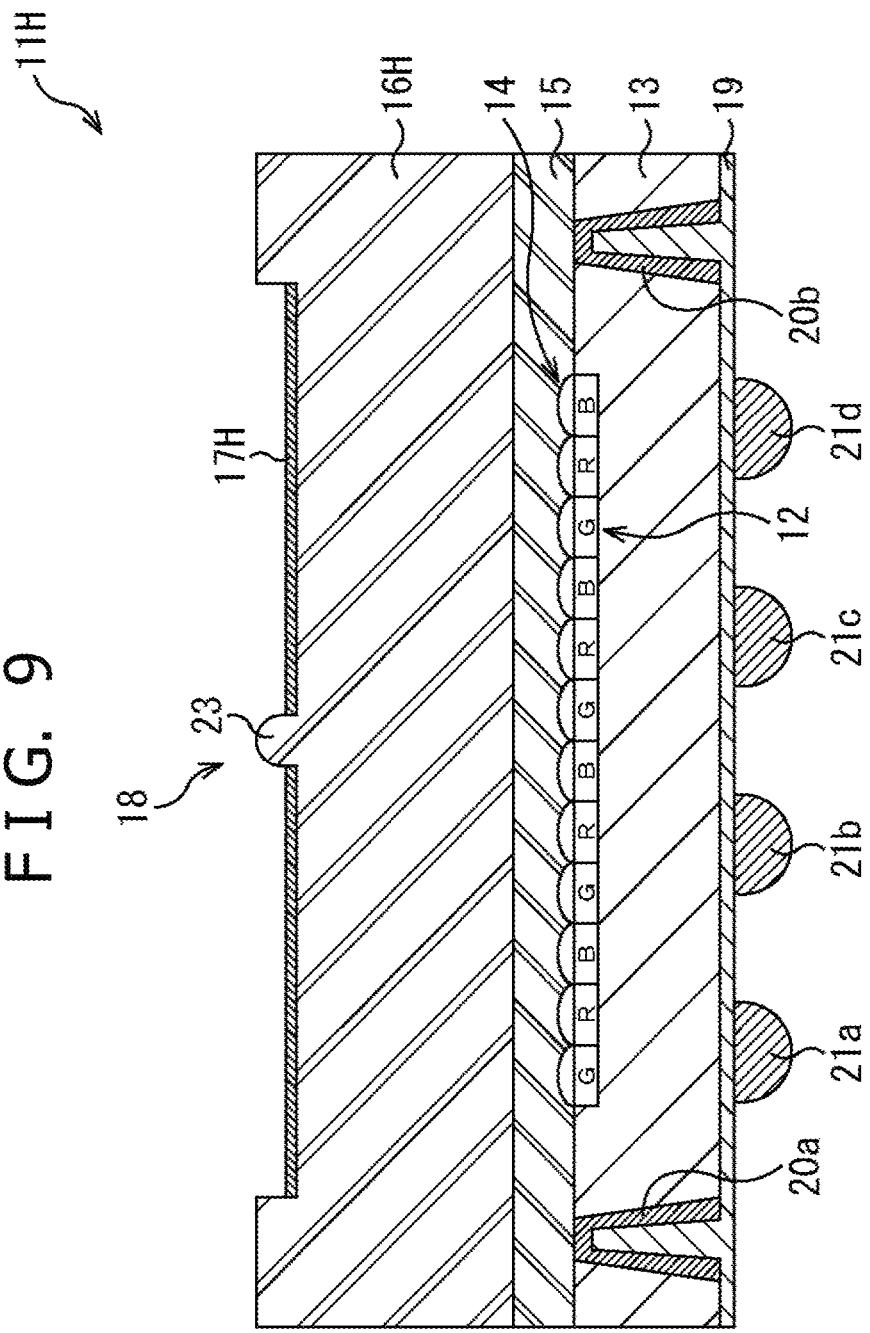
FIG. 9 is a view depicting an example of a configuration of a ninth embodiment of the solid-state image pickup element.

Next, FIG. 9 is a view depicting an example of a configuration of a ninth embodiment of a solid-state image pickup element. It is to be noted that, in a solid-state image pickup element 11H depicted in FIG. 9, components common to those of the solid-state image pickup element 11 of FIG. 1 are denoted by like reference symbols, and detailed description of them is omitted.

As depicted in FIG. 9, the solid-state image pickup element 11H has a configuration different from that of the solid-state image pickup element 11 of FIG. 1 in that a glass substrate 16H is embedded in a metal film 17H and a waveguide 23 is formed such that part of the glass substrate 16H projects from a pinhole 18 formed in the metal film 17H. The waveguide 23 has an upper end portion formed in a convex shape of a predetermined curvature and condenses light irradiated on the solid-state image pickup element 11H so as to be transmitted through the pinhole 18.

In the solid-state image pickup element 11H of such a configuration as described above, a greater amount of light can pass through the pinhole 18 by condensing light by the waveguide 23. Consequently, a brighter image can be picked up by the solid-state image pickup element 11H.

Figure 10:
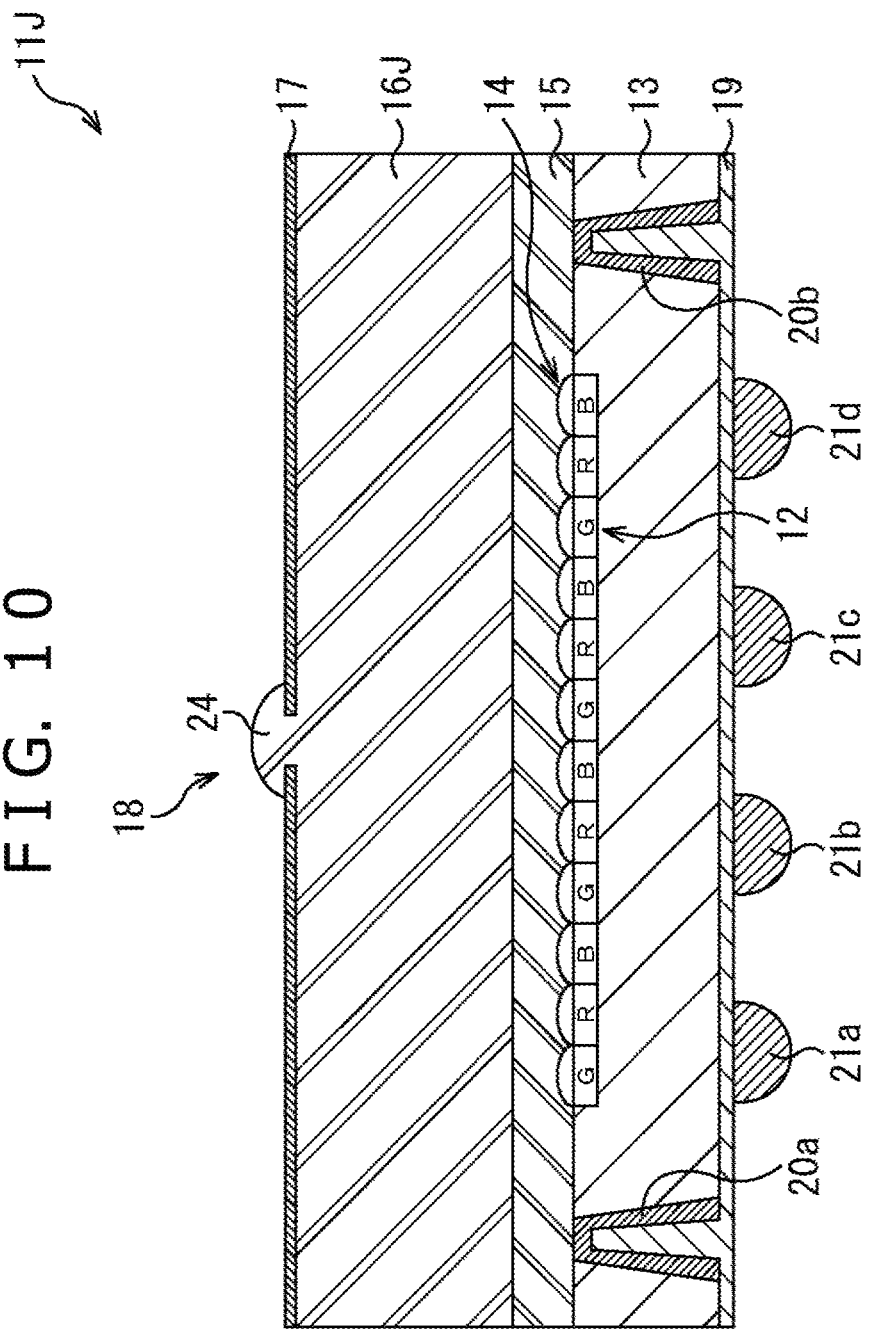
FIG. 10 is a view depicting an example of a configuration of a tenth embodiment of the solid-state image pickup element.

Next, FIG. 10 is a view depicting an example of a configuration of a tenth embodiment of a solid-state image pickup element. It is to be noted that, in a solid-state image pickup element 11J depicted in FIG. 10, components common to those of the solid-state image pickup element 11 of FIG. 1 are denoted by like reference symbols, and detailed description of them is omitted.

As depicted in FIG. 10, the solid-state image pickup element 11J has a configuration different from that of the solid-state image pickup element 11 of FIG. 1 in that a convex shape portion 24 of a material same as that of a glass substrate 16J is provided just above a pinhole 18 formed in a metal film 17. The convex shape portion 24 can be used as a condenser lens for condensing light irradiated upon the solid-state image pickup element 11J.

In the solid-state image pickup element 11J of such a configuration as just described, a greater amount of light can pass through the pinhole 18 by condensing light by the convex shape portion 24. Consequently, a brighter image can be picked up by the solid-state image pickup element 11J.

Figure 11:
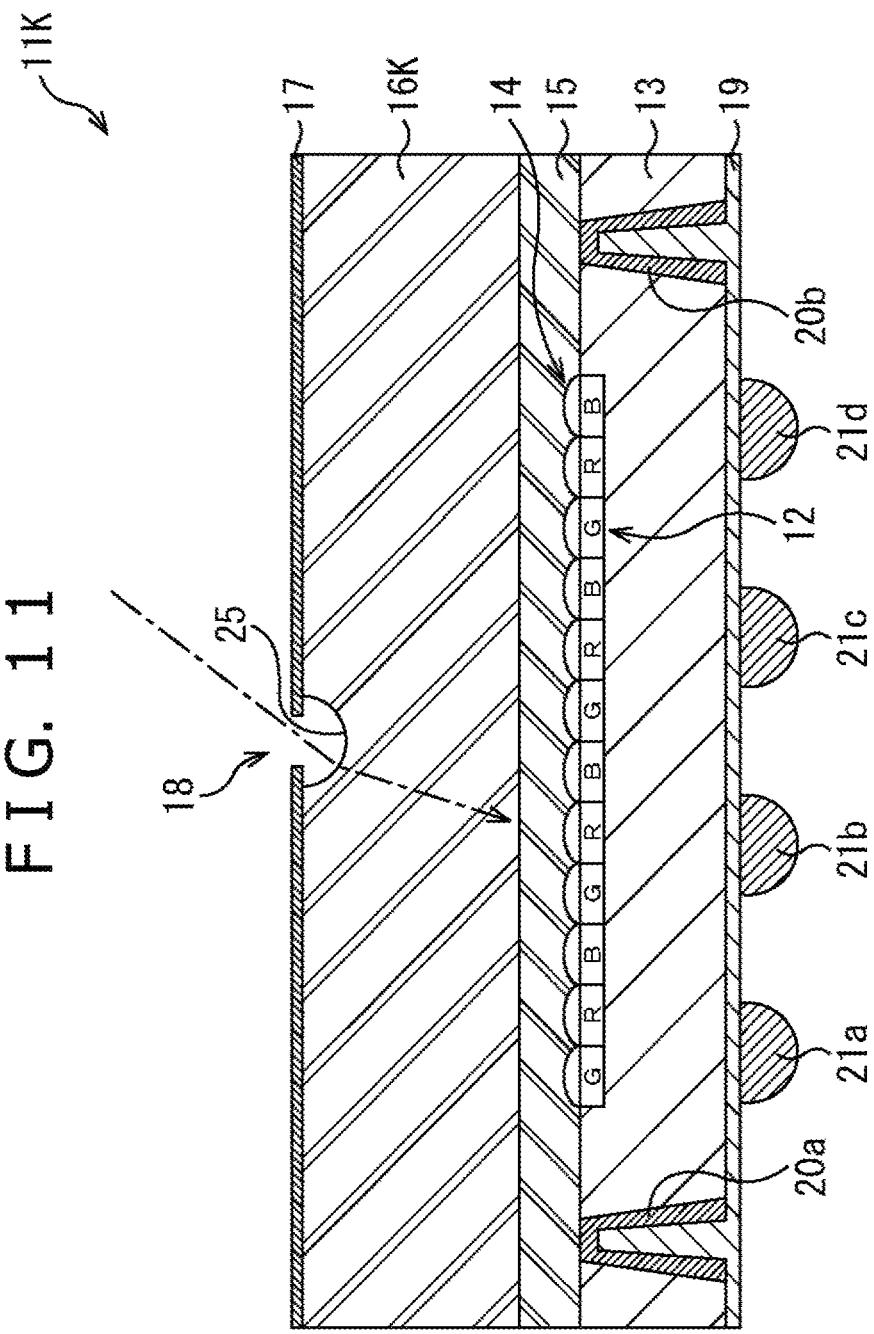
FIG. 11 is a view depicting an example of a configuration of an eleventh embodiment of the solid-state image pickup element.

Next, FIG. 11 is a view depicting an example of a configuration of an eleventh embodiment of a solid-state image pickup element. It is to be noted that, in a solid-state image pickup element 11K depicted in FIG. 11, components common to those of the solid-state image pickup element 11 of FIG. 1 are denoted by like reference symbols, and detailed description of them is omitted.

As depicted in FIG. 11, the solid-state image pickup element 11K has a configuration different from that of the solid-state image pickup element 11 of FIG. 1 in that a concave shape portion 25 concaved by etching a glass substrate 16K is provided just below a pinhole 18 formed in a metal film 17. The concave shape portion 25 can be used as a concave lens that suppresses light, which is irradiated upon the solid-state image pickup element 11K and passes through the pinhole 18, from spreading so as to be irradiated appropriately on the pixel array 12.

The solid-state image pickup element 11K of such a configuration as described above can achieve, for example, further reduction in scale by suppressing light, which passes through the pinhole 18, from spreading to condense light to the inner side by the concave shape portion 25.

Figure 12:
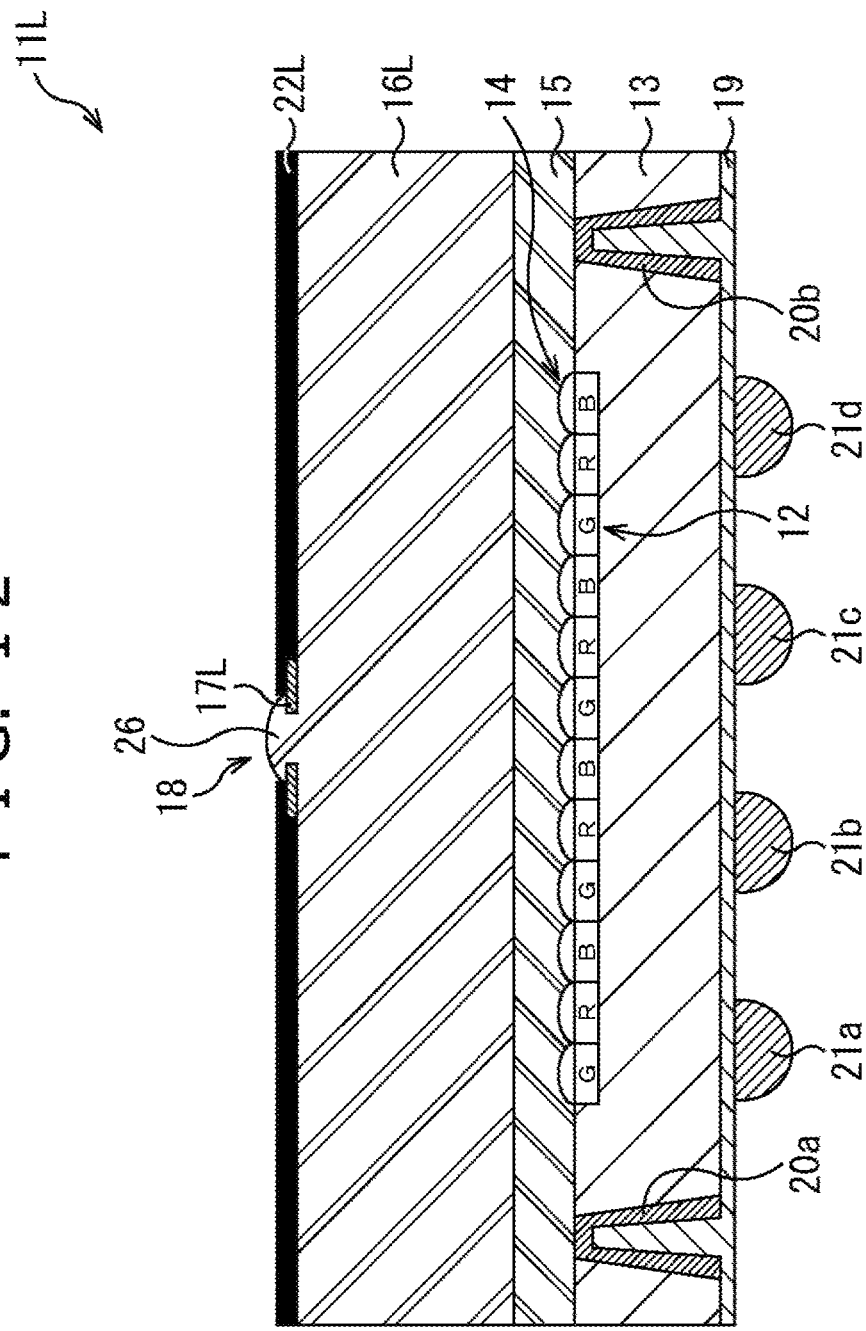
FIG. 12 is a view depicting an example of a configuration of a twelfth embodiment of the solid-state image pickup element.

Next, FIG. 12 is a view depicting an example of a configuration of a twelfth embodiment of a solid-state image pickup element. It is to be noted that, in a solid-state image pickup element 11L depicted in FIG. 12, components common to those of the solid-state image pickup element 11 of FIG. 1 are denoted by like reference symbols, and detailed description of them is omitted.

As depicted in FIG. 12, in the solid-state image pickup element 11L, a metal film 17L stacked on a glass substrate 16L is formed so as to have a smaller area than the glass substrate 16L similarly as in the solid-state image pickup element 11F of FIG. 7, and black resist 22L is stacked further. Further, the solid-state image pickup element 11L has a configuration different from that of the solid-state image pickup element 11 of FIG. 1 in that a convex shape portion 26 of a material same as that of the glass substrate 16L is provided just above the pinhole 18 formed in the metal film 17L.

In the solid-state image pickup element 11L having such a configuration as described above, a pinhole 18 having a more accurate diameter can be formed, and it is possible to pass a greater amount of light to pass through the pinhole 18 and pick up a brighter image with a more appropriate aperture value.

Figure 13:
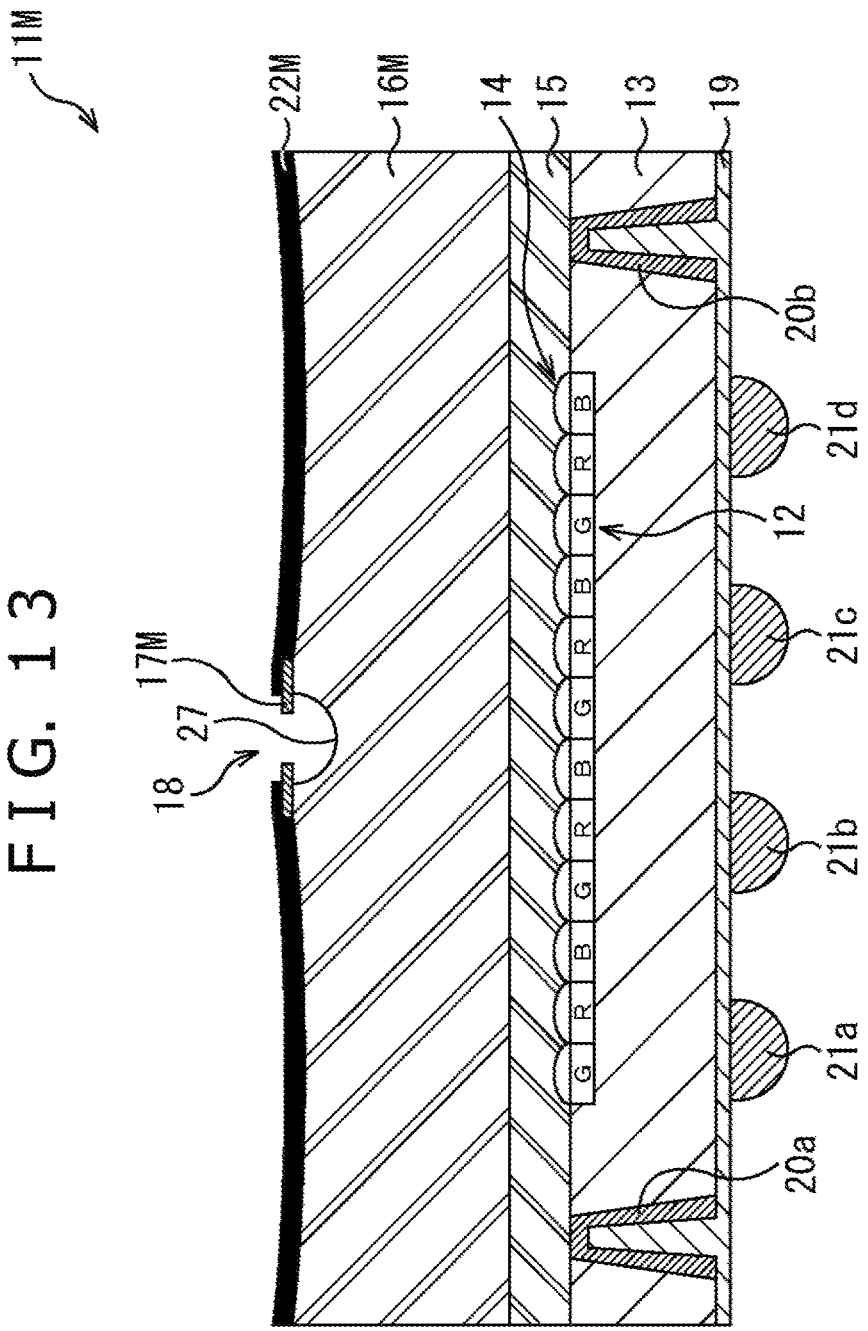
FIG. 13 is a view depicting an example of a configuration of a thirteenth embodiment of the solid-state image pickup element.

Next, FIG. 13 is a view depicting an example of a configuration of a thirteenth embodiment of a solid-state image pickup element. It is to be noted that, in a solid-state image pickup element 11M depicted in FIG. 13, components common to those of the solid-state image pickup element 11 of FIG. 1 are denoted by like reference symbols, and detailed description of them is omitted.

As depicted in FIG. 13, in the solid-state image pickup element 11M, similarly as in the solid-state image pickup element 11G of FIG. 8, a metal film 17M stacked on a glass substrate 16M is formed so as to have an area smaller than that of the glass substrate 16M, and black resist 22M is stacked further. In addition, the solid-state image pickup element 11L has a different configuration from the solid-state image pickup element 11 of FIG. 1 in that a concave shape portion 27 formed concave on the glass substrate 16M by etching is provided just below a pinhole 18 formed in the metal film 17M. It is to be noted that the glass substrate 16M is formed in a curved face that is made concave as a whole by etching when the concave shape portion 27 is formed.

In the solid-state image pickup element 11L of such a configuration as just described, a pinhole 18 can be formed with a more accurate diameter. Further, it is possible to suppress light, which has passed through the pinhole 18, from spreading and pick up an image with a more appropriate aperture value, and further reduction in size can be anticipated.

Figure 14:
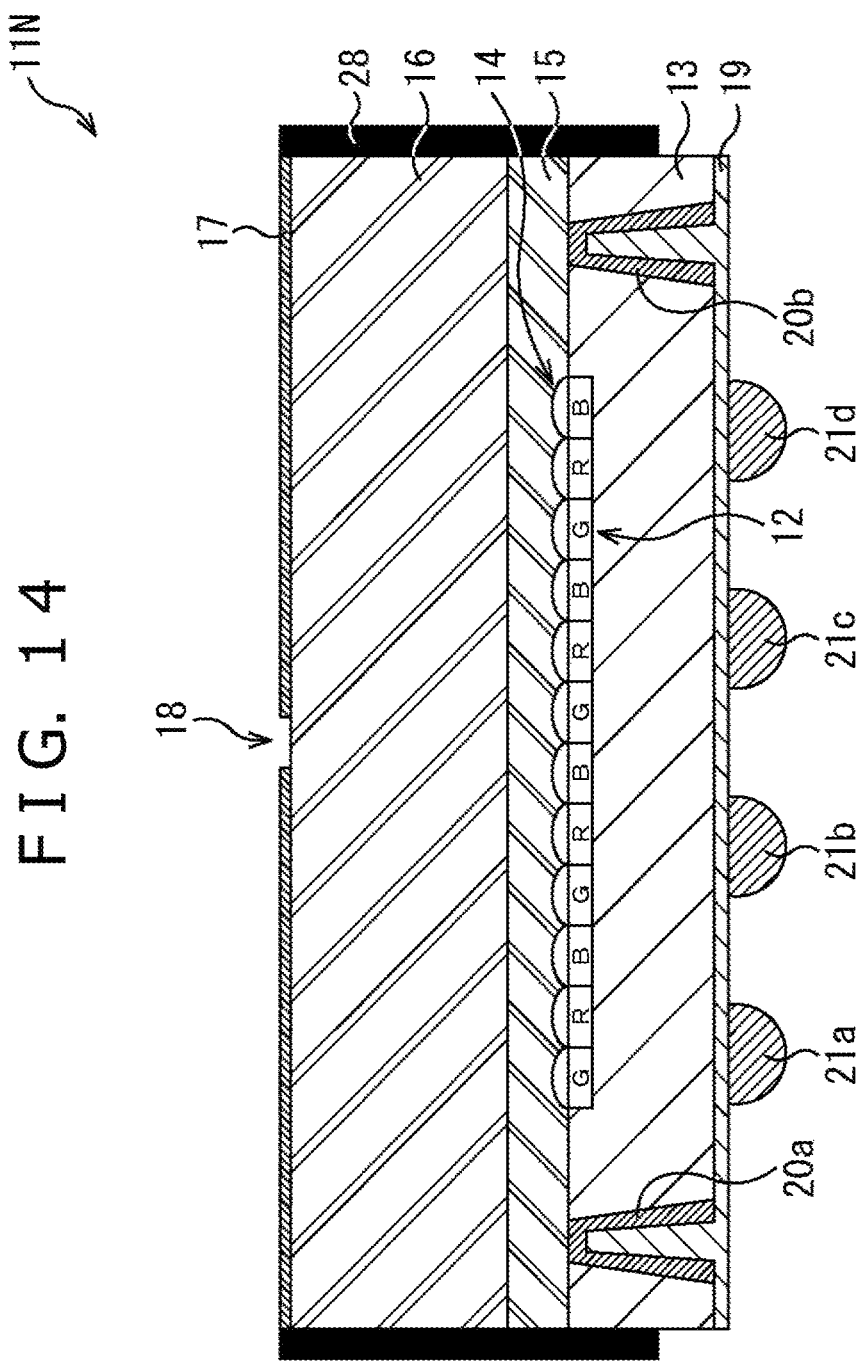
FIG. 14 is a view depicting an example of a configuration of a fourteenth embodiment of the solid-state image pickup element.

Next, FIG. 14 is a view depicting an example of a configuration of a fourteenth embodiment of a solid-state image pickup element. It is to be noted that, in a solid-state image pickup element 11N depicted in FIG. 14, components common to those of the solid-state image pickup element 11 of FIG. 1 are denoted by like reference symbols, and detailed description of them is omitted.

As depicted in FIG. 14, the solid-state image pickup element 11N has a configuration different from that of the solid-state image pickup element 11 of FIG. 1 in that it has a stacked structure similar to that of the solid-state image pickup element 11 of FIG. 1 and a side face light shielding film 28 is formed on a side face thereof. In other words, the solid-state image pickup element 11N is configured such that the side face of the solid-state image pickup element 11N is shielded against light by the side face light shielding film 28. For the side face light shielding film 28, for example, black resist can be used. Also, as the side face light shielding film 28, a film of a metal similar to that of the metal film 17 may be formed.

Since the solid-state image pickup element 11N having such a configuration as described above can block light irradiated from the side face, such light can be suppressed from having a bad influence on an image.

Figure 15:
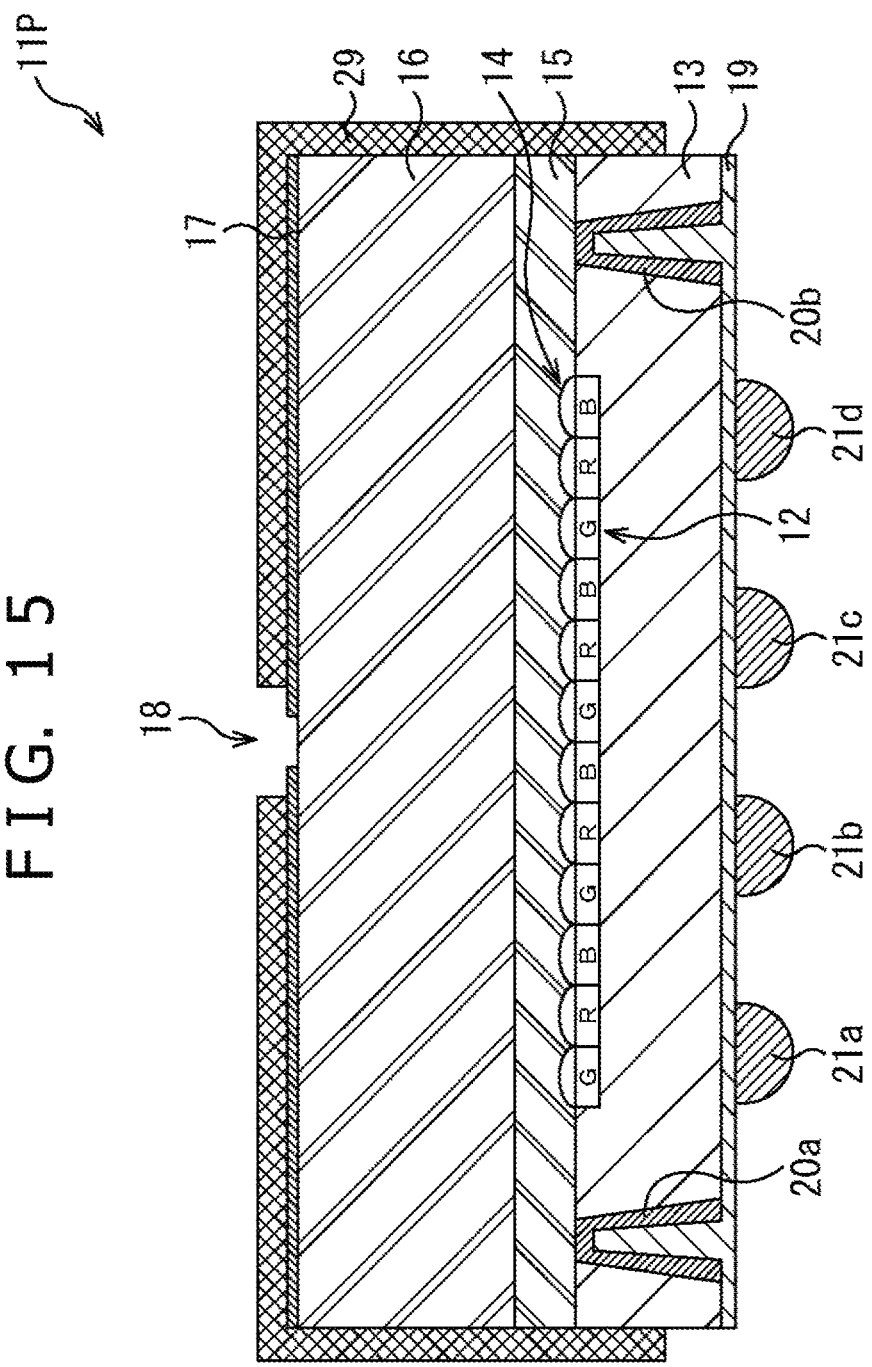
FIG. 15 is a view depicting an example of a configuration of a fifteenth embodiment of the solid-state image pickup element.

Next, FIG. 15 is a view depicting an example of a configuration of a fifteenth embodiment of a solid-state image pickup element. It is to be noted that, in a solid-state image pickup element 11P depicted in FIG. 15, components common to those of the solid-state image pickup element 11 of FIG. 1 are denoted by like reference symbols, and detailed description of them is omitted.

As depicted in FIG. 15, the solid-state image pickup element 11P has a configuration different from that of the solid-state image pickup element 11 of FIG. 1 in that it has a stacked structure similar to that of the solid-state image pickup element 11 of FIG. 1 and a case 29 having a light shielding property is formed on the side face side and the light reception face side. In other words, the solid-state image pickup element 11P is configured such that the side face of the solid-state image pickup element 11N is shielded against light by the case 29.

Since the solid-state image pickup element 11P having such a configuration as described above can block light irradiated from the side face, such light can be suppressed from having a bad influence on an image.

Figure 16:
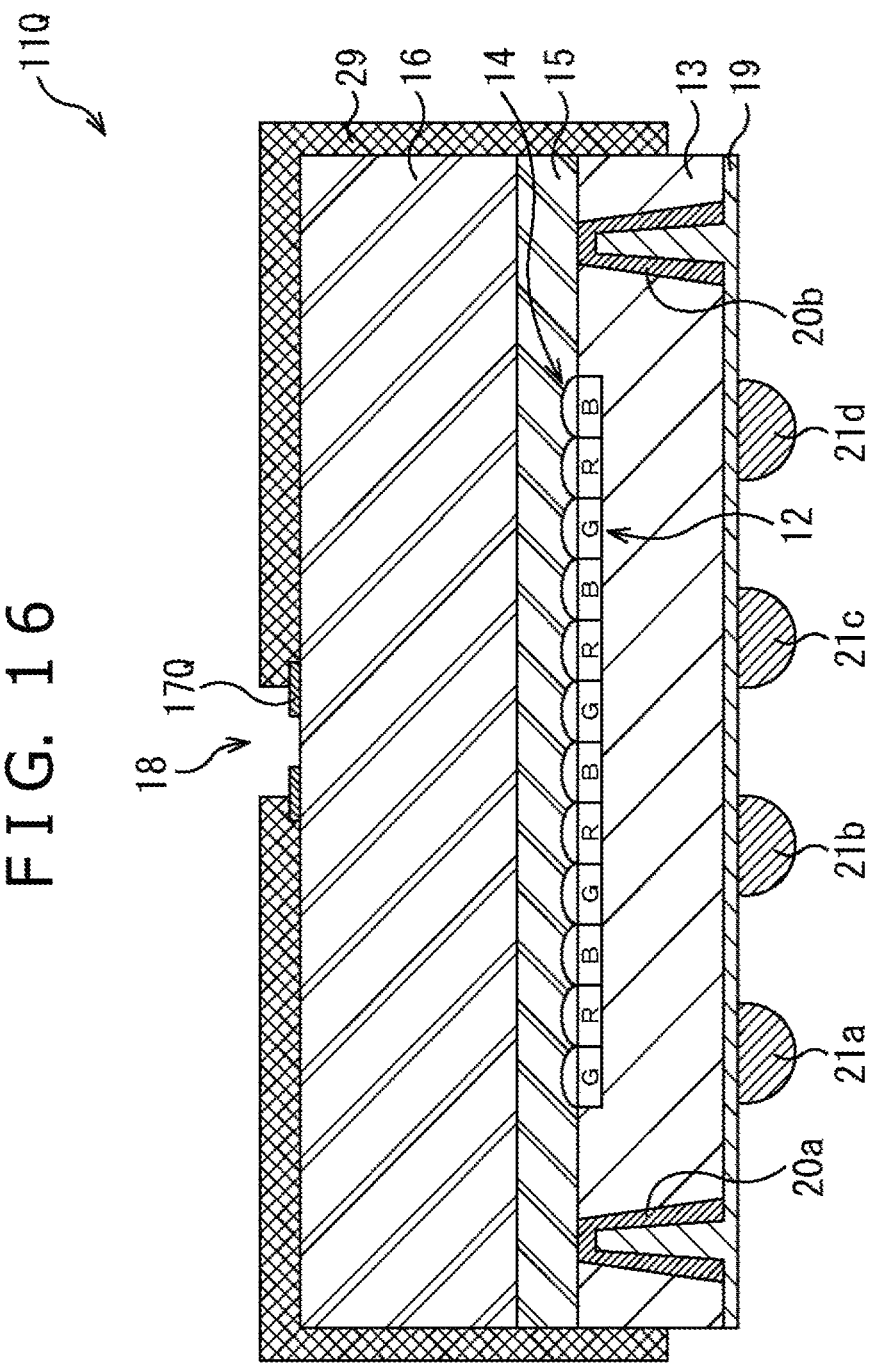
FIG. 16 is a view depicting an example of a configuration of a sixteenth embodiment of the solid-state image pickup element.

Next, FIG. 16 is a view depicting an example of a configuration of a sixteenth embodiment of a solid-state image pickup element. It is to be noted that, in a solid-state image pickup element 11Q depicted in FIG. 16, components common to those of the solid-state image pickup element 11 of FIG. 1 are denoted by like reference symbols, and detailed description of them is omitted.

As depicted in FIG. 16, similarly as in the solid-state image pickup element 11F of FIG. 7, in the solid-state image pickup element 11Q, a metal film 17Q stacked on a glass substrate 16 is formed so as to have an area smaller than that of the glass substrate 16. Further, the solid-state image pickup element 11Q has a configuration different from the solid-state image pickup element 11 of FIG. 1 in that a case 29 having a light shielding property is formed on the side face side and the upper face side thereof.

Since the solid-state image pickup element 11P having such a configuration as described above can block light irradiated from the side face and the upper face, such light can be suppressed from having a bad influence on an image.

Now, a first manufacturing method of the solid-state image pickup element 11 of FIG. 1 is described with reference to FIGS. 17 to 21. It is to be noted that, although the present technology can be applied to the solid-state image pickup element 11 of any of the surface type, rear face irradiation type and stacked type, in the following, the solid-state image pickup element 11 of the stacked type is described as a representative example.

Figure 17:
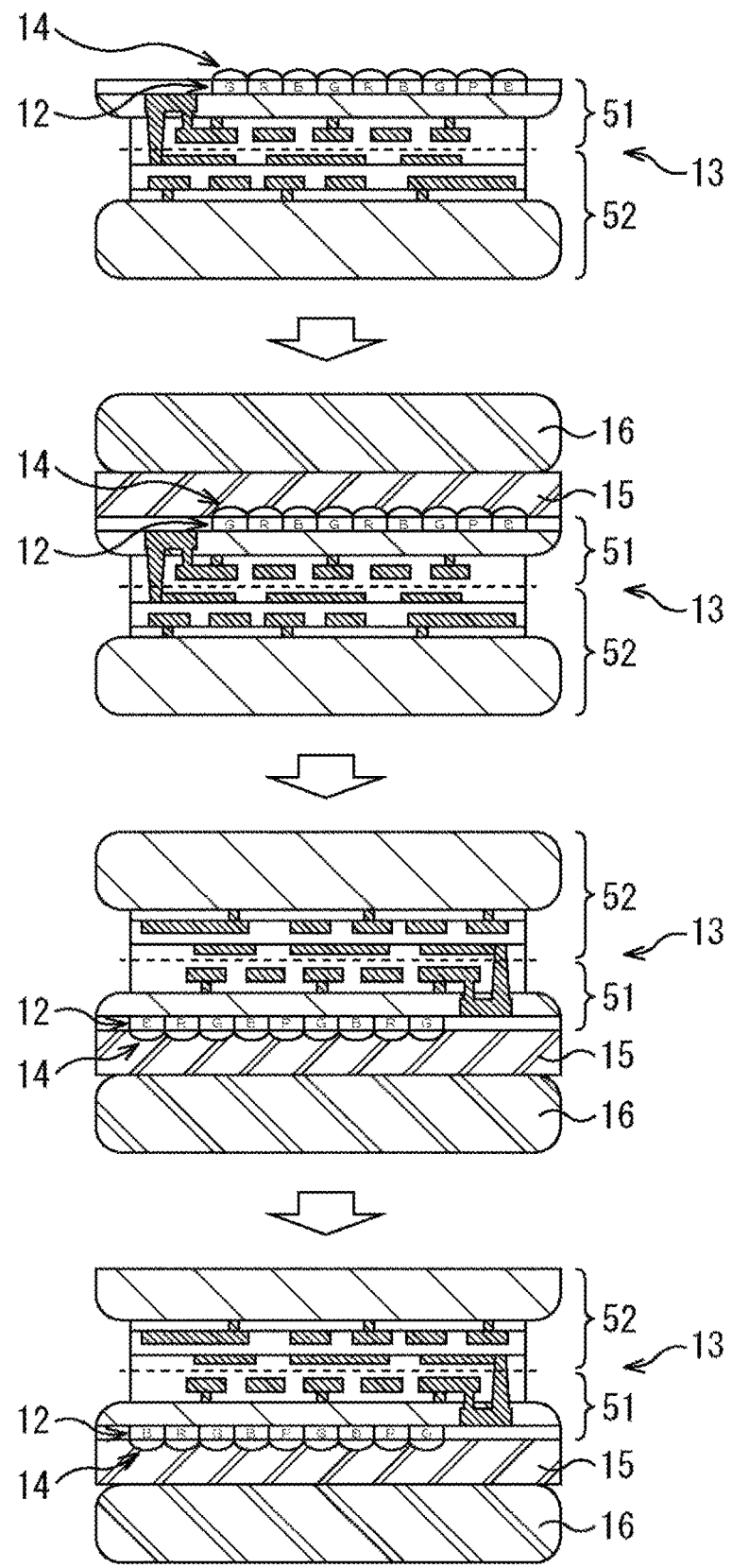
FIG. 17 is a view illustrating a first manufacturing method for the solid-state image pickup element.

As depicted at the first stage in FIG. 17, a semiconductor substrate 13 of the stacked type is produced which is configured such that a sensor substrate 51 in which a semiconductor layer having a pixel array 12 formed therein and a wiring layer are stacked and a logic substrate 52 in which a semiconductor layer having logic circuits formed therein and a wiring layer are stacked are electrically and mechanically joined together at the respective wiring layers thereof. It is to be noted that, in the following drawings, a broken line depicted in the semiconductor substrate 13 represents a joining plane between the sensor substrate 51 and the logic substrate 52.

First at the first step, an image pickup face side of the semiconductor substrate 13 and a glass substrate 16 of, for example, 500 μm thick are pasted together in a cavity-less structure by seal resin 15 as depicted at the second stage in FIG. 17.

Then at the second step, the semiconductor substrate 13 to which the glass substrate 16 is pasted through the seal resin 15 is reversed to direct the glass substrate 16 downwardly as depicted at the third stage in FIG. 17.

Thereafter, at the third step, thinning is performed for the semiconductor substrate at the logic substrate 52 side from the rear face side as depicted at the fourth stage of FIG. 17 to perform finishing to a thickness of not less than 50 μm (preferably to 100 μm).

Figure 18:
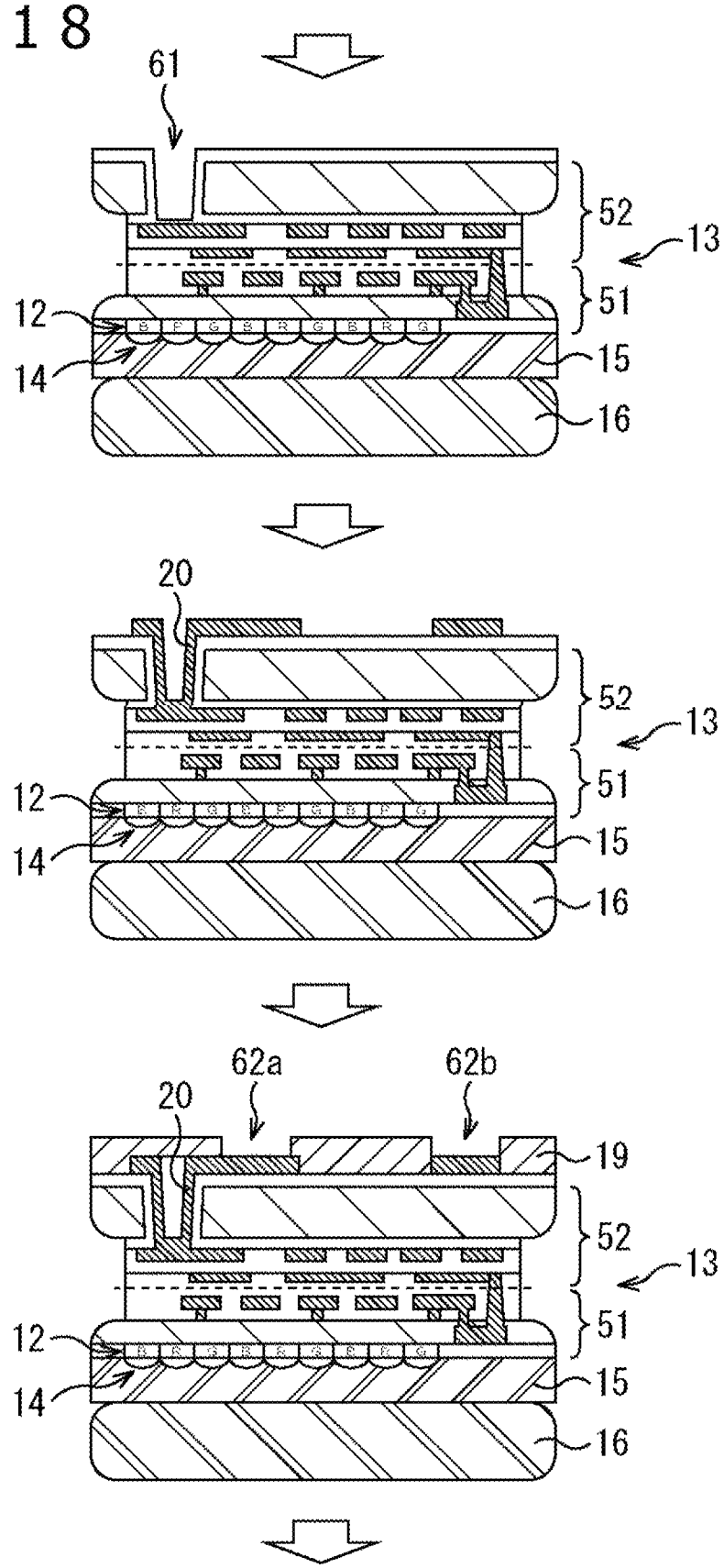
FIG. 18 is a view illustrating the first manufacturing method for the solid-state image pickup element.

Further, at the fourth step, a resist pattern for forming a silicon through-hole (TSV: through silicon via) is formed (for example, with φ65 μm) in the reversed state as depicted at the upper stage in FIG. 18, and a semiconductor layer of a logic substrate 52 is processed by a dry etching method. Consequently, a silicon through-hole 61 is formed. Then, in the reversed state, film formation is performed until an oxide film (SiO2) of not less than 200 nm is formed on a side face formed by processing silicon using a plasma CVD (Chemical Vapor Deposition) method.

Then, at the fifth step, the oxide film on the bottom face of the silicon through-hole 61 is removed by an etching back method to expose the copper wiring line of the logic substrate 52 as depicted at the middle stage of FIG. 18. Then, copper 400 nm is formed as a seed layer continuously to titanium 200 nm. On the copper, a resist pattern for rewiring (RDL: Redistribution Layer) is formed, and pattern plating for rewiring is performed by an electrolytic plating method, whereafter removal of the seed layer is performed by wet etching. Consequently, a through electrode 20 is formed in the silicon through-hole 61.

Thereafter, at the sixth step, an insulating film 19 is formed in order to protect the copper rewired line as depicted at the lower stage in FIG. 18, and besides land opening at which external terminals 21a and 21b are to be formed is performed. Consequently, openings 62a and 62b are formed.

Figure 19:
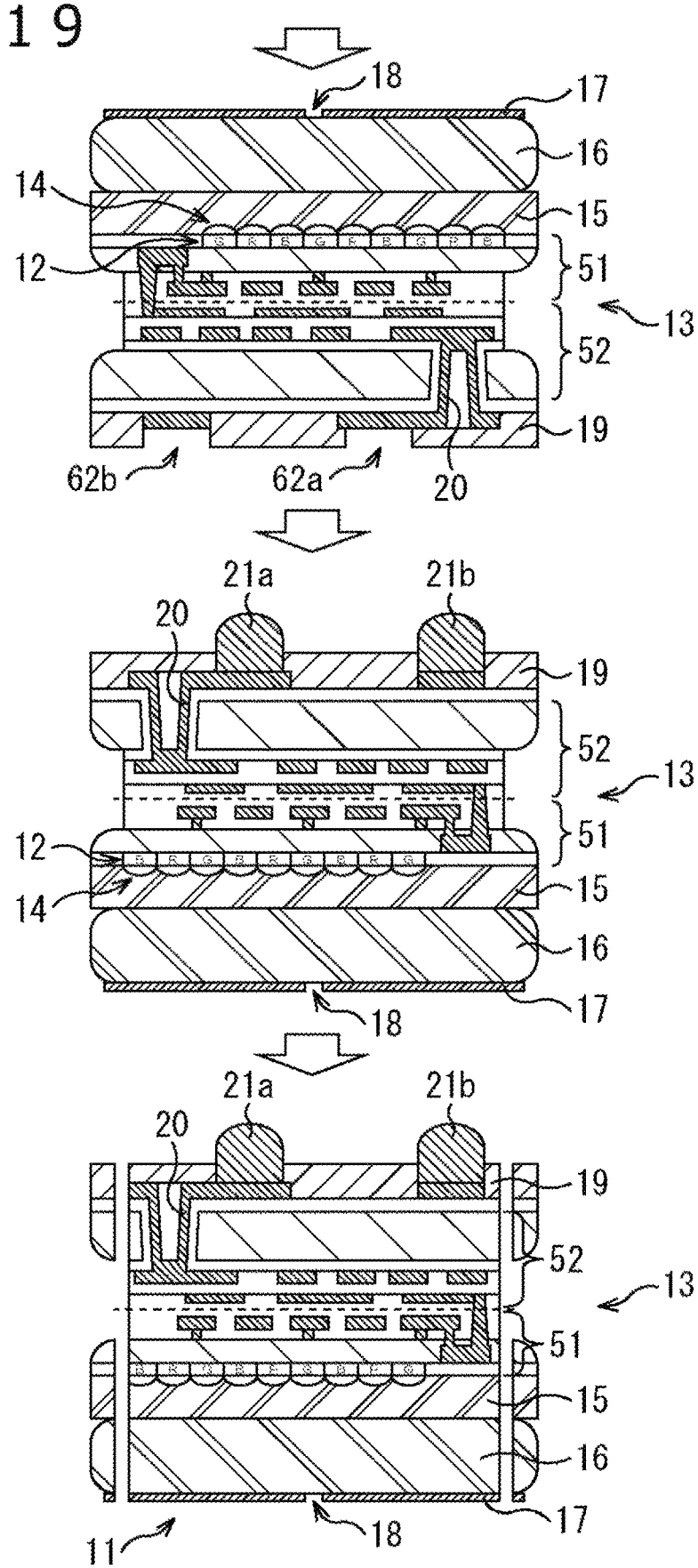
FIG. 19 is a view illustrating the first manufacturing method for the solid-state image pickup element.

Further, at the seventh step, as depicted at the upper stage of FIG. 19, the intermediate product is reversed to direct the glass substrate 16 upwardly and a metal film 17 is formed on the glass substrate 16 by a sputtering method. For example, where titanium is used for the metal film 17, the metal film 17 is formed with a thickness of 120 nm.

Here, as depicted in FIG. 20, an opening of not less than φ1 μm (for example, φ8 μm) is formed by a resist pattern 63, and the metal film 17 is processed to form a pinhole 18 by a dry etching method or the like, whereafter the resist pattern 63 is removed to form a glass substrate 16 with a pinhole 18. Alternatively, as depicted in FIG. 21, black resist 22 with a pinhole 18 having the pinhole 18 formed therein after a film of the black resist 22 is formed over an overall area of the glass substrate 16 may be used. Thereupon, the pinhole 18 is formed such that the pinhole diameter is not less than φ1 μm, for example, φ8 μm. It is to be noted that, after the external terminals 21 are formed, a step for forming a pinhole 18 as depicted in FIG. 20 or 21 may be provided.

Then at the eighth step, the intermediate product is reversed to direct the glass substrate 16 downwardly as depicted at the middle stage in FIG. 19, and terminals 21a and 21b are formed at the openings 62a and 62b of the insulating film 19, respectively.

Thereafter, at the ninth step, the intermediate product is cut into individual pieces by a cutting tool such as a blade to manufacture a solid-state image pickup element 11 as depicted at the lower stage in FIG. 19.

Now, a second manufacturing method of the solid-state image pickup element 11 of FIG. 1 is described with reference to FIGS. 22 to 24.

As depicted at the upper stage in FIG. 22, a semiconductor substrate 13 of the stacked type is produced which is configured such that a sensor substrate 51 in which a semiconductor layer having a pixel array 12 formed therein and a wiring layer are stacked and a logic substrate 52 in which a semiconductor layer having logic circuits formed therein and a wiring layer are stacked are electrically and mechanically joined together at the respective wiring layers thereof.

On the other hand, at the eleventh step, a glass substrate 16 with a pinhole 18 is formed as described hereinabove with reference to FIG. 20 separately from the semiconductor substrate 13. In particular, a metal film 17 is formed on a glass substrate 16 of 500 μm thick by a sputtering method. For example, where titanium is used for the metal film 17, the metal film 17 is formed with a thickness of 120 nm. Then, an opening of not less than φ1 μm (for example, φ8 μm) is formed by a resist pattern 63, and the metal film 17 is processed to form a pinhole 18 by a dry etching method or the like, whereafter the resist pattern 63 is removed.

Then at the twelfth step, the image pickup face side of the semiconductor substrate 13 and the glass substrate 16 at the side at which the pinhole 18 is not formed are pasted together in a cavity-less structure by the seal resin 15 as depicted at the middle stage in FIG. 22.

Thereafter, at the thirteenth step, the semiconductor substrate 13 to which the glass plate 16 is pasted through the seal resin 15 is reversed to direct the glass substrate 16 downwardly as depicted at the lower stage in FIG. 22.

Figure 23:
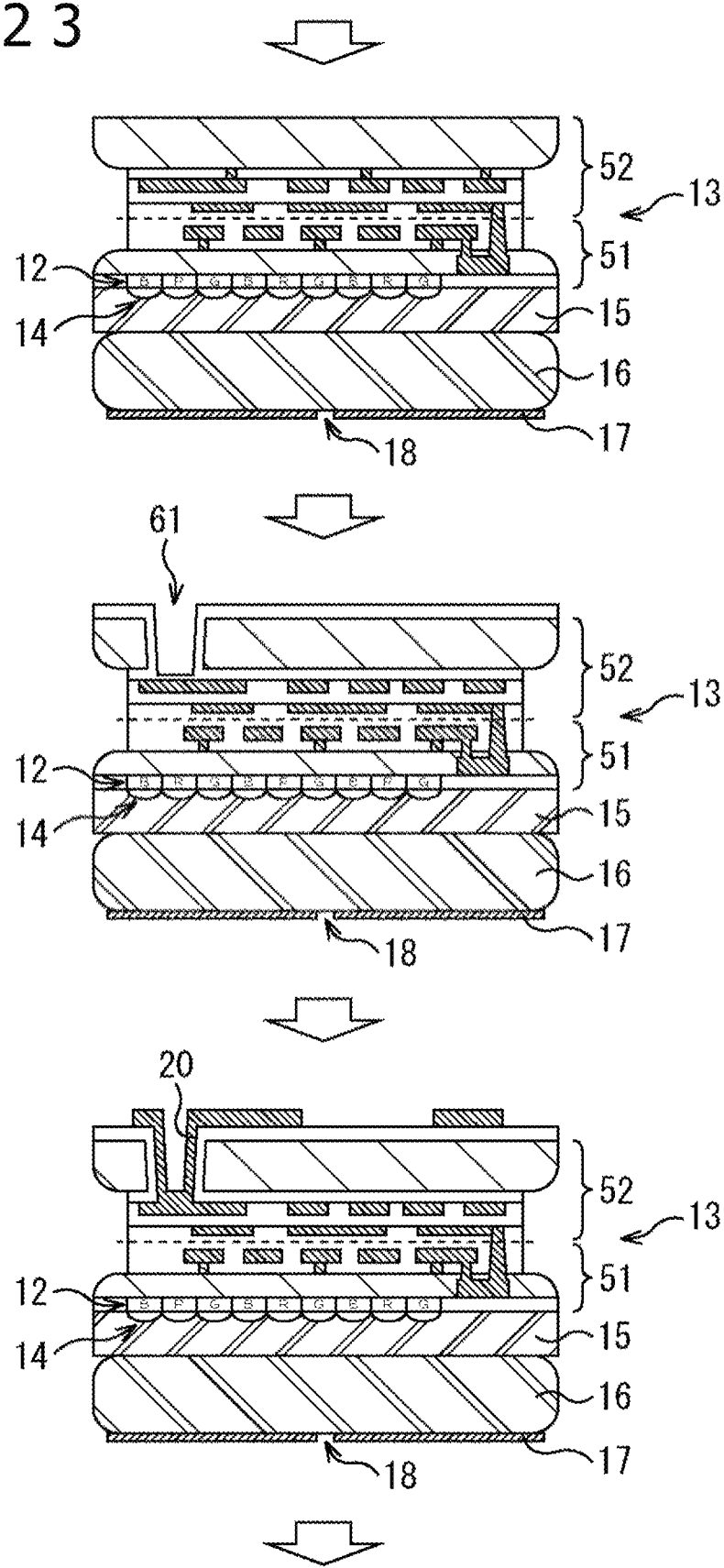
FIG. 23 is a view illustrating the second manufacturing method for the solid-state image pickup element.

Further, at the fourteenth step, as depicted at the upper stage in FIG. 23, thinning is performed for the semiconductor substrate at the logic substrate 52 side from the rear face side to perform finishing to a thickness of not less than 50 μm (preferably, 100 μm).

Further, at the fifteenth step, a resist pattern for forming a silicon through-hole (TSV: through silicon via) is formed (for example, with φ65 μm) in the reversed state as depicted at the middle stage in FIG. 23, and the semiconductor layer of the logic substrate 52 is processed by a dry etching method. Consequently, a silicon through-hole 61 is formed. Then, in the reversed state, film formation is performed until the formation of an oxide film (SiO2) of not less than 200 nm on a side face formed by processing silicon using a plasma CVD (Chemical Vapor Deposition) method.

Then, at the sixteenth step, the oxide film on the bottom face of the silicon through-hole 61 is removed by an etching back method to expose copper wiring lines of the logic substrate 52 as depicted at the lower stage in FIG. 23. Then, copper 400 nm is formed as a seed layer continuously to titanium 200 nm. On the copper, a resist pattern for rewiring (RDL: Redistribution Layer) is formed, and pattern plating for rewiring is performed by an electrolytic plating method, whereafter removal of the seed layer is performed by wet etching. Consequently, a through electrode 20 is formed in the silicon through-hole 61.

Figure 24:
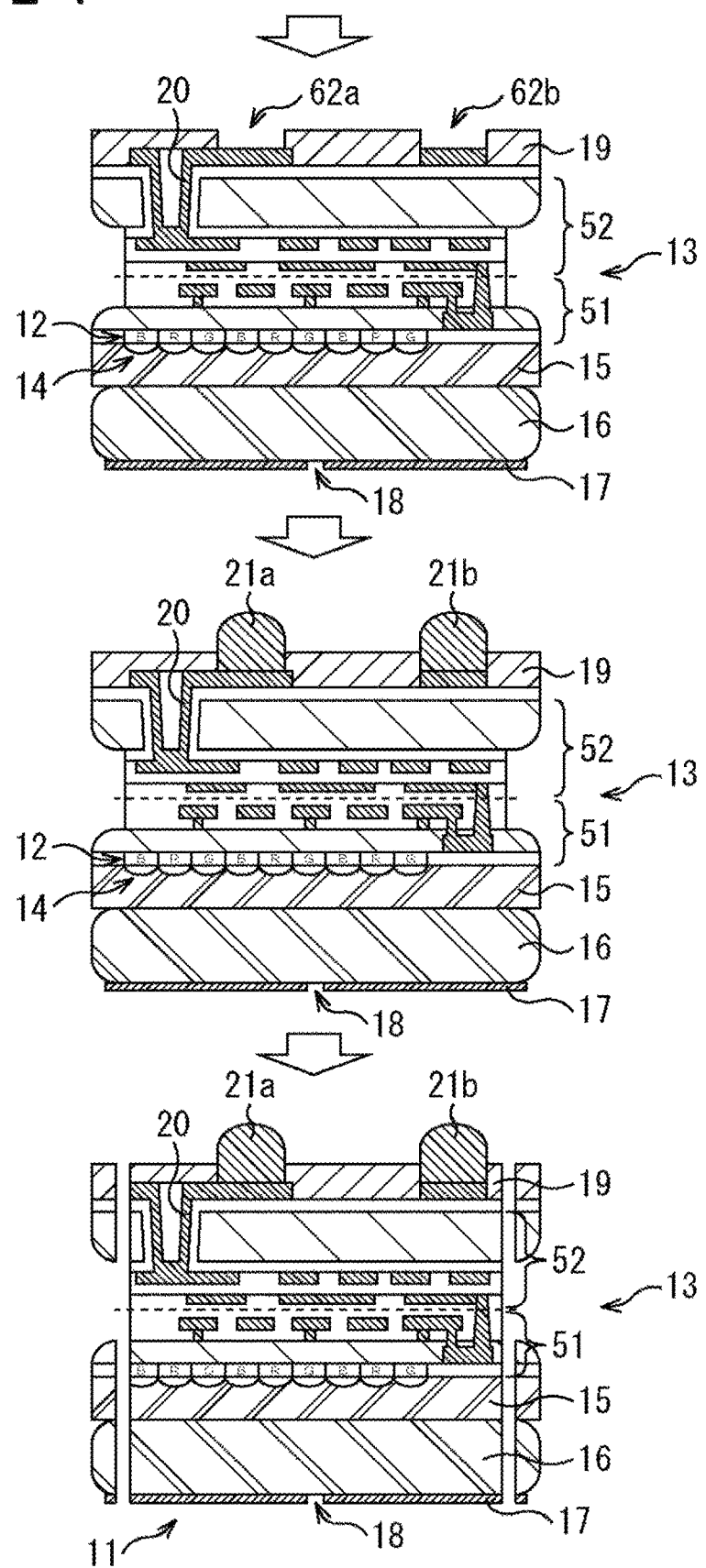
FIG. 24 is a view illustrating the second manufacturing method for the solid-state image pickup element.

Thereafter, at the seventeenth step, an insulating film 19 is formed in order to protect the copper rewired lines as depicted at the upper stage in FIG. 24, and besides land opening at locations at which external terminals 21a and 21b are to be formed is performed. Consequently, openings 62a and 62b are formed.

Then at the eighteenth step, external terminals 21a and 21b are formed at the openings 62a and 62b of the insulating film 19, respectively, as depicted at the middle stage in FIG. 24.

Thereafter at the nineteenth step, the intermediate product is cut into individual pieces by a cutting tool such as a blade to manufacture solid-state image pickup elements 11 as depicted at the lower stage in FIG. 24.

Now, a manufacturing method of the solid-state image pickup element 11A of FIG. 2 is described with reference to FIG. 25.

As depicted at the upper stage in FIG. 25, a semiconductor substrate 13 of the stacked type is produced which is configured such that a sensor substrate 51 in which a semiconductor layer having a pixel array 12 formed therein and a wiring layer are stacked and a logic substrate 52 in which a semiconductor layer having logic circuits formed therein and a wiring layer are stacked are electrically and mechanically joined together at the respective wiring layers thereof.

On the other hand, at the 21st step, a glass substrate 16 with a pinhole 18 is formed as described hereinabove with reference to FIG. 20 separately from the semiconductor substrate 13.

Then at the 22nd step, the image pickup face side of the solid-state image pickup element 11A of the stacked type and the glass substrate 16 at the side at which the pinhole 18 is formed are pasted together in a cavity-less structure by the seal resin 15 as depicted at the lower stage in FIG. 25.

Thereafter, after the glass substrate 16 is pasted to the semiconductor substrate 13 in this manner, steps similar to the thirteenth to nineteenth steps described hereinabove are performed to manufacture a solid-state image pickup element 11A.

Now, a formation method of the glass substrate 16 with the pinhole 18 in the solid-state image pickup element 11E of FIG. 6 is described with reference to FIGS. 26 and 27.

Figure 26:
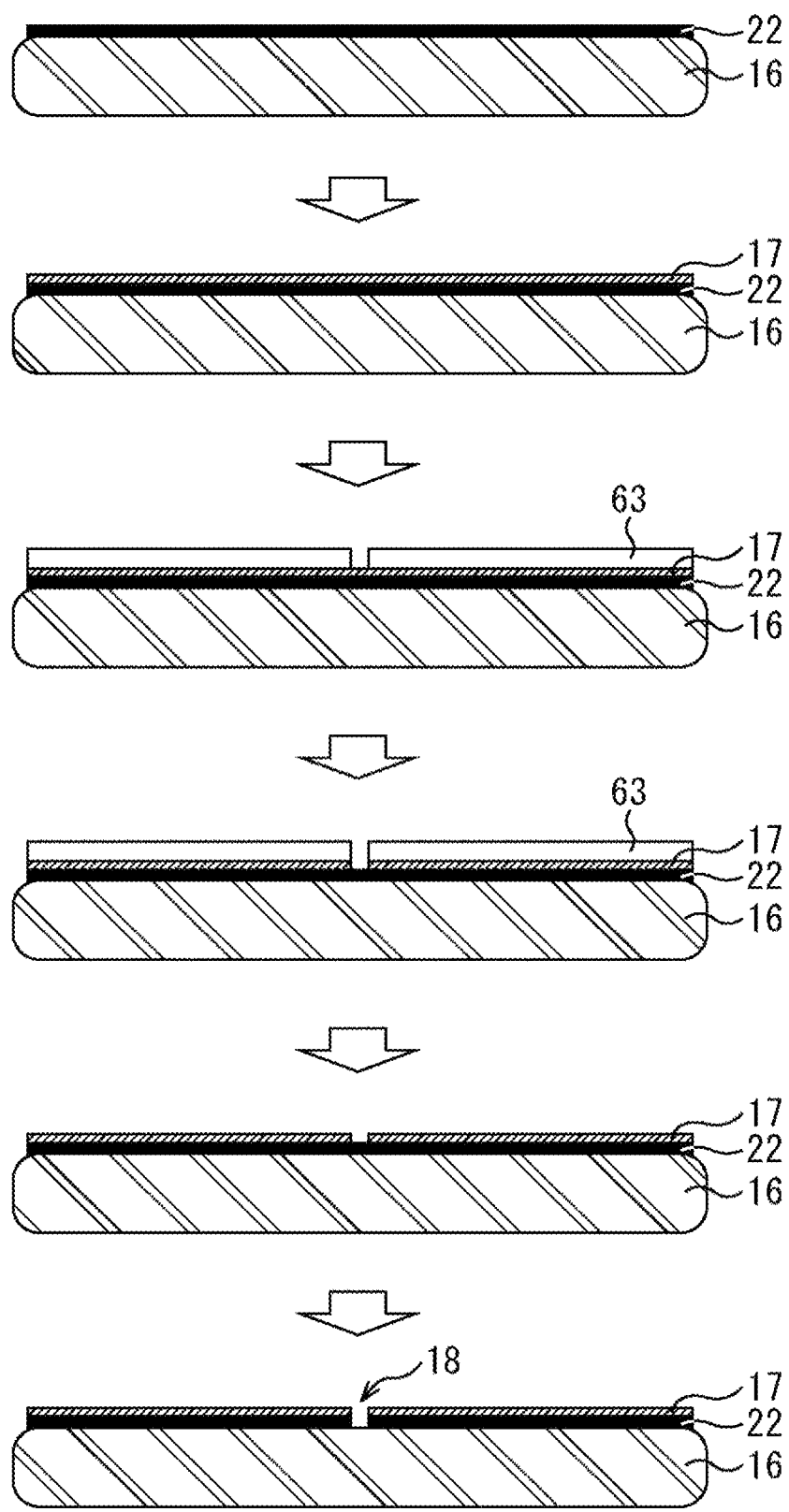
FIG. 26 is a view illustrating a formation method for a glass substrate with a pinhole.

First, at the 31st step, a film of black resist 22 is formed with a thickness of, for example, 1.0 µm over an overall area of a glass substrate 16 of a thickness of, for example, 500 µm as depicted at the first stage in FIG. 26.

Further, at the 32nd step, a metal film 17 is formed as an upper layer of the black resist 22 by a sputtering method as depicted at the second stage in FIG. 26. For example, where titanium is used for the metal film 17, the metal film 17 is formed with a thickness of 120 nm.

Then at the 33rd step, an opening of not less than φ1 µm (for example, φ8 µm) is formed by a resist pattern 63 as depicted at the third stage in FIG. 26.

Then, at the 34th step, the metal film 17 is processed to form a pinhole 18 by a dry etching method or the like as depicted at the fourth stage in FIG. 26.

Thereafter, at the 35th step, the resist pattern 63 is removed by stripping solution or the like as depicted at the fifth stage of FIG. 26.

Then at the 36th step, the pinhole 18 of the metal film 17 is used as a mask to open the black resist 22 by a dry etching method or the like as depicted at the sixth stage in FIG. 26.

Figure 27:
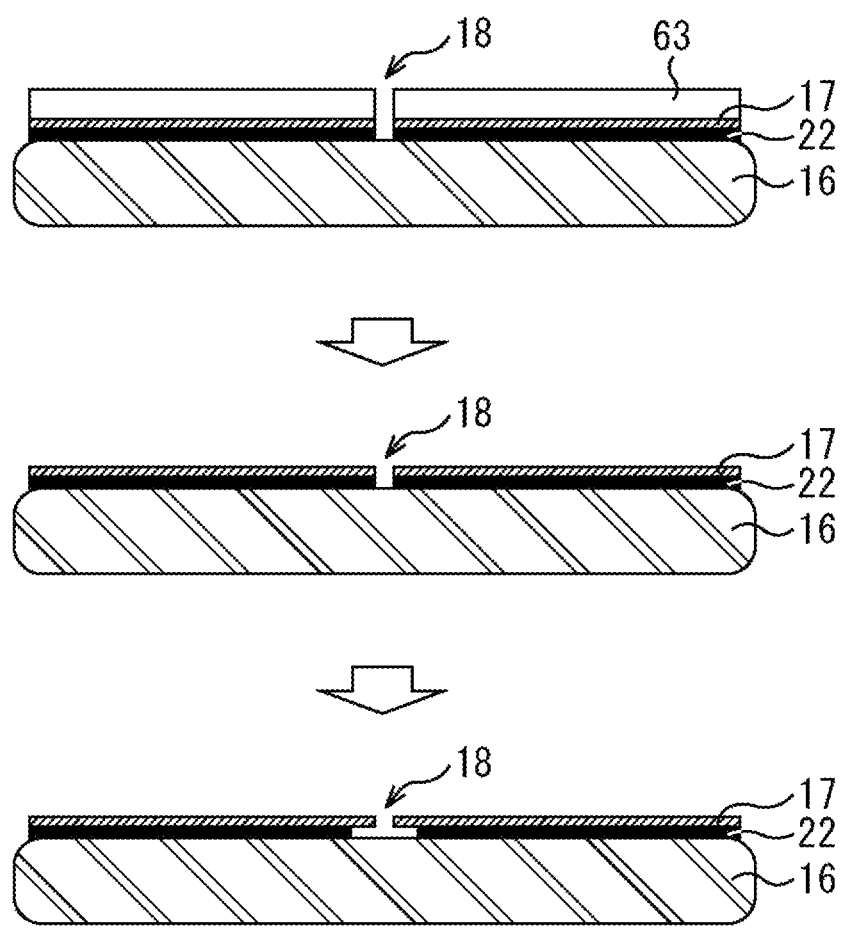
FIG. 27 is a view illustrating the formation method for a glass substrate with a pinhole.

It is to be noted that, for example, the resist pattern 63 may not be removed at the 35th step, but the black resist 22 may be opened as depicted at the first stage in FIG. 27 at the 37th step after the 34th step.

Then, at the 38th step, the resist pattern 63 is removed by stripping solution or the like as depicted at the second stage in FIG. 27.

Further, at the 36th step or the 38th step, the black resist 22 is opened, and at the 39th step, the black resist 22 of a lower layer of the metal film 17 is retracted to form an opening having a diameter greater than that of the pinhole 18 of the metal film 17 as depicted at the third stage in FIG. 27.

By forming the black resist 22 just above the glass substrate 16 in this manner, a ray when light incident through the pinhole 18 is reflected by the image pickup face can be absorbed by the black resist 22, and, for example, appearance of a ghost can be suppressed.

Now, a formation method of the glass substrate 16 with the pinhole 18 in the solid-state image pickup element 11G of FIG. 8 is described with reference to FIG. 28.

Figure 28:
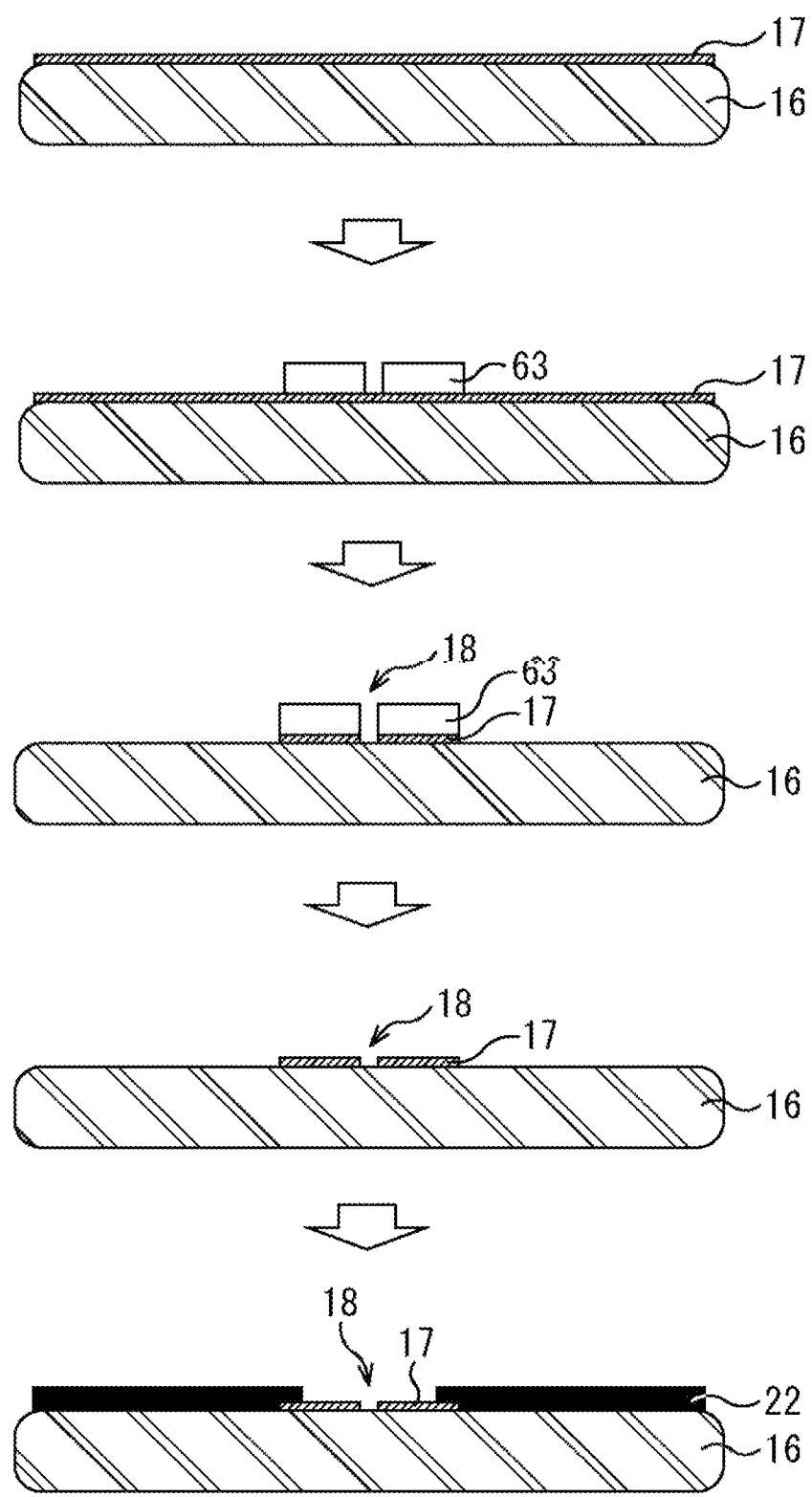
FIG. 28 is a view illustrating the formation method for a glass substrate with a pinhole.

First, at the 41st step, a metal film 17 is formed over an overall area of a glass substrate 16 of a thickness of, for example, 500 µm as depicted at the first stage in FIG. 28. For example, where titanium is used for the metal film 17, the metal film 17 is formed with a thickness of 120 nm.

Further, at the 42nd step, an aperture for a pinhole 18 is formed by a resist pattern 63 as depicted at the second stage in FIG. 28. Thereupon, an opening of not less than φ1 µm (for example, φ8 µm) corresponding to the pinhole 18 is formed, and the resist pattern 63 is formed by removing, leaving a portion of a width of not less than 1 µm on the outer side of the pinhole 18 diameter, the other part (except necessary pattern formation such as a fit mark).

Then at the 43rd step, the metal film 17 is processed to form a pinhole 18 by a dry etching method or the like as depicted at the third stage in FIG. 28.

Further, at the 44th step, the resist pattern 63 is removed to form a glass substrate 16 with a pinhole 18 as depicted at the fourth stage in FIG. 28.

Thereafter, in order to prevent a ray from the upper face of the glass substrate 16 other than the pinhole 18 from entering the solid-state image pickup element 11G, at the 45th step, photosensitive black resist 22 is formed on the upper face of the pinhole to block light from the upper face as depicted at the fifth stage of FIG. 28. At this time, the opening diameter of the black resist 22 is preferably set greater than the pinhole 18.

It is to be noted that the formation of the black resist 22 may be performed before the semiconductor substrate 13 and the glass substrate 16 with the pinhole 18 are connected to each other or may be performed after the semiconductor substrate 13 and the glass substrate 16 are joined together.

Now, a formation method of the glass substrate 16 with the pinhole 18 according to a first modification is described with reference to FIG. 29.

Figure 29:
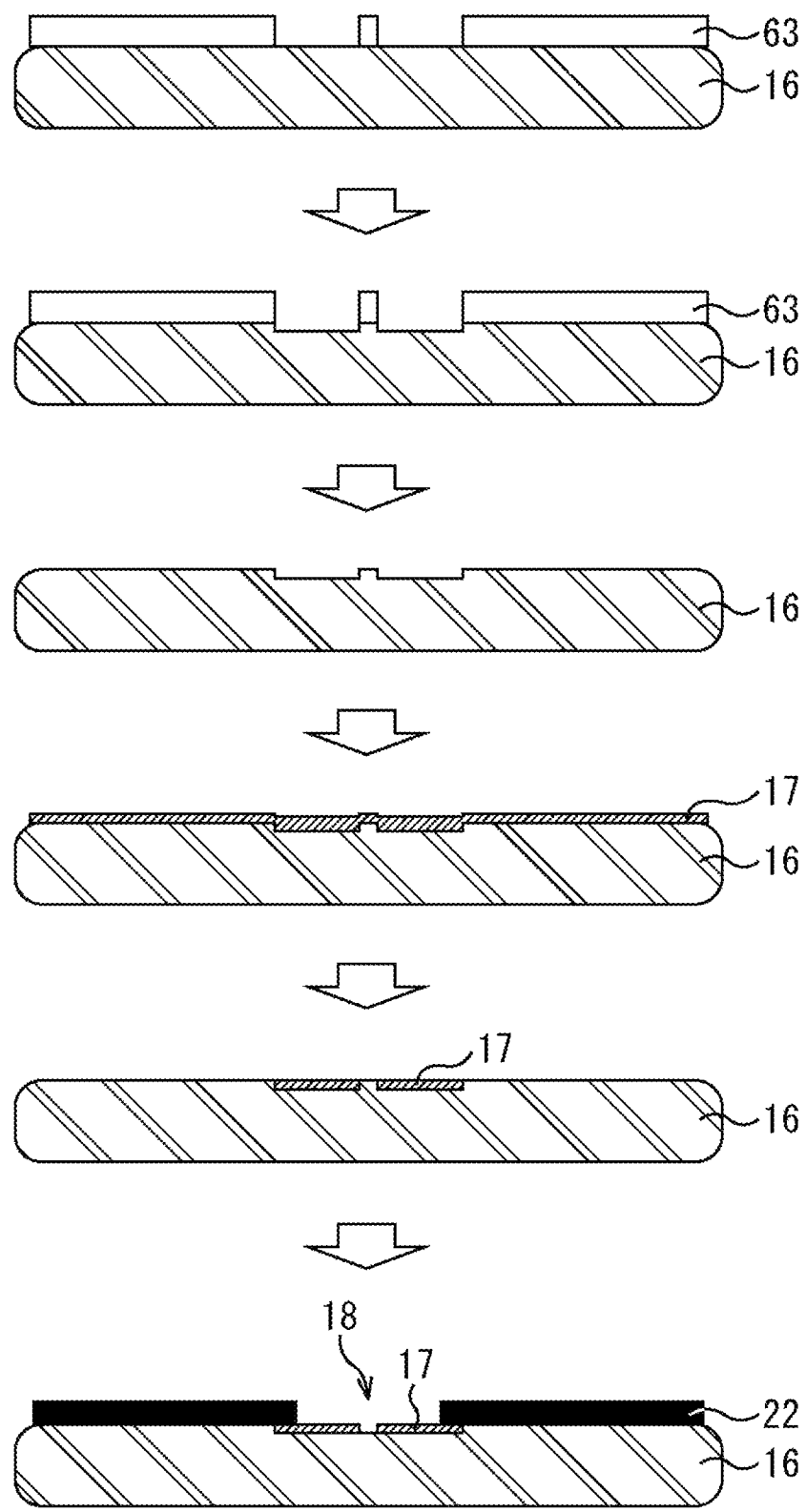
FIG. 29 is a view illustrating a formation method of a first modification to a glass substrate with a pinhole.

First at the 51st step, an aperture for a pinhole 18 is formed by a resist pattern 63 on a glass substrate 16 of, for example, 500 µm thick as depicted at the first stage of FIG. 29. Thereupon, an opening of not less than φ1 µm (for example, φ8 µm) corresponding to the pinhole 18 is formed, and the resist pattern 63 is formed by removing, leaving a portion of a width of not less than 1 µm on the outer side of the pinhole 18 diameter, the other part (except necessary pattern formation such as a fit mark).

Then at the 52nd step, a groove of, for example, 200 nm deep is formed by oxide film dry etching as depicted at the second stage of FIG. 29.

Further, at the 53rd step, the resist pattern 63 is removed as depicted at the third stage in FIG. 29.

Thereafter, at the 54th step, a metal film 17 is formed by a sputtering method as depicted at the fourth stage in FIG. 29. For example, where tantalum is used for the metal film 17, the metal film 17 is formed with a thickness of 250 nm.

Then at the 55th step, the unnecessary metal film 17 on the glass substrate 16 (field) is removed by a CMP (Chemical Mechanical Polishing) method to form a glass substrate 16 with a pinhole 18 as depicted at the fifth stage in FIG. 29.

Thereafter, in order to prevent a ray from entering from the upper face of the glass substrate 16 other than the pinhole 18, at the 56th step, photosensitive black resist is formed on the upper face of the pin hold to block light from the upper face as depicted at the sixth stage in FIG. 29. At this time, preferably the opening diameter of the black resist 22 is made greater than the pinhole 18.

It is to be noted that the formation of the black resist 22 may be performed before the semiconductor substrate 13 and the glass substrate 16 with the pinhole 18 are connected to each other or may be performed after the semiconductor substrate 13 and the glass substrate 16 are joined together.

It is to be noted that, for example, the dry etching depth at the 52nd step may be processed deeper than the film thickness of the metal film 17 such that the metal film 17 is arranged at a position lower than the position of the surface of the glass substrate 16.

Figure 30:
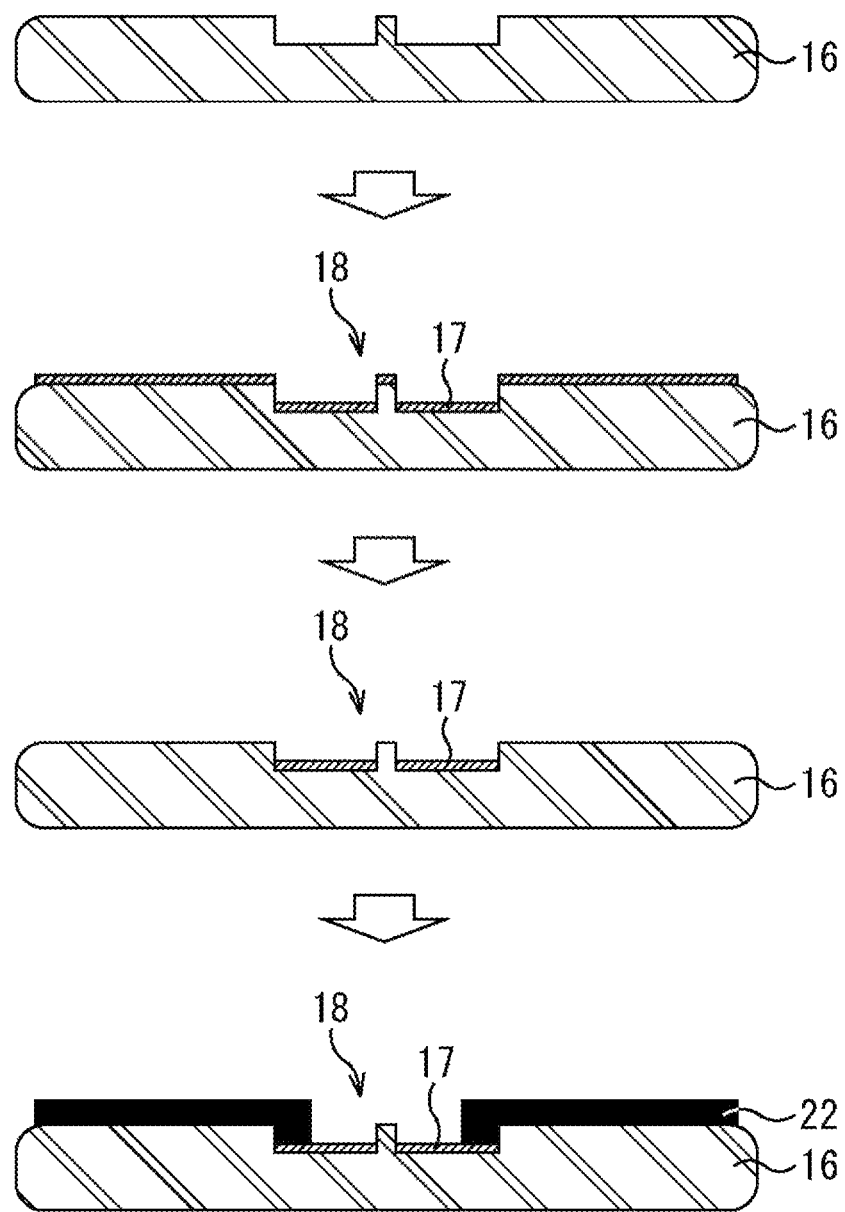
FIG. 30 is a view illustrating a formation method of a different example of the first modification to the glass substrate with a pinhole.

In particular, at the 61st step after the 51st step, the glass substrate 16 is dry etched to remove the resist pattern 63 so as to become deeper than the film thickness of the metal film 17 as depicted at the first stage of FIG. 30. Then at the 62nd step, a metal film 17 is formed by a sputtering method as depicted at the second stage of FIG. 30 and the unnecessary metal film 17 (on the field) is removed by a CMP method to form a glass substrate 16 with a pinhole 18 as depicted at the third stage of FIG. 30 at the 63rd step. Further, at the 64th step, black resist 22 is formed to block light from the upper face as depicted at the fourth stage in FIG. 30.

Now, a formation method of the glass substrate 16 with the pinhole 18 according to a second modification is described with reference to FIG. 31.

As depicted at the first to fifth stages in FIG. 31, at the 71st to 75th steps, a glass substrate 16 is dry etched so as to be deeper than the film thickness of a metal film 17 to form a glass substrate 16 with a pinhole 18 in which the metal film 17 is arranged at a position lower than the position of the surface of the glass substrate 16 as described hereinabove with reference to FIGS. 29 and 30.

Figure 31:
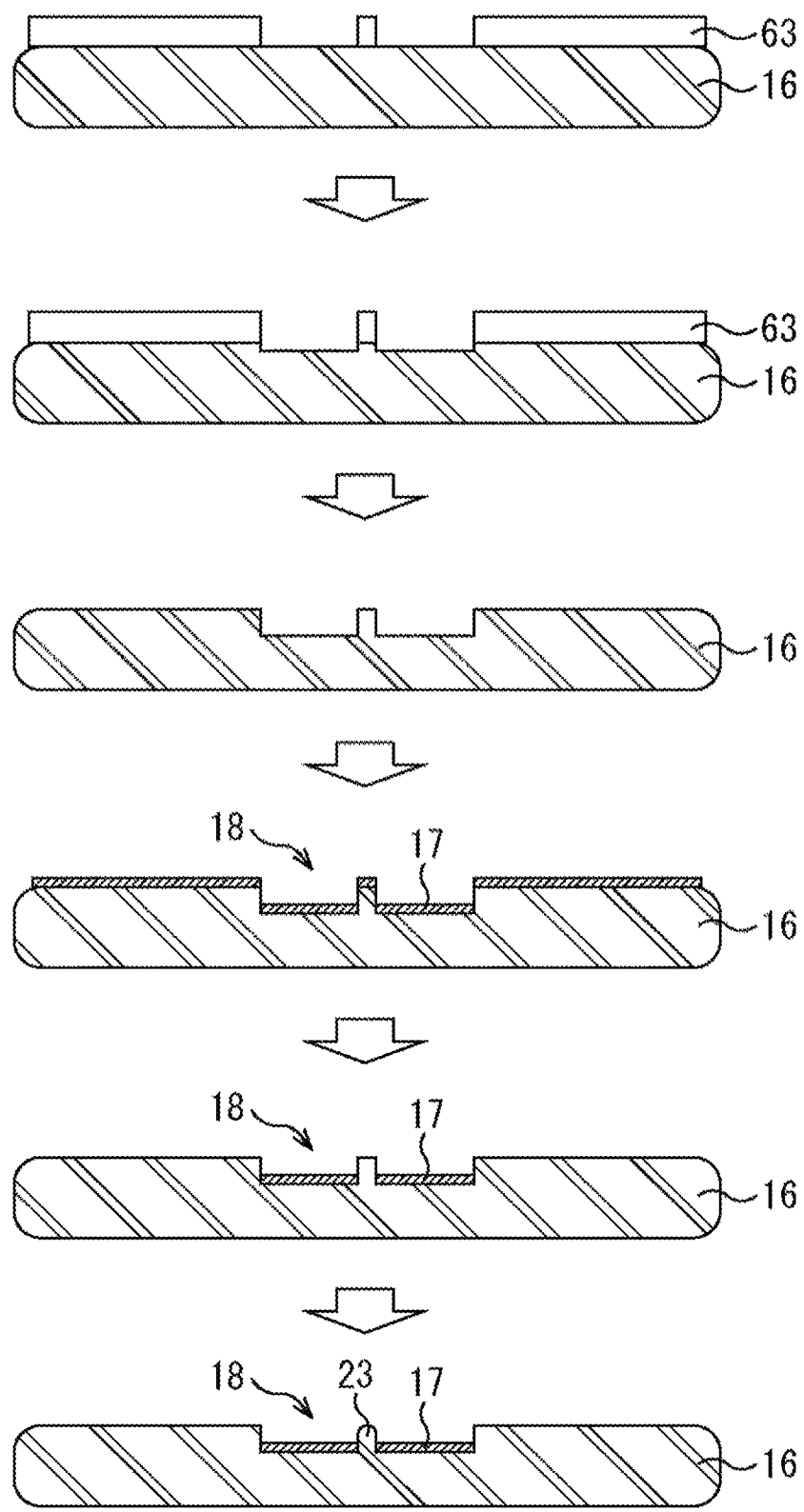
FIG. 31 is a view illustrating a formation method of a second modification to the glass substrate with a pinhole.

Then at the 76th step, a portion of the glass substrate 16 projecting from the pinhole 18 is etched back to form a waveguide 23 such that the angle of an upper end portion thereof is rounded as depicted at the sixth stage in FIG. 31. In this manner, an end portion of the waveguide 23 can be formed in a lens shape.

Figure 32:
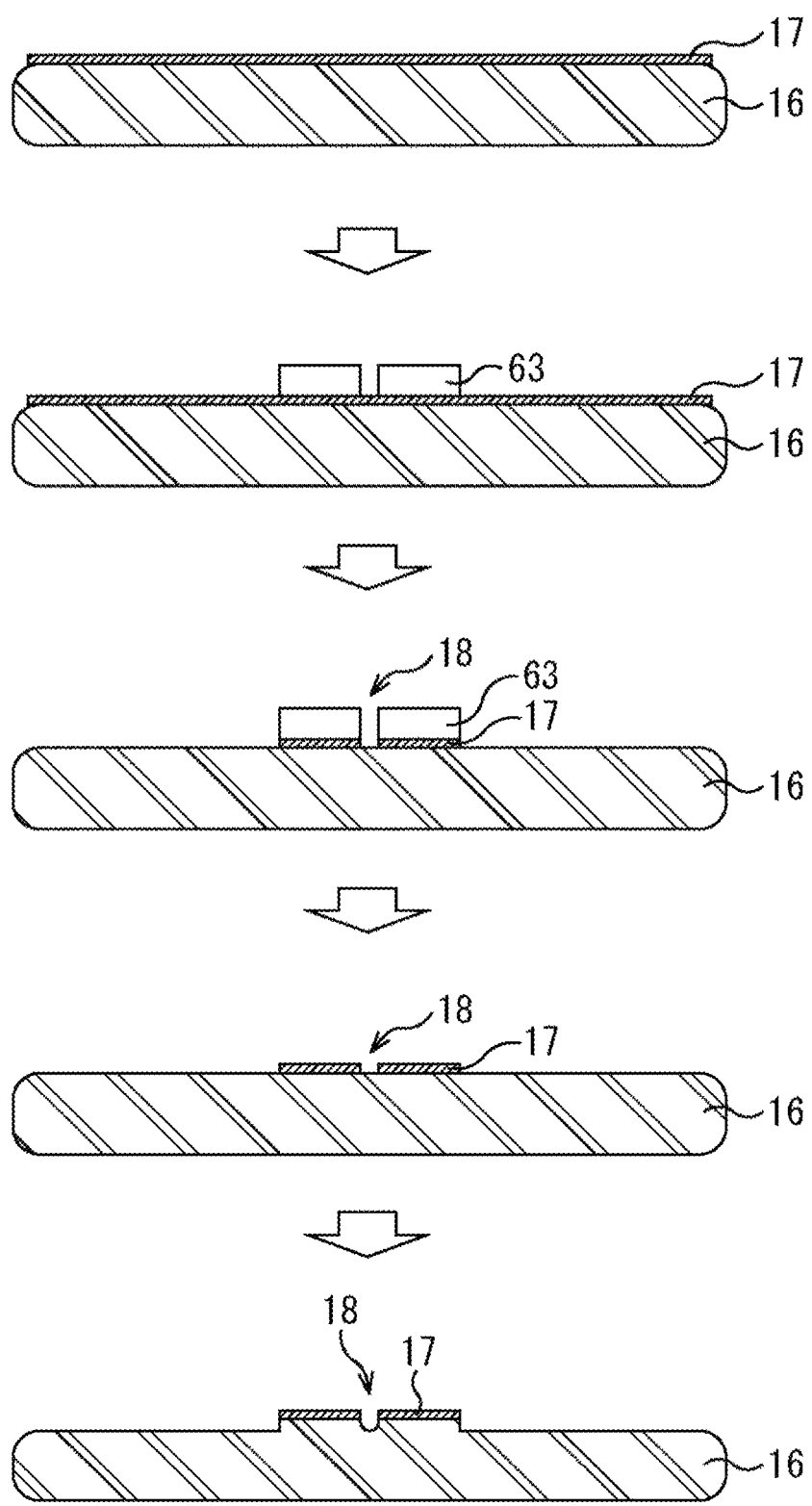
FIG. 32 is a view illustrating a formation method of a third modification to the glass substrate with a pinhole.

Now, a formation method of the glass substrate 16 with the pinhole 18 according to a third modification is described with reference to FIG. 32.

As depicted at the first to fourth stages in FIG. 32, at the 81st to 84th steps, a glass substrate 16 with a pinhole 18 is formed similarly as at the 41st to 44th steps described hereinabove with reference to FIG. 28.

Thereafter, at the 85th step, by performing wet etching using hydrogen fluoride water using the pinhole 18 as a mask, a concave lens can be formed below the pinhole as depicted at the fifth stage in FIG. 32.

It is to be noted that, although it is necessary to control the opening diameter of the etching mask for adjusting the sag amount of the concave lens, control of the opening diameter of the metal film 17 may otherwise be applied.

Figure 33:
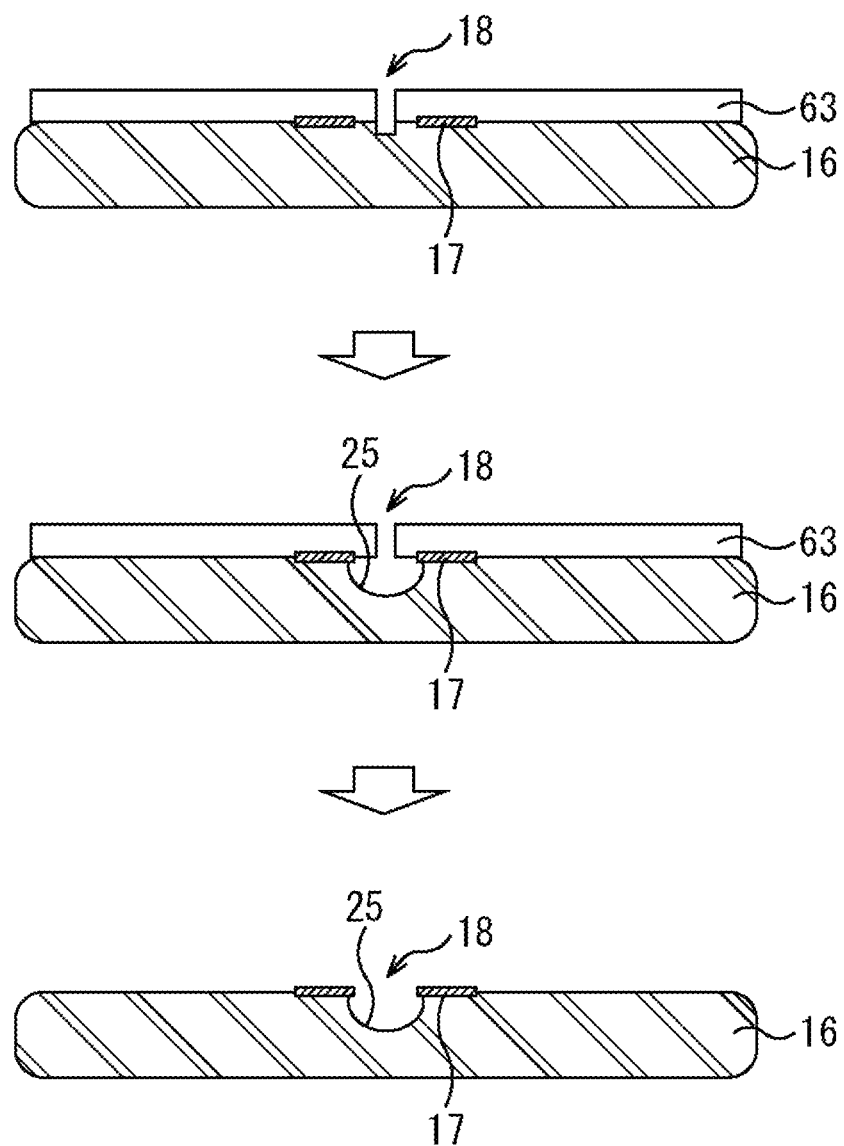
FIG. 33 is a view illustrating a formation method of a different example of the third modification to the glass substrate with a pinhole.

For example, separately from the pinhole 18 of the metal film 17, the opening diameter may be controlled using a resist pattern 63 as depicted in FIG. 33. It is to be noted that, since, in wet etching, the etching proceeds isotropically, by controlling the mask opening diameter, various lenses can be formed, for example, in addition to the concave shape portion 25 of the solid-state image pickup element 11K of FIG. 11.

It is to be noted that, by applying black ink for blocking light to the glass substrate 16 with the pinhole 18 indicated in the configuration example described above and a glass substrate 16 and the seal resin 15 of a WCSP in which a pinhole 18 is formed or by covering them with a housing of black plastic, the solid-state image pickup element 11 functions as a pinhole camera. It is to be noted that, even if a method other than the method described above is applied, only it is necessary to block light such that light may not enter the inside of the solid-state image pickup element 11 through any other than the pinhole 18, and the method is not restricted.

By manufacturing the solid-state image pickup element 11 (semiconductor package) in such a manner as described above, an unprecedented overwhelming low profile (for example, not more than 1 mm) can be achieved by forming the pinhole 18 directly on the glass substrate 16 of the WCSP.

Further, also it is possible to form a plurality of solid-state image pickup elements 11, in which a pinhole 18 is formed, at the same time. Further, by adjusting the cutting position by a dicing sew, not only a solid-state image pickup element 11 having a single pinhole 18 can be formed, but also a solid-state image pickup element 11 (compound eyes) having a plurality of pinholes 18 can be implemented.

Furthermore, by using a cavity-less structure in which no cavity (air layer) is provided in the glass substrate 16 and the semiconductor substrate 13, even if a ray entering from the glass substrate 16 side past the pinhole 18 is shallow, the refractive index difference between the glass substrate 16 and the seal resin 15 is small and diffraction and reflection are suppressed from occurring. Therefore, improvement in the angle of field and ambient dimming is anticipated.

Then, by forming a convex lens on the upper face of the pinhole 18 or forming a concave lens in a lower layer of the pinhole 18, it is possible to improve the light condensation characteristic and suppress degradation of the resolution by a diffraction phenomenon at an aperture location. Furthermore, it becomes possible to make the diameter of the pinhole 18 smaller than that in an alternative configuration in which no lens is provided, and improvement of the resolution can be implemented.

Further, by providing, as a substrate having a pinhole 18, a metal film 17 on a glass substrate 16 and forming a pinhole 18 in the metal film 17, it becomes possible to form a pinhole 18, for example, of a diameter of a few μm level. Consequently, a solid-state image pickup element 11 of a wide angle of view can be implemented by suppressing the aspect ratio of the pinhole 18 low.

Figure 34:
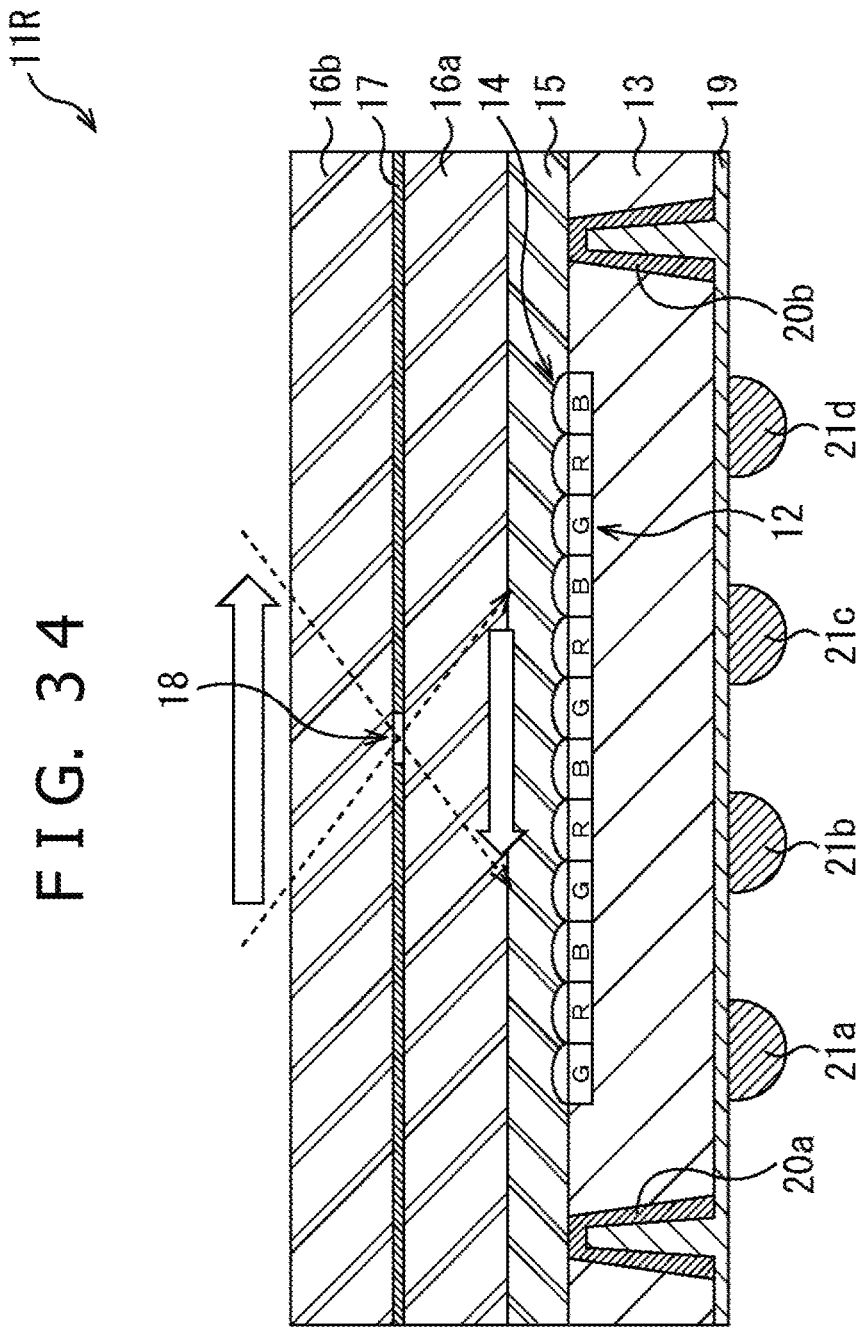
FIG. 34 is a view depicting an example of a configuration of a seventeenth embodiment of the solid-state image pickup element.

Next, FIG. 34 is a view depicting an example of a configuration of a solid-state image pickup element according to a seventeenth embodiment. It is to be noted that, in a solid-stage image pickup element 11R depicted in FIG. 34, components common to those of the solid-state image pickup element 11 of FIG. 1 are denoted by like reference symbols, and detailed description of them is omitted.

As depicted in FIG. 34, the solid-stage image pickup element 11R is different in configuration from the solid-state image pickup element 11 of FIG. 1 in that a metal film 17 having a pinhole 18 formed therein is provided between two glass substrates 16a and 16b. In particular, in the solid-stage image pickup element 11R, a protective substrate has a two layer structure configured at least from the glass substrates 16a and 16b, and the glass substrate 16a, metal film 17 and glass substrate 16b are stacked in order from a semiconductor substrate 13 side.

Further, in the solid-stage image pickup element 11R, the pinhole 18 has a cavity structure (hollow structure) in which no material is embedded therein. It is to be noted that the pinhole 18 may otherwise has a cavity-less structure (solid structure) in which such a transparent material such as transparent adhesive resin 71 (FIG. 42) or a glass adhesive layer 72 (FIG. 43) as hereinafter described is embedded.

Further, in the solid-stage image pickup element 11R, the height from a light reception face of the semiconductor substrate 13 to the metal film 17, namely, the sum in thickness of the seal resin 15 and the glass substrate 16a, is preferably set to a value higher than a value determined from the product of the distance one half the diagonal of the pixel array 12 and the aspect ratio of the pinhole 18. In particular, the height from the light reception face of the semiconductor substrate 13 to the metal film 17 is set to not less than 50 μm.

Further, in the solid-stage image pickup element 11R, preferably the thickness of the glass substrate 16b is set to not less than 1 μm, and particularly is set to not less than 20 μm. In addition, by providing such a glass substrate 16b as just described, in the solid-stage image pickup element 11R, lack of light intensity when an image of an image pickup object close to the pinhole 18 is picked up can be eliminated.

Figure 35:
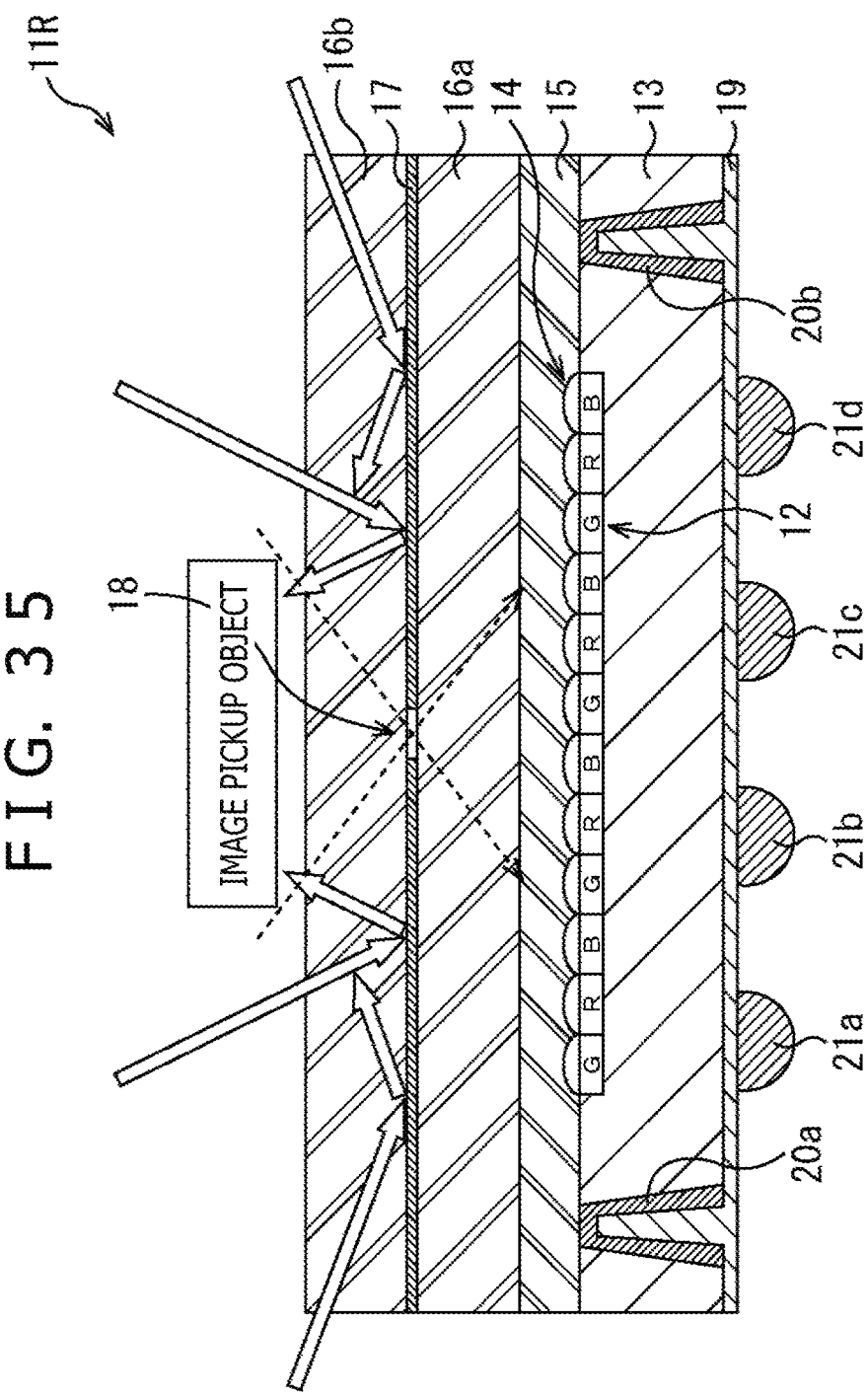
FIG. 35 is a view illustrating light irradiated on an image pickup object.

In particular, as indicated by an outline arrow mark in FIG. 35, in the solid-stage image pickup element 11R, light incident from the image pickup object side of the glass substrate 16b or light incident from a side face of the glass substrate 16b can be reflected by the metal film 17 and irradiate upon the solid-stage image pickup element 11R side of the image pickup object. By utilizing reflection of the metal film 17 in which the pinhole 18 is formed in this manner, external light incident to the glass substrate 16b can be utilized as illumination for an image pickup object. In particular, in the solid-stage image pickup element 11R, the glass substrate 16b configures a light guide for guiding light reflected by the metal film 17 to an image pickup object.

Accordingly, in the solid-stage image pickup element 11R, even if an image pickup object is positioned close to the pinhole 18, an image of the image pickup object can be picked up avoiding that sufficient light cannot pass through the pinhole 18 by an influence of the shadow of the image pickup object. In other words, the solid-stage image pickup element 11R can compensate also for dimming upon close-up image pickup that is a weak point of a pinhole camera.

Figure 36:
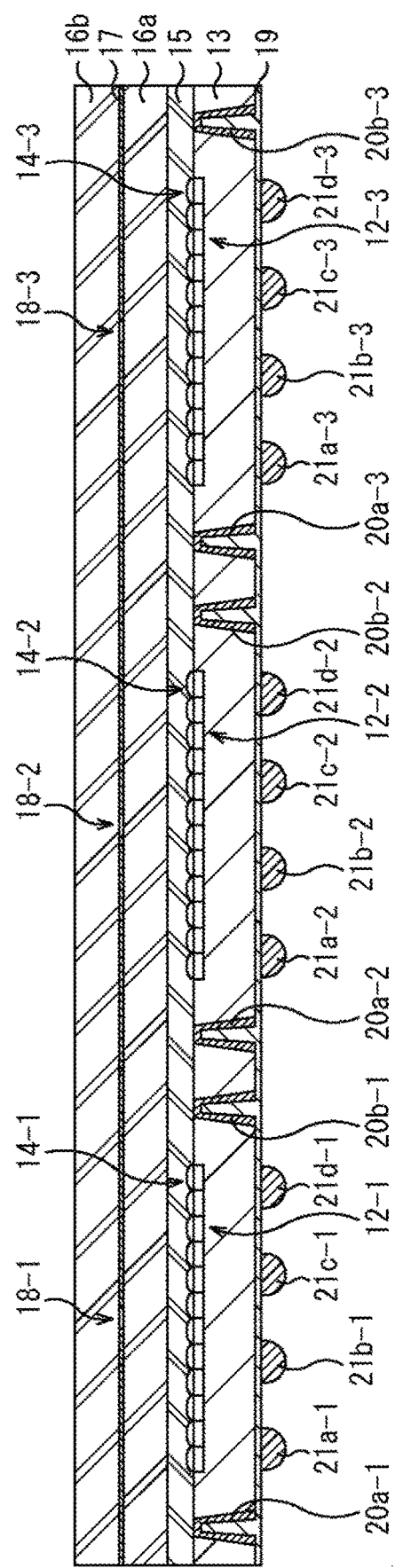
FIG. 36 is a view depicting an example of a configuration of an eighteenth embodiment of the solid-state image pickup element.

Next, FIG. 36 is a view depicting an example of a configuration of a solid-state image pickup element according to an eighteenth embodiment. It is to be noted that, in a solid-stage image pickup element 11S depicted in FIG. 36, components common to those of the solid-stage image pickup element 11R of FIG. 34 are denoted by like reference symbols, and detailed description of them is omitted.

As depicted in FIG. 36, the solid-stage image pickup element 11S has a stacked layer similar to that of the solid-stage image pickup element 11R of FIG. 34 and is configured such that three solid-state image pickup elements 11R are integrated. In particular, in the solid-stage image pickup element 11S, pixel arrays 12-1 to 12-3 are provided at three locations of a semiconductor substrate 13, and pinholes 18-1 to 18-3 are formed at three locations of a metal film 17 so as to correspond to the pixel arrays 12-1 to 12-3, respectively. Further, the solid-stage image pickup element 11S has a stacked structure similar to that of the solid-stage image pickup element 11R of FIG. 34 and besides is configured such that through electrodes 20a and 20b paired with each other are provided for each of the pixel arrays 12 similarly as in the solid-state image pickup element 11B of FIG. 3.

The solid-stage image pickup element 11S having such a configuration as described above can eliminate lack of light intensity upon close-up image pickup, for example, in a small-sized stereo camera which can pick up a plurality of images of different parallaxes at intervals of a plurality of pinholes 18 to acquire a three-dimensional image.

Figure 37:
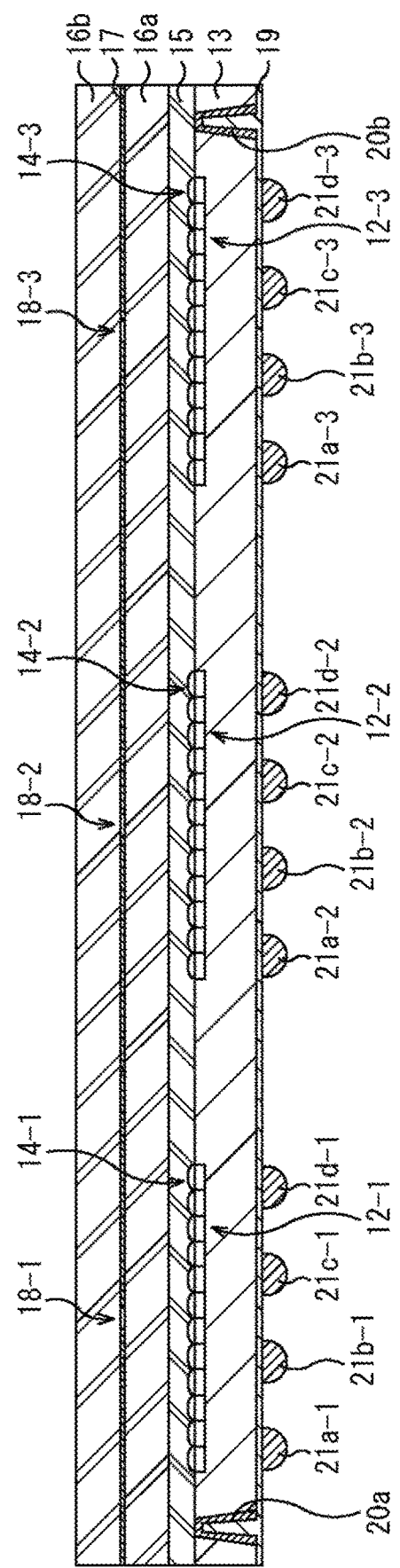
FIG. 37 is a view depicting an example of a configuration of a nineteenth embodiment of the solid-state image pickup element.

Next, FIG. 37 is a view depicting an example of a configuration of a solid-state image pickup element according to a nineteenth embodiment. It is to be noted that, in a solid-state image pickup element 11T depicted in FIG. 37, components common to those of the solid-stage image pickup element 11T of FIG. 36 are denoted by like reference symbols, and detailed description of them is omitted.

As depicted in FIG. 37, the solid-state image pickup element 11T is configured such that it solely has through electrodes 20a and 20b paired with each other for inputting and outputting in the entire solid-state image pickup element 11T. The solid-state image pickup element 11T having such a configuration as just described can eliminate lack of light intensity upon close-up image pickup in a small-sized camera similarly to the solid-state image pickup element 11S of FIG. 36.

Figure 38:
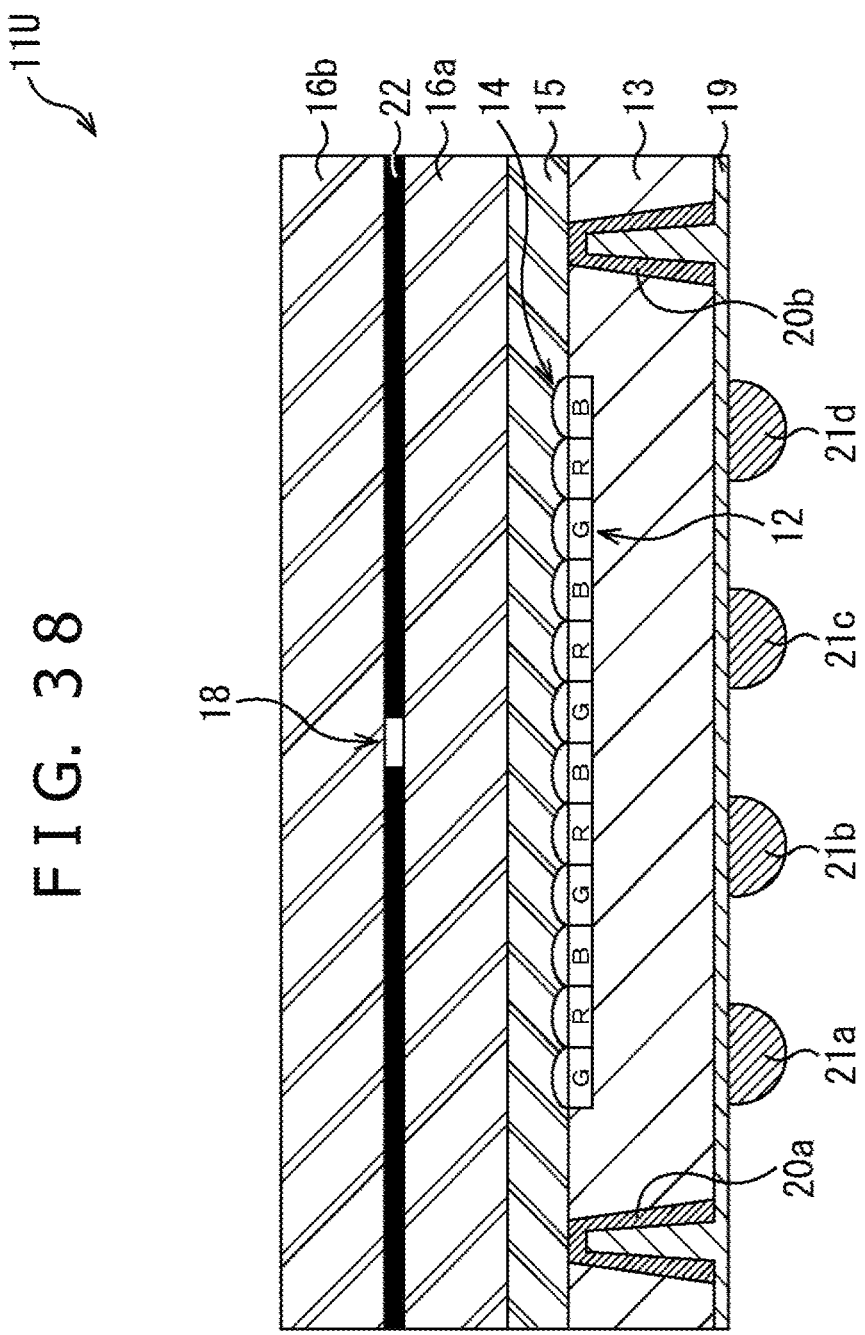
FIG. 38 is a view depicting an example of a configuration of a 20th embodiment of the solid-state image pickup element.

Next, FIG. 38 is a view depicting an example of a configuration of a solid-state image pickup element according to a 20th embodiment. It is to be noted that, in a solid-state image pickup element 11U depicted in FIG. 38, components common to those of the solid-stage image pickup element 11R of FIG. 34 are denoted by like reference symbols, and detailed description of them is omitted.

As depicted in FIG. 38, the solid-state image pickup element 11U is different in configuration from the solid-stage image pickup element 11R of FIG. 34 in that black resist 22 is stacked between glass substrates 16a and 16b and a pinhole 18 is formed in the black resist 22. In particular, while, in the solid-stage image pickup element 11R of FIG. 34, the metal film 17 that is a light shielding film of the reflection type that reflects light is used, in the solid-stage image pickup element 11U, the black resist 22 that is a light shielding film of the absorption type that absorbs light is used. For example, the black resist 22 is preferably formed as a film having a thickness of 1 μm to several μm.

In the solid-state image pickup element 11U having such a configuration as just described, reflected light of light incident to the solid-state image pickup element 11U through the pinhole 18 and reflected in the inside of the solid-state image pickup element 11U can be absorbed by the black resist 22. Consequently, such reflected light can be suppressed from having a bad influence on an image.

Figure 39:
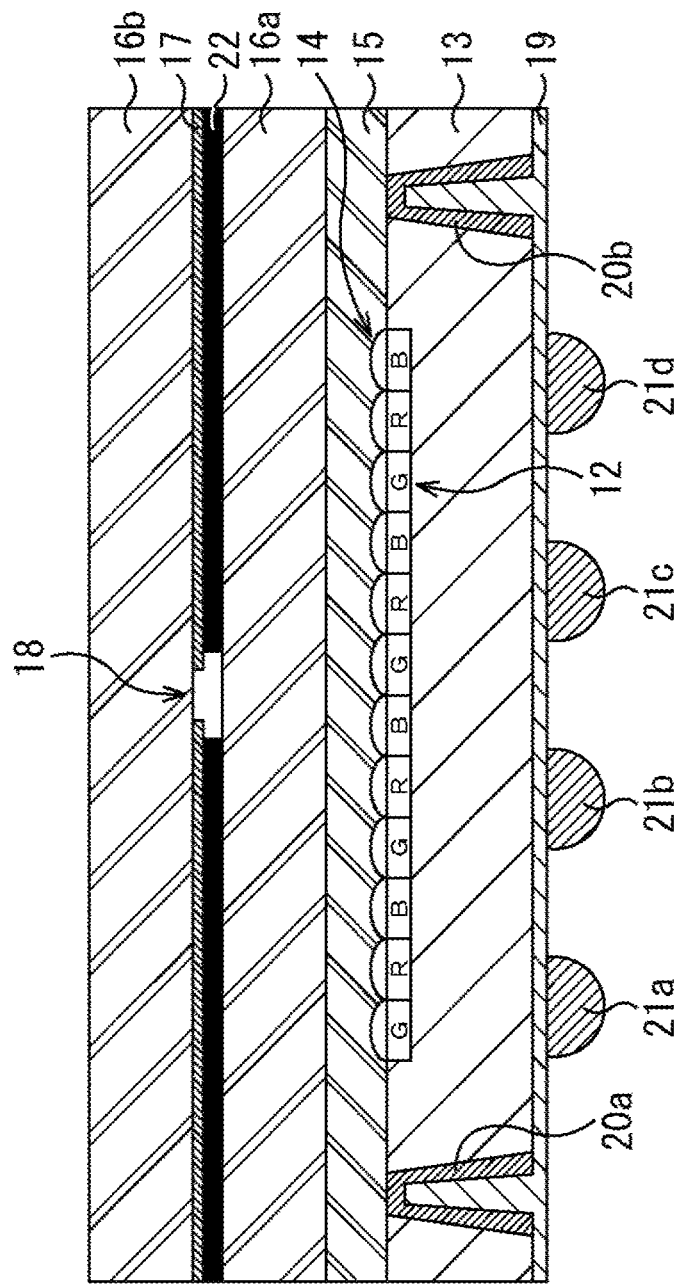
FIG. 39 is a view depicting an example of a configuration of a 21st embodiment of the solid-state image pickup element.

Next, FIG. 39 is a view depicting an example of a configuration of a solid-state image pickup element according to a 21st embodiment. It is to be noted that, in a solid-state image pickup element 11V depicted in FIG. 39, components common to those of the solid-stage image pickup element 11R of FIG. 34 are denoted by like reference symbols, and detailed description of them is omitted.

As depicted in FIG. 39, the solid-state image pickup element 11V is different in configuration from the solid-stage image pickup element 11R of FIG. 34 in that black resist 22 is stacked between a glass substrate 16a and a metal film 17. In particular, in the solid-state image pickup element 11V, a pinhole 18 is formed in a stacked film configured from the metal film 17 and the black resist 22. Further, in the configuration in which the stacked film of the metal film 17 and the black resist 22 is used in this manner, the opening diameter of the black resist 22 is configured so as to be greater than the opening diameter of the metal film 17 for forming the pinhole 18 similarly to the solid-state image pickup element 11E of FIG. 6. Consequently, the solid-state image pickup element 11V can pick up an image with a more appropriate aperture value.

In the solid-state image pickup element 11V having such a configuration as just described, by providing the black resist 22 at the semiconductor substrate 13 side of the metal film 17, reflected light in the inside of the solid-state image pickup element 11V can be suppressed from having a bad influence on an image similarly as in the solid-state image pickup element 11U of FIG. 38. Further, the solid-state image pickup element 11V can eliminate lack of light intensity upon close-up image pickup similarly to the solid-stage image pickup element 11R of FIG. 34.

Figure 40:
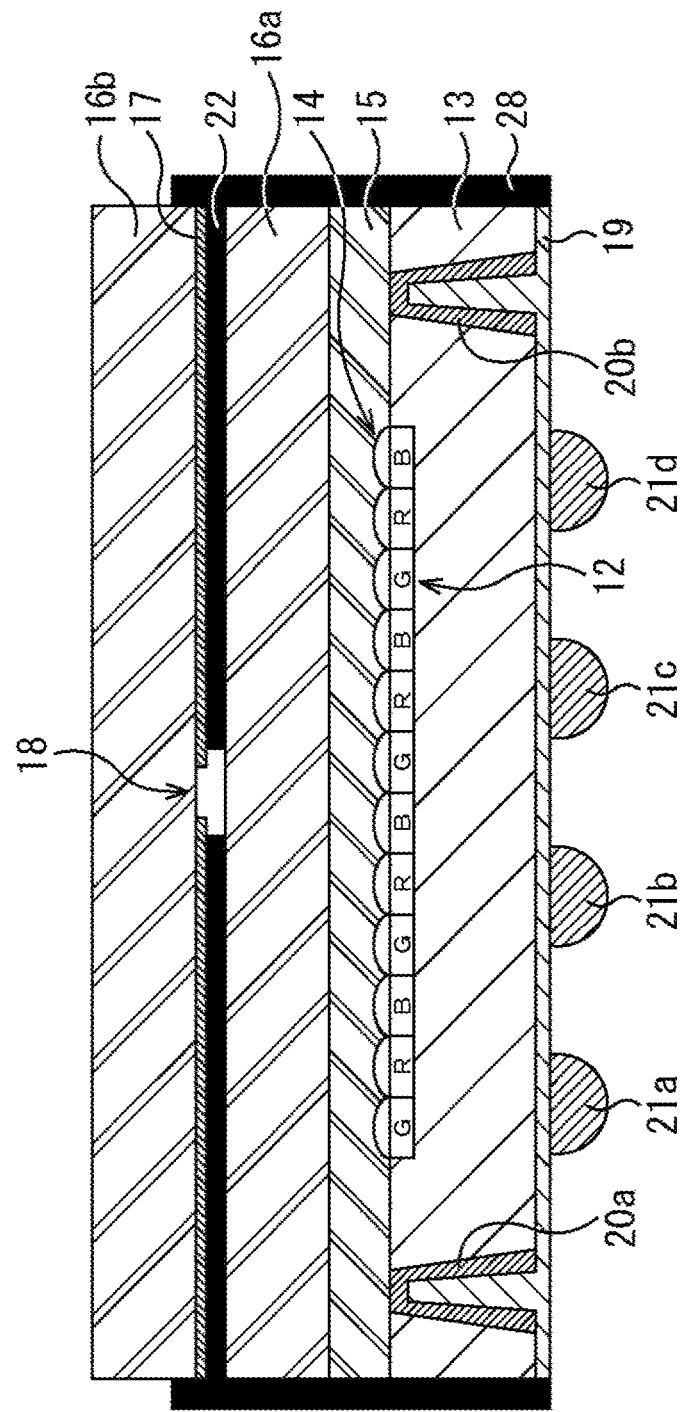
FIG. 40 is a view depicting an example of a configuration of a 22nd embodiment of the solid-state image pickup element.

Next, FIG. 40 is a view depicting an example of a configuration of a solid-state image pickup element according to a 22nd embodiment. It is to be noted that, in a solid-state image pickup element 11W depicted in FIG. 40, components common to those of the solid-state image pickup element 11V of FIG. 39 are denoted by like reference symbols, and detailed description of them is omitted.

As depicted in FIG. 40, the solid-state image pickup element 11W has a stacked structure similar to that of the solid-state image pickup element 11V of FIG. 39 and is different in configuration from the solid-state image pickup element 11V of FIG. 39 in that a side face light shielding film 28 is formed on a side face thereof. In other words, the solid-state image pickup element 11W is configured such that a side face of the solid-state image pickup element 11V in FIG. 39 is shielded against light by the side face light shielding film 28.

It is to be noted that it is only necessary for the side face light shielding film 28 to be provided so as to shield at least a region from the semiconductor substrate 13 to the black resist 22 against light, and preferably, for example, the side face of the glass substrate 16b is configured so as not to be shielded against light. Consequently, the glass substrate 16b can be utilized as a light guide for light incident from the side face of the glass substrate 16b. It is to be noted that, as the side face light shielding film 28, for example, black resist can be used. Alternatively, as the pinhole 18, a film of metal similar to that of the metal film 17 may be formed. Further, the glass substrate 16b may be configured such that the side face thereof is covered using such a case 29 (for example, a housing of black resin) as described above with reference to FIG. 15, for example. Furthermore, as a method different from the methods described above, a structure that blocks light such that light only from the pinhole 18 enters may be adopted, and the method for shielding the side face is not restricted.

Since the solid-state image pickup element 11W having such a configuration as described above can block light irradiated from the side face, such light can be suppressed from having a bad influence on an image and lack of light intensity upon close-up image pickup can be eliminated.

Figure 41:
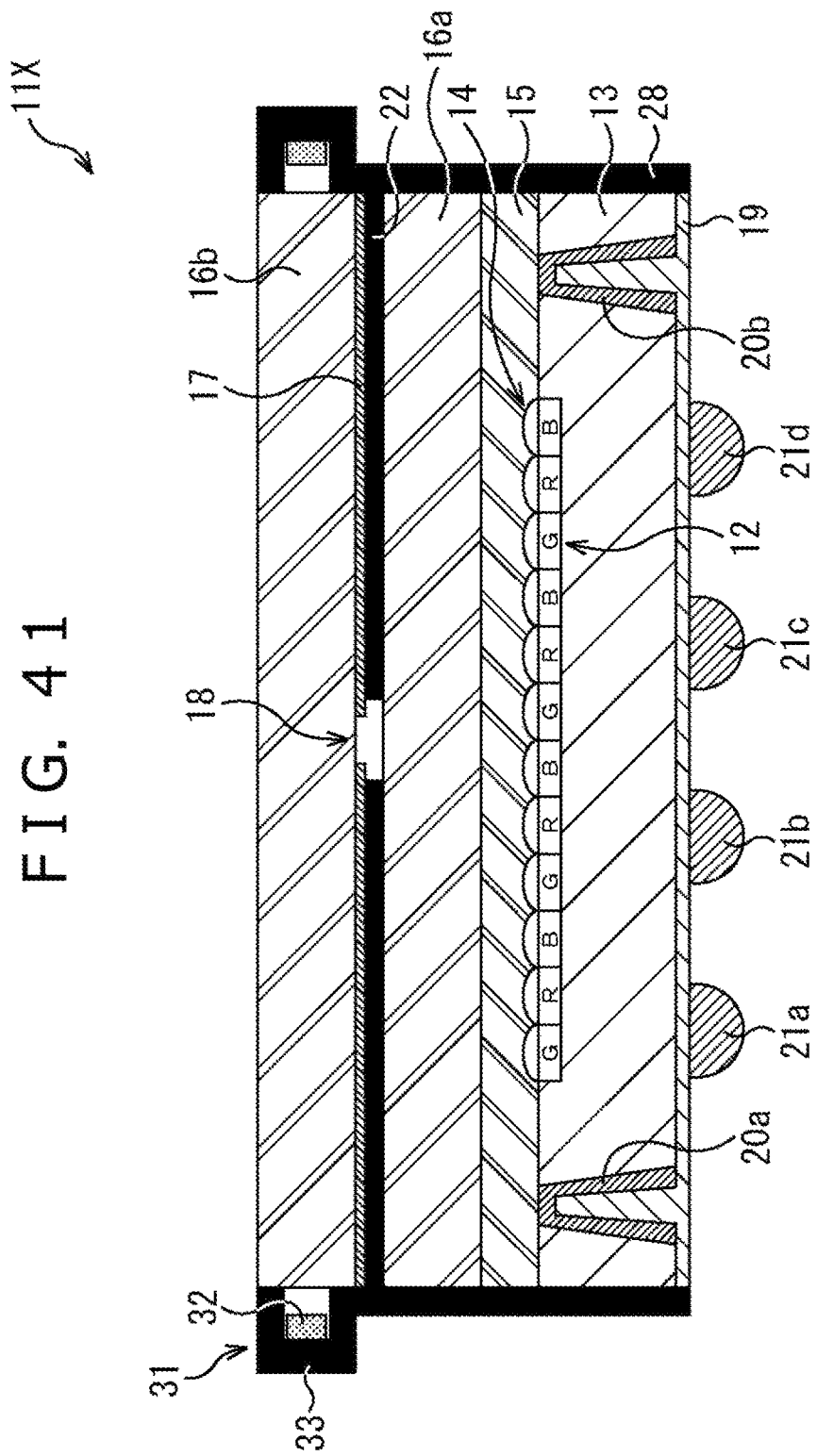
FIG. 41 is a view depicting an example of a configuration of a 23rd embodiment of the solid-state image pickup element.

Next, FIG. 41 is a view depicting an example of a configuration of a solid-state image pickup element according to a 23rd embodiment. It is to be noted that, in a solid-state image pickup element 11X depicted in FIG. 41, components common to those of the solid-state image pickup element 11W of FIG. 40 are denoted by like reference symbols, and detailed description of them is omitted.

As depicted in FIG. 41, the solid-state image pickup element 11X is different in configuration from the solid-state image pickup element 11W of FIG. 40 in that a light source module 31 is provided on a side face of a glass substrate 16b. The light source module 31 is configured such that a light source unit 32 configured from a light emitting element such as, for example, an LED (Light Emitting Diode) that irradiates light at least from a side face toward the inner side of the glass substrate 16b is accommodated in an accommodation unit 33 that is formed from a material that absorbs light similarly to the black resist 22.

It is to be noted that, for example, the light source module 31 may be configured such that light is irradiated from a side face direction of the solid-state image pickup element 11X as depicted in FIG. 41 or may be configured such that the light source unit 32 is arranged such that light is irradiated from an oblique upward direction of the solid-state image pickup element 11X toward the inner side of the glass substrate 16b (for example, toward the pinhole 18). Further, only it is necessary for the light source module 31 to have the light source unit 32 provided on one side face of the glass substrate 16b, and the light source module 31 can be configured such that the light source unit 32 is provided on the opposite side faces of the glass substrate 16b as depicted in FIG. 41 or such that the light source unit 32 is provided on all of the side faces in such a manner as to surround the glass substrate 16b.

In particular, for the light source module 31, a backlight module for a liquid crystal display unit used in a so-called smartphone (LED of the surface mounted type and the very small side view type) can be utilized. Further, for the light source module 31, a light source unit 32 that emits white light can be adopted, and a light source unit 32 that emits invisible light such as ultraviolet rays or infrared rays or a light source unit 32 that emits light of a single color such as red or green can be adopted. Furthermore, as the light source module 31, a light source unit 32 may adopted which utilizes a plurality of LEDs for emitting light of the three primary colors of red, green and blue and can adjust the hue. Further, the light source module 31 may be applied to the solid-stage image pickup element 11S (FIG. 36) or the solid-state image pickup element 11T (FIG. 37) in which a plurality of pinholes 18 are formed at different locations.

Since the solid-state image pickup element 11X includes the light source module 31 in this manner, it can pick up an image with light of an appropriate light quantity irradiated upon an image pickup object.

Now, a first formation method of a laminated glass substrate with a pinhole 18 used as a protective substrate in the solid-stage image pickup element 11R of FIG. 34 is described with reference to FIG. 42.

Figure 42:
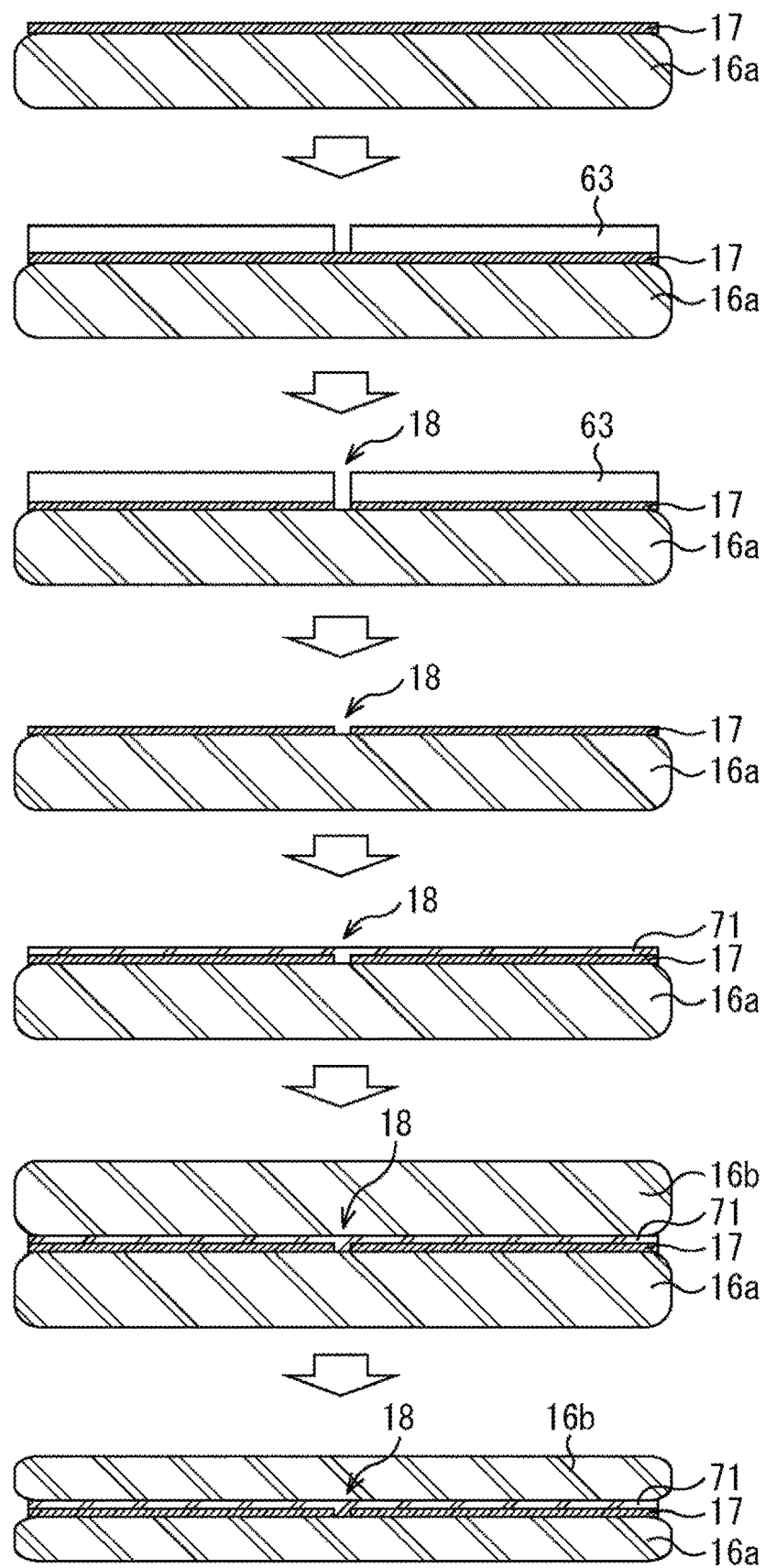
FIG. 42 is a view illustrating a first formation method for a pasted glass substrate with a pinhole.

For example, at the 91st step, a metal film 17 is formed on a glass substrate 16a of a thickness of, for example, 500 μm by a sputtering method as depicted at the first stage of FIG. 42. For example, where titanium is used as the metal film 17, the metal film 17 is formed with a thickness of 120 nm.

Then at the 92nd step, an opening of not less than φ1 μm (for example, φ8 μm) is formed by a resist pattern 63 as depicted at the second stage of FIG. 42.

Then at the 93rd step, the metal film 17 is processed to form a pinhole 18 by a dry etching method or the like as depicted at the third stage of FIG. 42.

Thereafter, at the 94th step, the resist pattern 63 is removed to form a glass substrate 16a with a pinhole 18 as depicted at the fourth stage of FIG. 42.

Further, at the 95th step, a transparent adhesive resin 71 having a film thickness with which the portion at which the pinhole 18 is formed is filled sufficiently is applied as depicted at the fifth stage of FIG. 42.

Then, at the 96th step, the transparent adhesive resin 71 is utilized to paste a glass substrate 16b of a thickness of, for example, 500 μm as depicted at the sixth stage of FIG. 42.

Thereafter, at the 97th step, the glass substrate 16a is polished to reduce the thickness in accordance with the height from the image pickup face of the semiconductor substrate 13 as depicted at the seventh stage of FIG. 42. For example, the glass substrate 16a is finished so as to have a thickness of 250 μm. On the other hand, the thickness of the glass substrate 16b to be used as a light guide is adjusted by polishing the glass substrate 16b in accordance with specifications of the light guide. For example, the glass substrate 16b is finished so as to have a thickness of 250 μm.

By such steps as described above, a pasted glass substrate with a pinhole 18 configured from the glass substrates 16a and 16b pasted together is formed. Then, the pasted glass substrate with the pinhole 18 is stacked to a semiconductor substrate 13 with the seal resin 15 interposed therebetween to manufacture the solid-stage image pickup element 11R of FIG. 34 in a similar manner as in the manufacturing method described hereinabove with reference to FIGS. 17 to 19.

Now, a second formation method of a pasted glass substrate with a pinhole 18 is described with reference to FIG. 43.

For example, a glass substrate 16a with a pinhole 18 is formed by the 91st to 94th steps of FIG. 42 described hereinabove. Thereafter, at the 101st step, a film of SiO2 is formed on a metal film 17, in which a pinhole 18 is formed, by a plasma CVD method, an atomic layer deposition (ALD) method or the like to form a glass adhesive layer 72 as depicted at the first stage of FIG. 43. Further, after a glass adhesive layer 72 is formed with a thickness greater than the film thickness of the metal film 17 to fill up the pinhole 18, CMP is performed for flattening in order to eliminate an offset portion by the pinhole 18.

It is to be noted that, for example, the thickness of the glass adhesive layer 72 may otherwise be smaller than the film thickness of the metal film 17 in which a pinhole 18 is to be formed such that the pinhole 18 may not be filled up, and in this case, the pinhole 18 can be formed in a cavity structure as described hereinabove with reference to FIG. 34.

Figure 43:
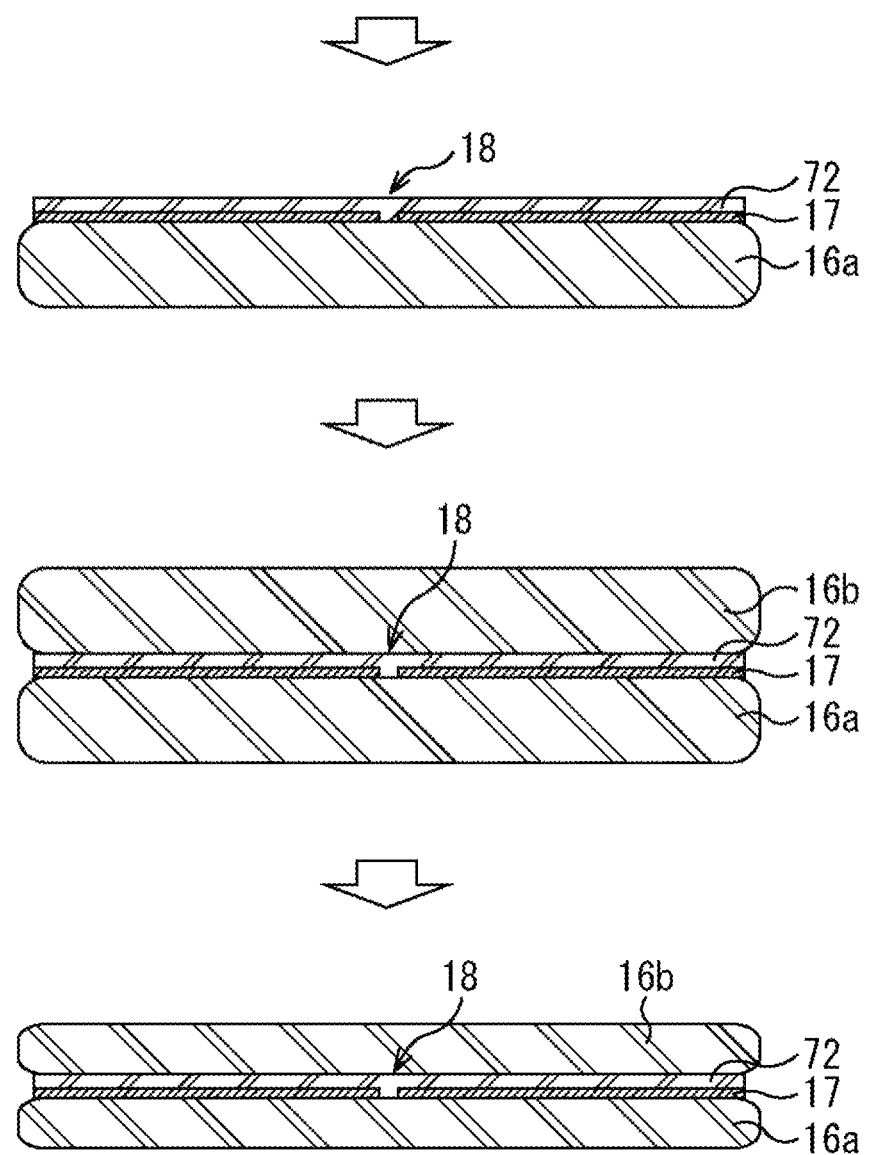
FIG. 43 is a view illustrating a second formation method for a pasted glass substrate with a pinhole.
Figure 44:
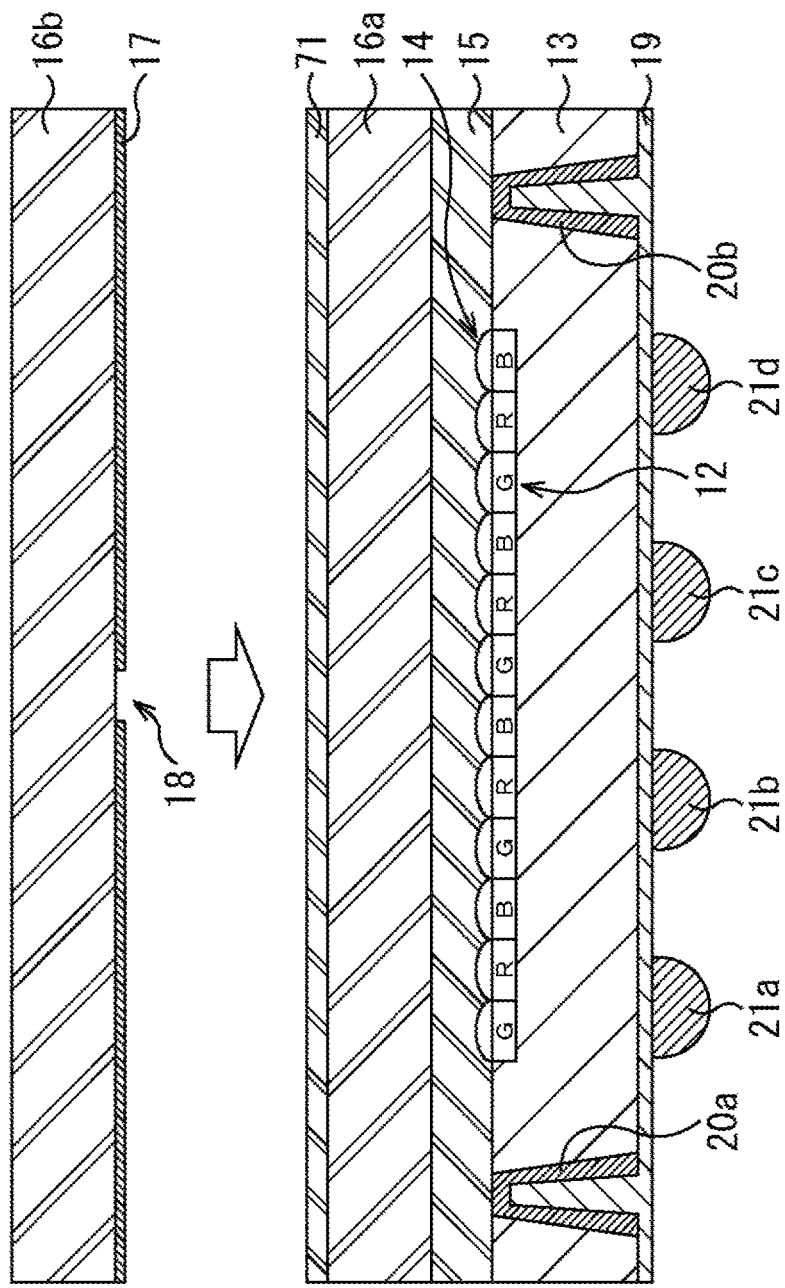
FIG. 44 is a view illustrating a first modification to the manufacturing method for the solid-state image pickup element.

Then at the 102nd step, a glass substrate 16b is joined to the glass adhesive layer 72 by plasma junction as depicted at the second stage of FIG. 43. Here, plasma junction is a method of performing plasma processing of SiO2 on individual faces to form dangling bonds and forming a Si—OH group to connect them through dehydration condensation.

Thereafter, at the 103rd step, the glass substrate 16a is polished to reduce the thickness in accordance with the height from the image pickup face of the semiconductor substrate 13 as depicted at the third stage of FIG. 43. For example, the glass substrate 16a is finished such that it has a thickness of 250 μm. On the other hand, the thickness of the glass substrate 16b used as a light guide is adjusted by polishing the glass substrate 16b in accordance with specifications of the light guide. For example, the glass substrate 16b is finished so as to have a thickness of 250 μm.

Now, a modification to the manufacturing method of a solid-state image pickup element 11 is described with reference to FIGS. 44 to 48.

For example, as a manufacturing method of the solid-stage image pickup element 11R of FIG. 34, such a manufacturing method that a glass substrate 16b on which a metal film 17 having a pinhole 18 formed therein is formed is adhered to a glass substrate 16a on which the transparent adhesive resin 71 is applied can be adopted. Specifically, the solid-stage image pickup element 11R may be manufactured such that the glass substrate 16b on which the metal film 17 having the pinhole 18 formed therein is adhere to a camera module, which has no pinhole 18 formed therein with the transparent adhesive resin 71.

Figure 45:
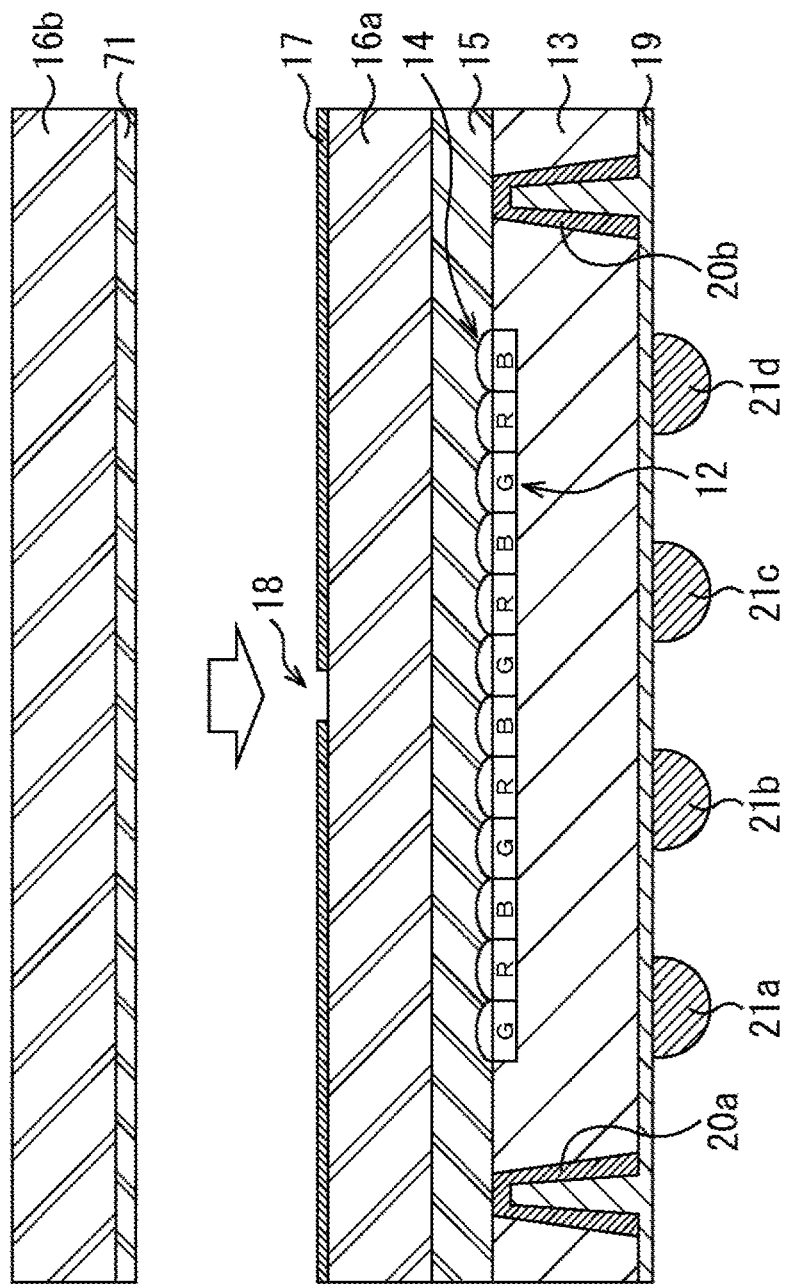
FIG. 45 is a view illustrating a second modification to the manufacturing method for the solid-state image pickup element.

Further, as depicted in FIG. 45, as the manufacturing method of the solid-stage image pickup element 11R of FIG. 34, such a manufacturing method that a glass substrate 16b to which transparent adhesive resin 71 is applied is adhered to a glass substrate 16a on which a metal film 17 having a pinhole 18 formed therein is formed can be adopted. In particular, the solid-stage image pickup element 11R may be manufactured by a manufacturing method by which a glass substrate 16b is adhered to a camera module with a pinhole 18 (structure similar to that, for example, of the solid-state image pickup element 11 of FIG. 1) with the transparent adhesive resin 71.

Figure 46:
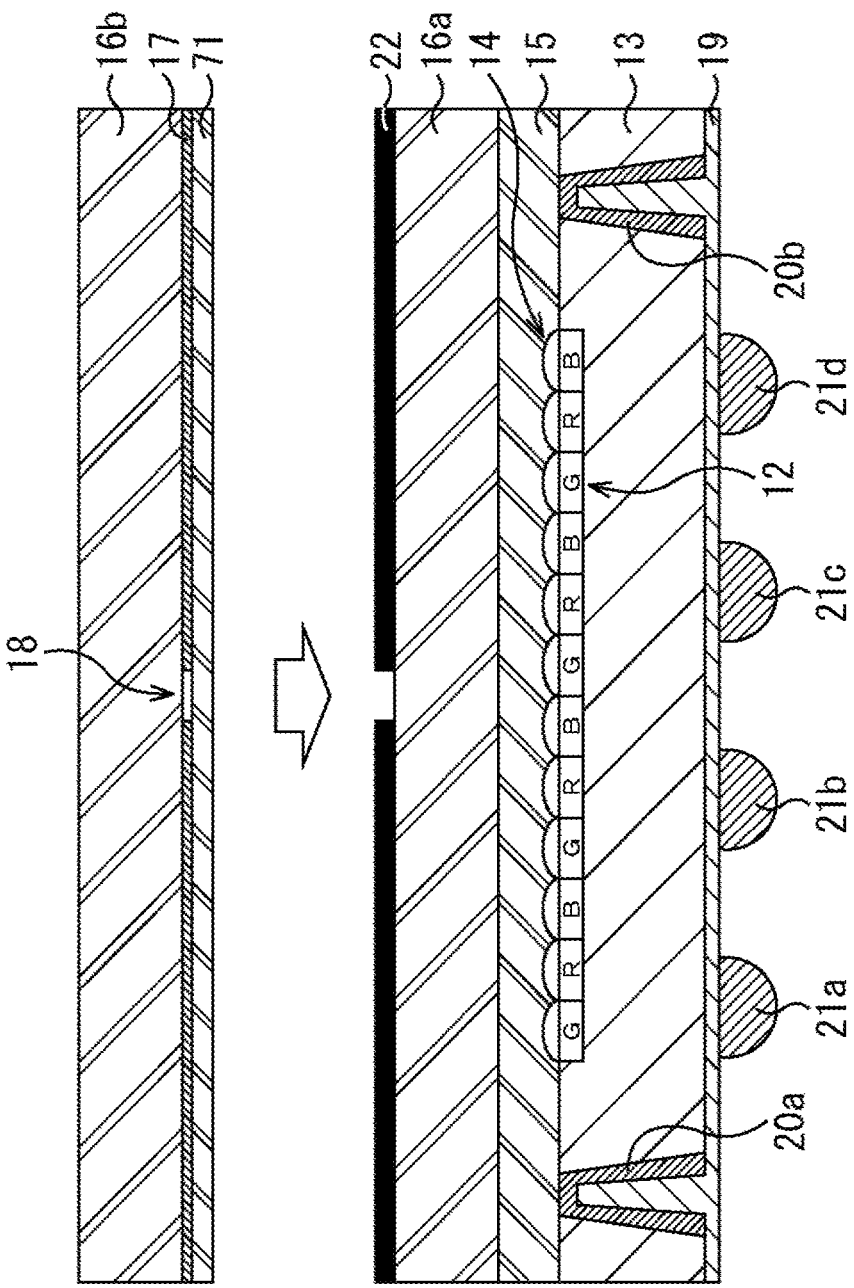
FIG. 46 is a view illustrating a third modification to the manufacturing method for the solid-state image pickup element.

Further, as a manufacturing method of the solid-state image pickup element 11V of FIG. 39, such a manufacturing method can be adopted in which transparent adhesive resin 71 is applied to a glass substrate 16b on which a metal film 17 having a pinhole 18 formed therein is formed and the glass substrate 16b is adhered to a glass substrate 16a, to which black resist 22 is stacked, through the transparent adhesive resin 71 as depicted in FIG. 46. In other words, the solid-state image pickup element 11V may be manufactured by a manufacturing method by which a glass substrate 16b, on which a metal film 17 having a pinhole 18 formed therein is formed, is adhered by transparent adhesive resin 71 to a camera module (structure similar to that, for example, of the solid-state image pickup element 11D of FIG. 5) with a pinhole 18 by black resist 22.

Figure 47:
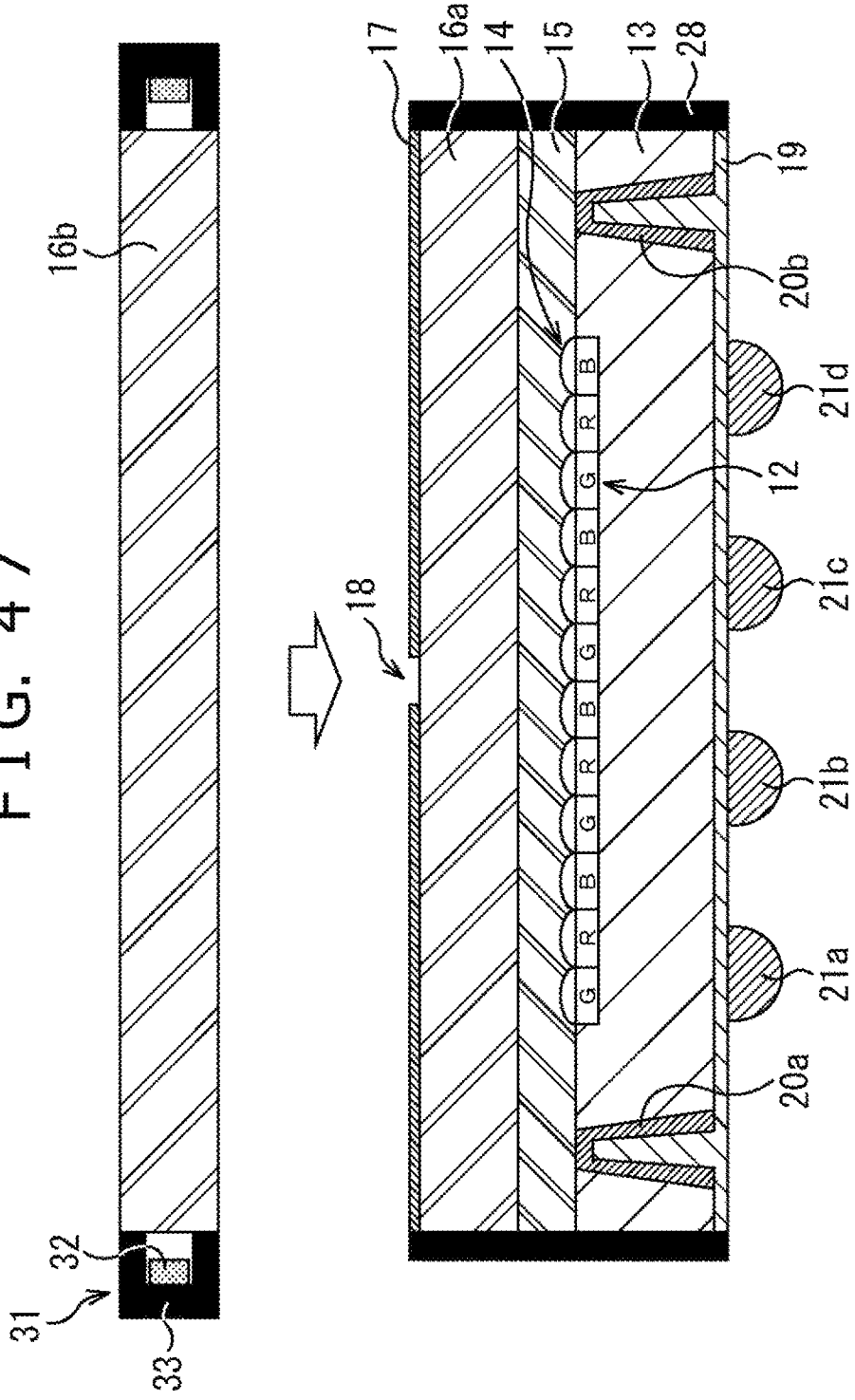
FIG. 47 is a view illustrating a fourth modification to the manufacturing method for the solid-state image pickup element.

Further, as depicted in FIG. 47, as a manufacturing method of the solid-state image pickup element 11X of FIG. 41, such a manufacturing method can be adopted in which a glass substrate 16b in which a light source module 31 is incorporated is adhered to a glass substrate 16a on which a metal film 17 having a pinhole 18 formed therein is formed.

Figure 48:
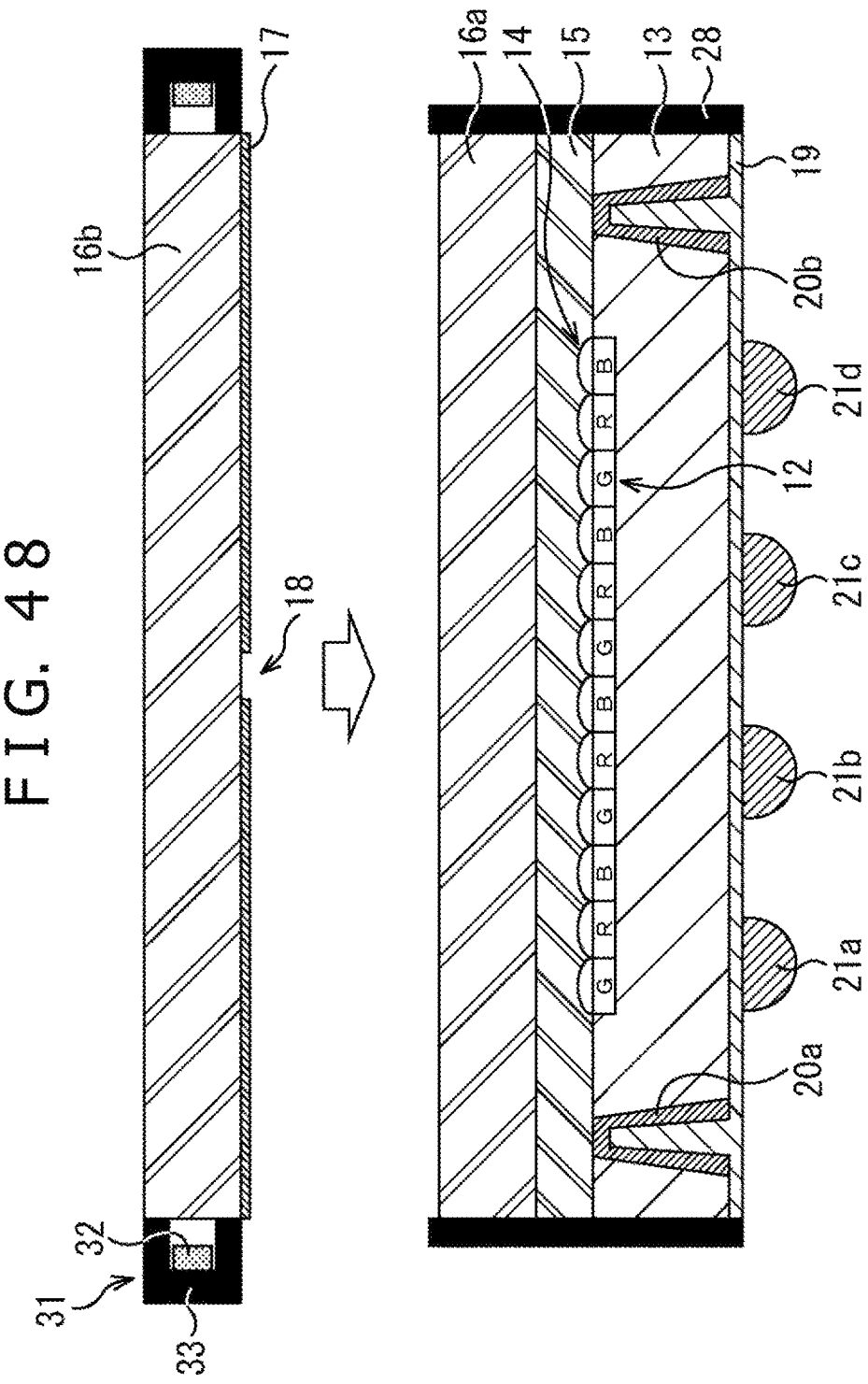
FIG. 48 is a view illustrating a fifth modification to the manufacturing method for the solid-state image pickup element.

Furthermore, as depicted in FIG. 48, as a manufacturing method of the solid-state image pickup element 11X of FIG. 41, such a manufacturing method can be adopted in which a glass substrate 16b in which the light source module 31 is incorporated and a metal film 17 having a pinhole 18 formed therein is formed is adhered to the glass substrate 16a.

It is to be noted that also it is possible to form a metal film 17 having a pinhole 18 formed therein in advance on a rear face of a glass plate used for a housing at the set side of, for example, a portable telephone apparatus and mount the solid-state image pickup element 11 of FIG. 1 into the housing to form a pinhole camera. Further, where the light source module 31 is mounted in the housing, close-up image pickup can be performed with a sufficient light quantity.

<Example of Configuration of Electronic Apparatus>

It is to be noted that such solid-state image pickup elements 11 of the embodiments as described above can be applied to various electronic apparatus such as, for example, image pickup systems such as a digital still camera or a digital video camera, a portable telephone set having an image pickup function or other apparatus having an image pickup function.

Figure 49:
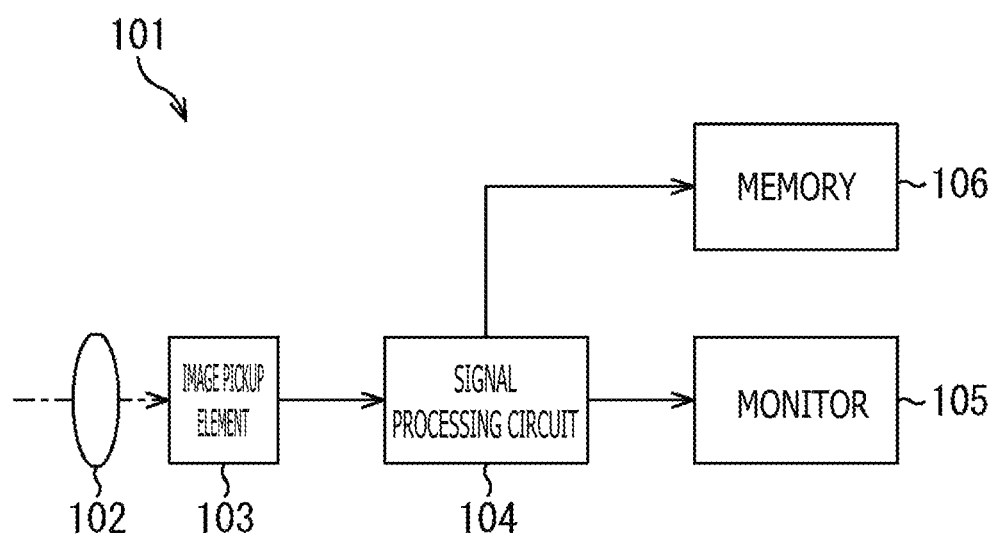
FIG. 49 is a block diagram depicting an example of a configuration of an embodiment of an electronic apparatus to which the present technology is applied.

FIG. 49 is a block diagram depicting an example of a configuration of an image pickup apparatus incorporated in an electronic apparatus.

As depicted in FIG. 49, the image pickup apparatus 101 is configured including an optical system 102, an image pickup element 103, a signal processing circuit 104, a monitor 105, and a memory 106, and can pick up a still image and a moving image.

The optical system 102 is configured having one or a plurality of lenses and introduces image light (incident light) from an image pickup object into the image pickup element 103 such that an image is formed on a light reception face (sensor portion) of the image pickup element 103.

As the image pickup element 103, the solid-state image pickup element 11 in any of the embodiments described hereinabove is applied. Into the image pickup element 103, electrons are accumulated for a fixed period of time in response to the image formed on the light reception face through the optical system 102. Then, a signal according to the electrons accumulated in the image pickup element 103 is supplied to the signal processing circuit 104.

The signal processing circuit 104 performs various signal processes for a pixel signal outputted from the image pickup element 103. An image (image data) obtained by the signal processing circuit 104 performing the signal processes is supplied to and displayed on the monitor 105 or supplied to and stored (recorded) into the memory 106.

In the image pickup apparatus 101 configured in such a manner as described above, for example, further miniaturization can be achieved by applying the solid-state image pickup element 11 of any of the embodiments described hereinabove.

<Examples of Use of Image Sensor>

Figure 50:
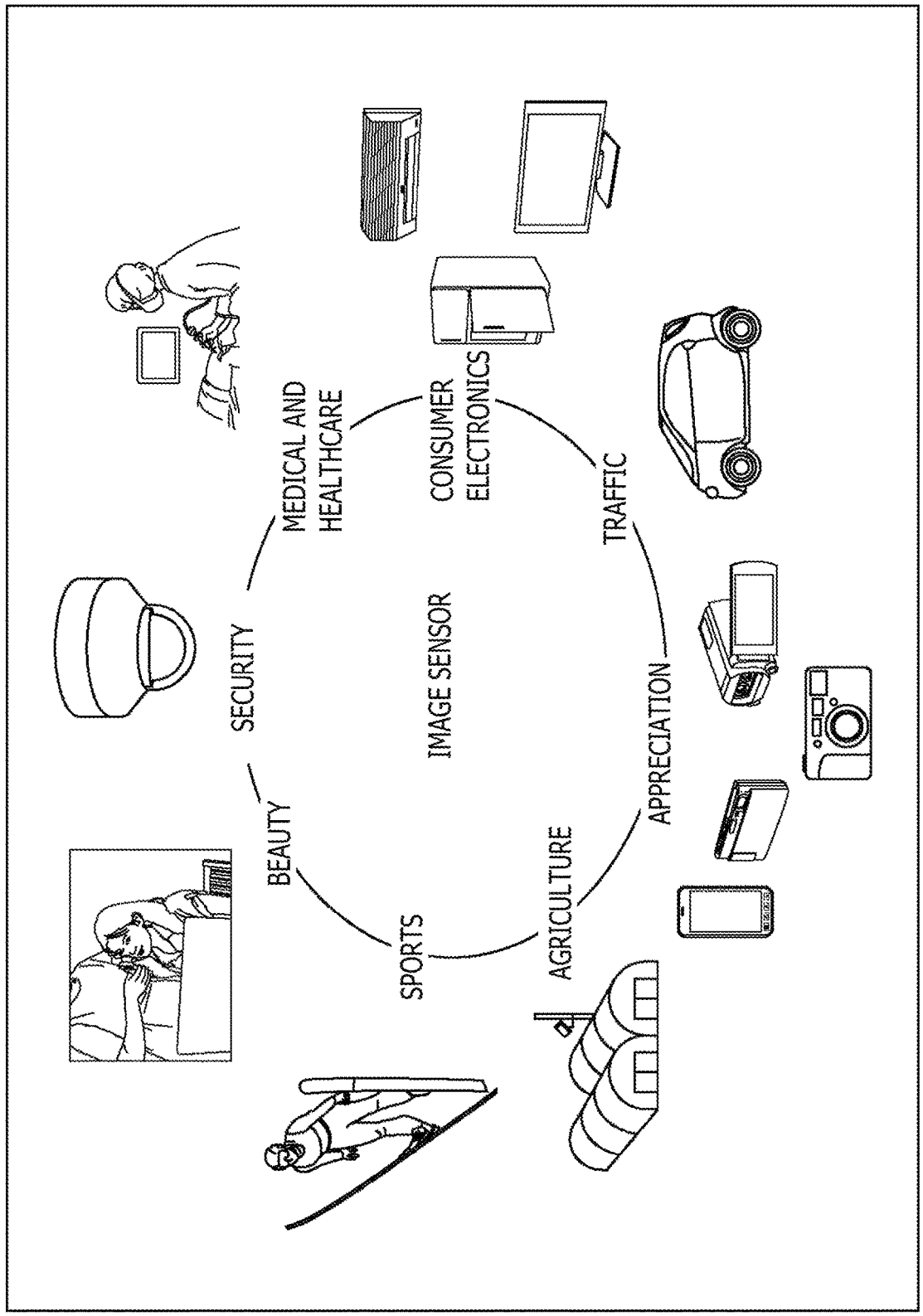
FIG. 50 is a view depicting an example of use of an image sensor.

FIG. 50 is a view depicting an example of use in which the image sensor (solid-state image pickup element 11) described hereinabove is used.

The image sensor described hereinabove can be used, for example, in various cases in which light such as visible rays, infrared rays, ultraviolet rays and X rays is sensed as described below.

- Apparatus by which an image that is provided for viewing is picked up such as a digital camera or a portable apparatus with a camera function and so forth
- Apparatus provided for traffic such as automotive sensors for image pickup of the front, the rear, the surroundings, the inside and so forth of an automobile for safe driving such as automatic stopping, recognition of a state of the driver and so forth, a security camera for monitoring a traveling vehicle or the road, a distance measurement sensor for measuring the distance between vehicles and so forth
- Apparatus provided for consumer electronics such as a TV, a refrigerator, an air conditioner or the like for picking up an image of a gesture of a user to perform apparatus operation in accordance with the gesture
- Apparatus provided for medical or health care use such as an endoscope, an apparatus or the like that performs angiography by reception of infrared rays
- Apparatus provided for use for security such as a surveillance camera for security use or a camera for people authentication purpose or the like that
- Apparatus for use for beauty such as a skin measuring instrument for picking up an image of the skin or a microscope for picking up an image of the scalp or the like
- Apparatus provided for use for sports such as an action camera or a wearable camera for sports applications and so forth
- Apparatus provided for agricultural use such a camera for monitoring the state of a field or crops and so forth It is to be noted that the present technology can take such configurations as described below.

(1) A pinhole camera, including:
a semiconductor substrate on which a pixel array unit on which a plurality of pixels are arranged in an array is formed;
a protective substrate stacked on the semiconductor substrate through a seal resin; and
a light shielding film formed on the protective substrate and configured to block light to be irradiated upon the semiconductor substrate, in which
a pinhole is formed in the light shielding film.

(2) The pinhole camera according to (1) above, in which
the light shielding film in which the pinhole is formed is arranged at the outer side of the protective substrate with respect to the semiconductor substrate.

(3) The pinhole camera according to (1) above, in which
the light shielding film in which the pinhole is formed is arranged between the protective substrate and the seal resin.

(4) The pinhole camera according to any one of (1) to (3) above, further including:
a through electrode formed so as to extend through the semiconductor substrate; and
an external terminal electrically connected to the through electrode and used to allow the pinhole camera to be directly mounted externally.

(5) The pinhole camera according to any one of (1) to (4) above, further including:
an insulating film for isolating a portion of a face of the semiconductor substrate, on which the external terminal is provided, other than the external terminal.

(6) The pinhole camera according to any one of (1) to (5) above, in which
a plurality of pixel array units are formed on the semiconductor substrate, and
a plurality of pinholes are formed in the light shielding film in a corresponding relationship to the pixel array units.

(7) The pinhole camera according to any one of (1) to (6) above, in which
the light shielding film is a reflection type light shielding film formed from metal.

(8) The pinhole camera according to any one of (1) to (6) above, in which
the light shielding film is an absorption type light shielding film formed from black resist.

(9) The pinhole camera according to any one of (1) to (6) above, in which the light shielding film is configured by stacking a reflection type light shielding film formed from metal and an absorption type light shielding film formed from black resist, and the black resist is arranged at the semiconductor substrate.

(10)

The pinhole camera according to (9) above, in which the pinhole formed in the black resist has a diameter greater than that of the pinhole formed in the metal.

(11)

The pinhole camera according to any one of (1) to (10) above, in which the light shielding film is formed so as to be smaller than the protective substrate.

(12)

The pinhole camera according to any one of (1) to (6) above, in which the light shielding film is configured by stacking a reflection type light shielding film formed from metal and an absorption type light shielding film formed from black resist, and the light shielding film formed from the metal is formed so as to be smaller than the protective substrate, and a region other than the light shielding film formed from the metal is shielded against light by the light shielding film formed from the black resist.

(13)

The pinhole camera according to any one of (1) to (12) above, in which a waveguide is formed by embedding part of the protective substrate into the pinhole.

(14)

The pinhole camera according to (13) above, in which an end portion of the waveguide is formed in a convex shape having a given curvature.

(15)

The pinhole camera according to any one of (1) to (12), in which a convex shape portion is formed just above the pinhole formed in the light shielding film.

(16)

The pinhole camera according to any one of (1) to (12) above, in which a concave shape portion is formed just below the pinhole formed in the light shielding film.

(17)

The pinhole camera according to any one of (1) to (16) above, further including:

a side face light shielding film configured to shield at least a side face of the protective substrate and the seal resin against light.

(18)

The pinhole camera according to any one of (1) to (16) above, further including:

a case configured to shield at least a side face of the protective substrate and the seal resin against light.

(19)

The pinhole camera according to (1) above, in which the protective substrate has a two layer structure configured at least from a first protective substrate and a second protective substrate, and the light shielding film in which the pinhole is formed is provided between the first protective substrate and the second protective substrate.

(20)

The pinhole camera according to (19) above, in which the pinhole sandwiched between the first protective substrate and the second protective substrate has a solid structure in which the pinhole is filled with transparent material.

(21)

The pinhole camera according to (19) above, in which the pinhole sandwiched between the first protective substrate and the second protective substrate has a hollow structure.

(22)

The pinhole camera according to any one of (19) to (21) above, in which a stacked structure is applied in which the first protective substrate, the light shielding film and the second protective substrate are stacked in order from the semiconductor substrate side, and the light shielding film is a reflection type light shielding film formed from metal, and the second protective substrate configures a light guide that guides light reflected by the light shielding film to an image pickup object.

(23)

The pinhole camera according to any one of (19) to (21) above, in which the light shielding film is an absorption type light shielding film formed from black resist.

(24)

The pinhole camera according to any one of (19) to (21) above, in which the light shielding film is configured by stacking a reflection type light shielding film formed from metal and an absorption type light shielding film formed from black resist, and the black resist is arranged at the semiconductor substrate side.

(25)

The pinhole camera according to any one of (19) to (24) above, further including:

a side face light shielding film configured to shield at least a side face from the semiconductor substrate to the light shielding film.

(26)

The pinhole camera according to any one of (19) to (25) above, in which a stacked structure is applied in which the first protective substrate, the light shielding film and the second protective substrate are stacked in order from the semiconductor substrate side, the pinhole camera further including: a light source configured to irradiate light at least from the side face toward the inner side of the second protective substrate.

(27)

The pinhole camera according to (26) above, in which the light source is provided at least on one side face of the second protective substrate.

(28)

The pinhole camera according to (26) or (27) above, in which the light source irradiates white light.

(29)

The pinhole camera according to any one of (26) to (28) above, in which the light source irradiates light of three primary colors.

(30)

An electronic apparatus, including:

a pinhole camera that includes a semiconductor substrate on which a pixel array unit on which a plurality of pixels are arranged in an array is formed, a protective substrate stacked on the semiconductor substrate through a seal resin, and a light shielding film formed on the protective substrate and configured to block light to be irradiated upon the semiconductor substrate, in which a pinhole is formed in the light shielding film.

(31)

A manufacturing method, including the steps of:

stacking a protective substrate on a semiconductor substrate, on which a pixel array unit on which a plurality of pixels are arranged in an array is formed, through a seal resin;

forming a light shielding film, which blocks light to be irradiated upon the semiconductor substrate, on the protective substrate; and forming a pinhole in the light shielding film.

It is to be noted that the present embodiment is not limited to the embodiments described hereinabove but can be changed in various manners without departing from the subject matter of the present disclosure.

REFERENCE SIGNS LIST

11 Solid-state image pickup element, 12 Pixel array, 13 Semiconductor substrate, 14 On-chip lens, 15 Seal resin, 16 Glass substrate, 17 Metal film, 18 Pinhole, 19 Insulating film, 20 Through electrode, 21 External terminal, 22 Black resist, 23 Waveguide, 24 Convex-shaped portion, 25 Concave-shaped portion, 26 Convex-shaped portion, 27 Concave-shaped portion, 28 Side light shielding film, 29 Case

The invention claimed is:

1. A pinhole camera, comprising:
   a semiconductor substrate;
   a pixel array unit in the semiconductor substrate, wherein the pixel array unit includes a plurality of pixels;
   a microlens layer on the semiconductor substrate;
   a plurality of through electrodes that extends through the semiconductor substrate from a first face of the semiconductor substrate to a second face of the semiconductor substrate;
   an external terminal on the semiconductor substrate, wherein the external terminal is between a first through electrode of the plurality of through electrodes and a second through electrode of the plurality of through electrodes;
   a protective substrate on the semiconductor substrate;
   a transparent seal resin that pastes the microlens layer and the protective substrate; and
   a light shielding film on the protective substrate, wherein the light shielding film is configured to block light irradiated on the semiconductor substrate, and
   the light shielding film includes a pinhole.

2. The pinhole camera according to claim 1, wherein the light shielding film is at an outer side of the protective substrate with respect to the semiconductor substrate.

3. The pinhole camera according to claim 1, wherein the light shielding film in which the pinhole is formed is arranged between the protective substrate and the seal resin.

4. The pinhole camera according to claim 1, wherein the external terminal is configured to electrically connect to the plurality of through electrodes, and the pinhole camera is mountable on a mounting substrate by the external terminal.

5. The pinhole camera according to claim 1, further comprising:
   an insulating film for isolating a portion of a face of the semiconductor substrate, on which the external terminal is provided, other than the external terminal.

6. The pinhole camera according to claim 1, wherein
   a plurality of pixel array units are formed on the semiconductor substrate, and
   a plurality of pinholes are formed in the light shielding film in a corresponding relationship to the pixel array units.

7. The pinhole camera according to claim 1, wherein the light shielding film is a reflection type light shielding film comprising a metal.

8. The pinhole camera according to claim 1, wherein the light shielding film is an absorption type light shielding film formed from black resist.

9. The pinhole camera according to claim 1, wherein
   the light shielding film is configured by stacking a reflection type light shielding film formed from metal and an absorption type light shielding film formed from black resist, and
   the black resist is arranged at the semiconductor substrate.

10. The pinhole camera according to claim 9, wherein
    the pinhole formed in the black resist has a diameter greater than that of the pinhole formed in the metal.

11. The pinhole camera according to claim 1, wherein the light shielding film is formed so as to be smaller than the protective substrate.

12. The pinhole camera according to claim 1, wherein
    the light shielding film is configured by stacking a reflection type light shielding film formed from metal and an absorption type light shielding film formed from black resist, and
    the light shielding film formed from the metal is formed so as to be smaller than the protective substrate, and a region other than the light shielding film formed from the metal is shielded against light by the light shielding film formed from the black resist.

13. The pinhole camera according to claim 1, wherein
    a waveguide is formed by embedding part of the protective substrate into the pinhole.

14. The pinhole camera according to claim 13, wherein
    an end portion of the waveguide is formed in a convex shape having a given curvature.

15. The pinhole camera according to claim 1, wherein
    a convex shape portion is formed just above the pinhole formed in the light shielding film.

16. The pinhole camera according to claim 1, wherein
    a concave shape portion is formed just below the pinhole formed in the light shielding film.

17. The pinhole camera according to claim 1, further comprising:
    a side face light shielding film configured to shield at least a side face of the protective substrate and the seal resin against light.

18. The pinhole camera according to claim 1, further comprising:
    a case configured to shield at least a side face of the protective substrate and the seal resin against light.

19. The pinhole camera according to claim 1, wherein
    the protective substrate has a two layer structure configured at least from a first protective substrate and a second protective substrate, and
    the light shielding film in which the pinhole is formed is provided between the first protective substrate and the second protective substrate.

20. The pinhole camera according to claim 19, wherein the pinhole sandwiched between the first protective substrate and the second protective substrate has a solid structure in which the pinhole is filled with transparent material.

21. The pinhole camera according to claim 19, wherein the pinhole sandwiched between the first protective substrate and the second protective substrate has a hollow structure.

22. The pinhole camera according to claim 19, wherein a stacked structure is applied in which the first protective substrate, the light shielding film and the second protective substrate are stacked in order from the semiconductor substrate side, and
the light shielding film is a reflection type light shielding film formed from metal, and the second protective substrate configures a light guide that guides light reflected by the light shielding film to an image pickup object.

23. The pinhole camera according to claim 19, wherein the light shielding film is an absorption type light shielding film formed from black resist.

24. The pinhole camera according to claim 19, wherein the light shielding film is configured by stacking a reflection type light shielding film formed from metal and an absorption type light shielding film formed from black resist, and
the black resist is arranged at the semiconductor substrate side.

25. The pinhole camera according to claim 19, further comprising:
a side face light shielding film configured to shield at least a side face from the semiconductor substrate to the light shielding film.

26. The pinhole camera according to claim 19, wherein a stacked structure is applied in which the first protective substrate, the light shielding film and the second protective substrate are stacked in order from the semiconductor substrate side,
the pinhole camera further comprising:
a light source configured to irradiate light at least from the side face toward the inner side of the second protective substrate.

27. The pinhole camera according to claim 26, wherein the light source is provided at least on one side face of the second protective substrate.

28. The pinhole camera according to claim 26, wherein the light source irradiates white light.

29. The pinhole camera according to claim 26, wherein the light source irradiates light of three primary colors.

30. The pinhole camera according to claim 1, further comprising a plurality of external terminals on the second face of the semiconductor substrate, wherein
the plurality of external terminals includes the external terminal, and
the protective substrate is on a side of the first face of the semiconductor substrate.

31. An electronic apparatus, comprising:
a pinhole camera that includes:
a semiconductor substrate;
a pixel array unit in the semiconductor substrate, wherein the pixel array unit includes a plurality of pixels;
a microlens layer on the semiconductor substrate;
a plurality of through electrodes that extends through the semiconductor substrate from a first face of the semiconductor substrate to a second face of the semiconductor substrate;
an external terminal on the semiconductor substrate, wherein the external terminal is between a first through electrode of the plurality of through electrodes and a second through electrode of the plurality of through electrodes;
a protective substrate on the semiconductor substrate;
a transparent seal resin that pastes the microlens layer and the protective substrate; and
a light shielding film on the protective substrate, wherein
the light shielding film is configured to block light irradiated on the semiconductor substrate, and
the light shielding film includes a pinhole.

32. A manufacturing method, comprising:
forming a pixel array unit in a semiconductor substrate, wherein the pixel array unit includes a plurality of pixels;
forming a microlens layer on the semiconductor substrate;
forming a plurality of through electrodes through the semiconductor substrate, wherein the plurality of through electrodes extends from a first face of the semiconductor substrate to a second face of the semiconductor substrate;
forming an external terminal on the semiconductor substrate, wherein the external terminal is between a first through electrode of the plurality of through electrodes and a second through electrode of the plurality of through electrodes;
stacking a protective substrate on the semiconductor substrate;
pasting, by a transparent seal resin, the microlens layer and the protective substrate;
forming a light shielding film on the protective substrate, wherein the light shielding film is configured to block light irradiated on the semiconductor substrate; and
forming a pinhole in the light shielding film.

* * * * *